(12) United States Patent
Fuhrer et al.

(10) Patent No.: US 11,239,073 B2
(45) Date of Patent: Feb. 1, 2022

(54) METHODS AND STRUCTURES FOR ALTERING CHARGE CARRIER DENSITY OR BANDGAP OF A TOPOLOGICAL DIRAC SEMIMETAL LAYER

(71) Applicant: MONASH UNIVERSITY, Clayton (AU)

(72) Inventors: Michael Sears Fuhrer, Clayton (AU); John Thery Hellerstedt, Clayton (AU); Mark Thomas Edmonds, Clayton (AU); James Lee Richard Jessee Collins, Clayton (AU); Chang Liu, Clayton (AU)

(73) Assignee: MONASH UNIVERSITY, Clayton (AU)

( * ) Notice: Subject to any disclaimer, the term of this patent is extended or adjusted under 35 U.S.C. 154(b) by 61 days.

(21) Appl. No.: 16/177,286

(22) Filed: Oct. 31, 2018

(65) Prior Publication Data

US 2019/0139760 A1    May 9, 2019

Related U.S. Application Data

(63) Continuation-in-part of application No. PCT/AU2017/050399, filed on May 1, 2017.

(30) Foreign Application Priority Data

May 2, 2016   (AU) ............................... 2016901607

(51) Int. Cl.
*H01L 29/66*    (2006.01)
*H01L 21/02*    (2006.01)
(Continued)

(52) U.S. Cl.
CPC .... *H01L 21/02381* (2013.01); *H01L 21/0242* (2013.01); *H01L 21/02433* (2013.01); *H01L 21/02488* (2013.01); *H01L 21/02521* (2013.01); *H01L 21/02532* (2013.01); *H01L 21/02631* (2013.01); *H01L 29/12* (2013.01); *H01L 29/1606* (2013.01); *H01L 29/66977* (2013.01); *H01L 29/68* (2013.01); *H01L 43/065* (2013.01); *H01L 51/0508* (2013.01)

(58) Field of Classification Search
None
See application file for complete search history.

(56) References Cited

U.S. PATENT DOCUMENTS

2011/0006837 A1*  1/2011  Wang .................. H01L 29/7831
                                                        327/539

FOREIGN PATENT DOCUMENTS

CN        105006485        10/2015

OTHER PUBLICATIONS

Hellerstedt et al., "Electronic Properties of High-Quality Epitaxial Topological Dirac Semimetal Thin Films", Nano Letters, pp. 3210-3214, Apr. 22, 2016.*

(Continued)

*Primary Examiner* — Daniel Whalen
(74) *Attorney, Agent, or Firm* — Knobbe, Martens, Olson & Bear LLP

(57) ABSTRACT

Dirac semimetals, methods for modulating charge carrying density and/or band gap in a Dirac semimetal, devices including a Dirac semimetal layer, and methods for forming a Dirac semimetal layer on a substrate are described.

24 Claims, 30 Drawing Sheets
(26 of 30 Drawing Sheet(s) Filed in Color)

(51) Int. Cl.
    H01L 43/06    (2006.01)
    H01L 51/05    (2006.01)
    H01L 29/12    (2006.01)
    H01L 29/68    (2006.01)
    H01L 29/16    (2006.01)

(56) References Cited

OTHER PUBLICATIONS

Pan et al., "Electric Control of Topological Phase Transitions in Dirac Semimetal Thin Films", Scientific Reports, pp. 1-10, Sep. 30, 2015.*

Young, S.M. et al., Dirac Semimetal in Three Dimensions, PRL 108, 140405 (2012).

Liu, Z.K. et al., "Discovery of a Three-Dimensional Topological Dirac Semimetal, Na$_3$Bi," Science 343, 864 (2014).

"Electronically-smooth '3-D graphene': A bright future for trisodium bismuthide," Science Daily, (Dec. 23, 2017) https://www.sciencedaily.com/releases/2017/12/171223134835.htm (downloaded Oct. 5, 2020).

Bansai, N. et al. "Epitaxial growth of topological insulator Bi2Se3 film on Si (111) with atomically sharp interface.", arXiv preprint, arXiv: 1104. 3438, 2011.

Edmonds, M. T. et al. "Molecular Doping the Topological Dirac Semimetal Na3Bi across the Charge Neutrality Point with F4-TCNQ." ACS applied materials & interfaces., vol. 8, p. 16412-16418, 2016.

Edmonds, M. T. et al. "Spatial Charge Inhomogeneity and Defect States in Topological Dirac Semimetal Thin Films." ar Xiv preprint., ar Xiv:1612.03385, 2016.

Hellerstedt, J. et al., "Electronic properties of high-quality epitaxial topological Dirac semimetal thin films." Nano letters., vol. 16, pp. 3210-3214, 2016.

Hellerstedt, J, et al. "Thickness and growth-condition dependence of in-situ mobility and carrier density of epitaxial thin-film Bi2Se3.", arXiv preprint., arXiv: 1405. 5692, 2014.

Liu, Y. et al., "Gate-tunable quantum oscillations in ambipolar Cd3As2 thin films." NPG Asia Materials., vol. 7, pp. 1-8, 2015.

Pan, Hui, et al., "Electric control of topological phase transitions in Dirac semimetal thin films," Scientific Reports, vol. 5, pp. 14639.

Qian, Xiaofeng, et al., "Quantum spin Hall effect in two-dimensional transition metal dichalcogenides," Science, vol. 346, No. 6215, pp. 1344-1347.

Wen, J. et al. "Semimetal Na3Bi Thin Film Grown on Double-Layer Graphene by Molecular Beam Epitaxy." Chinese Physics Letters., vol. 31, pp. 116802-1-116802-3, 2014.

Wen, J. et al. "Synthesis of semimetal A 3 Bi (A═Na, K) thin films by molecular beam epitaxy.", Applied Surface Science., vol. 327, pp. 213-217, 2015.

Office Action dated May 27, 2021 in Chinese Application No. 201780041051.0.

Examination Report dated Jun. 18, 2021 in Australian Application No. 2017259105.

International Search Report dated Aug. 17, 2017 in International Application No. PCT/AU2017/050399.

* cited by examiner

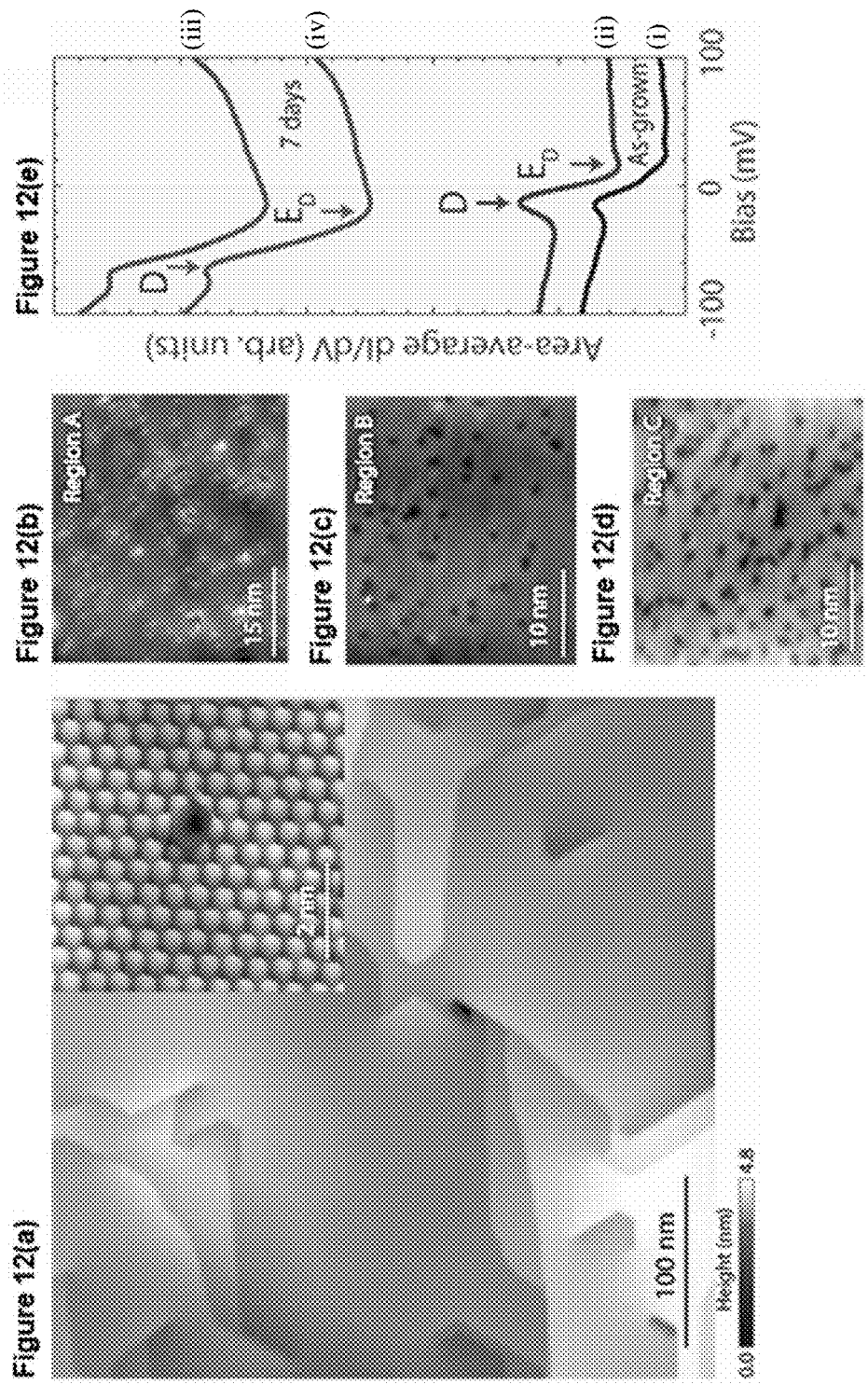

Figure 13(a)
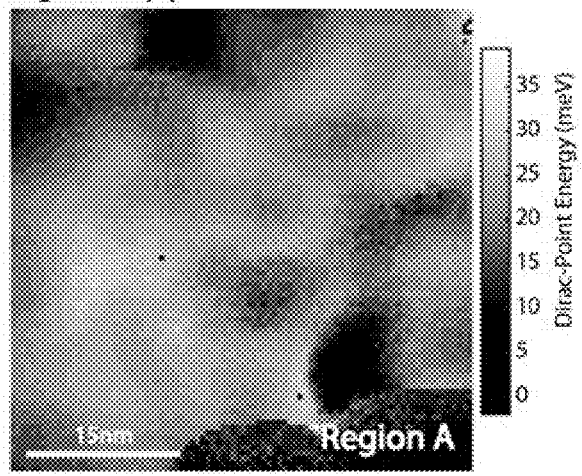
Figure 13(d)
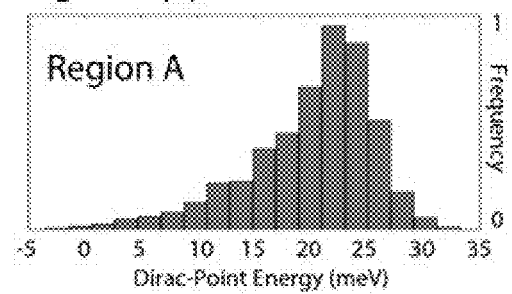
Figure 13(b)
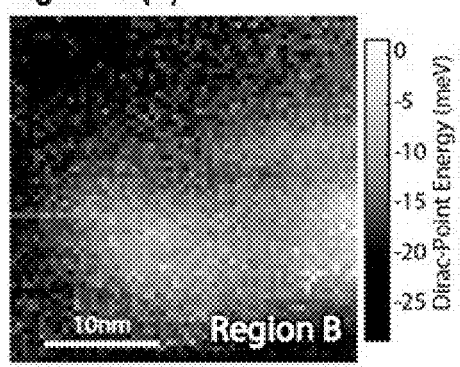
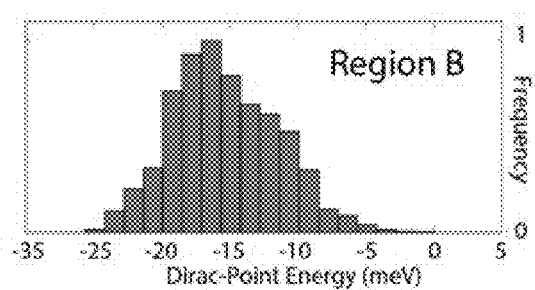
Figure 13(c)
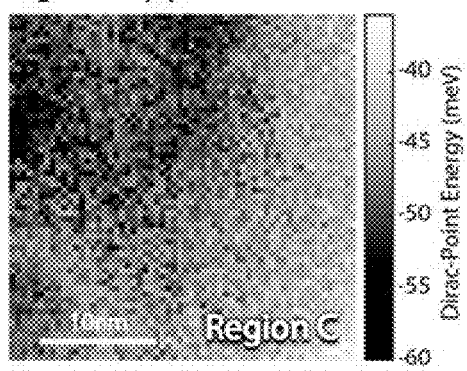
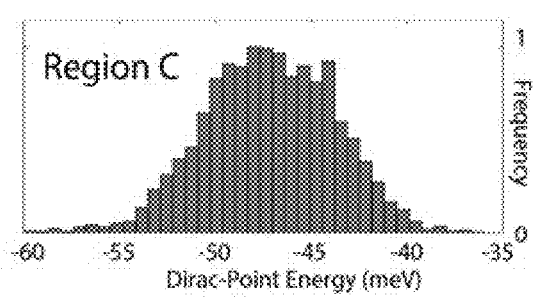
Figure 13(a) – Figure 13(d)

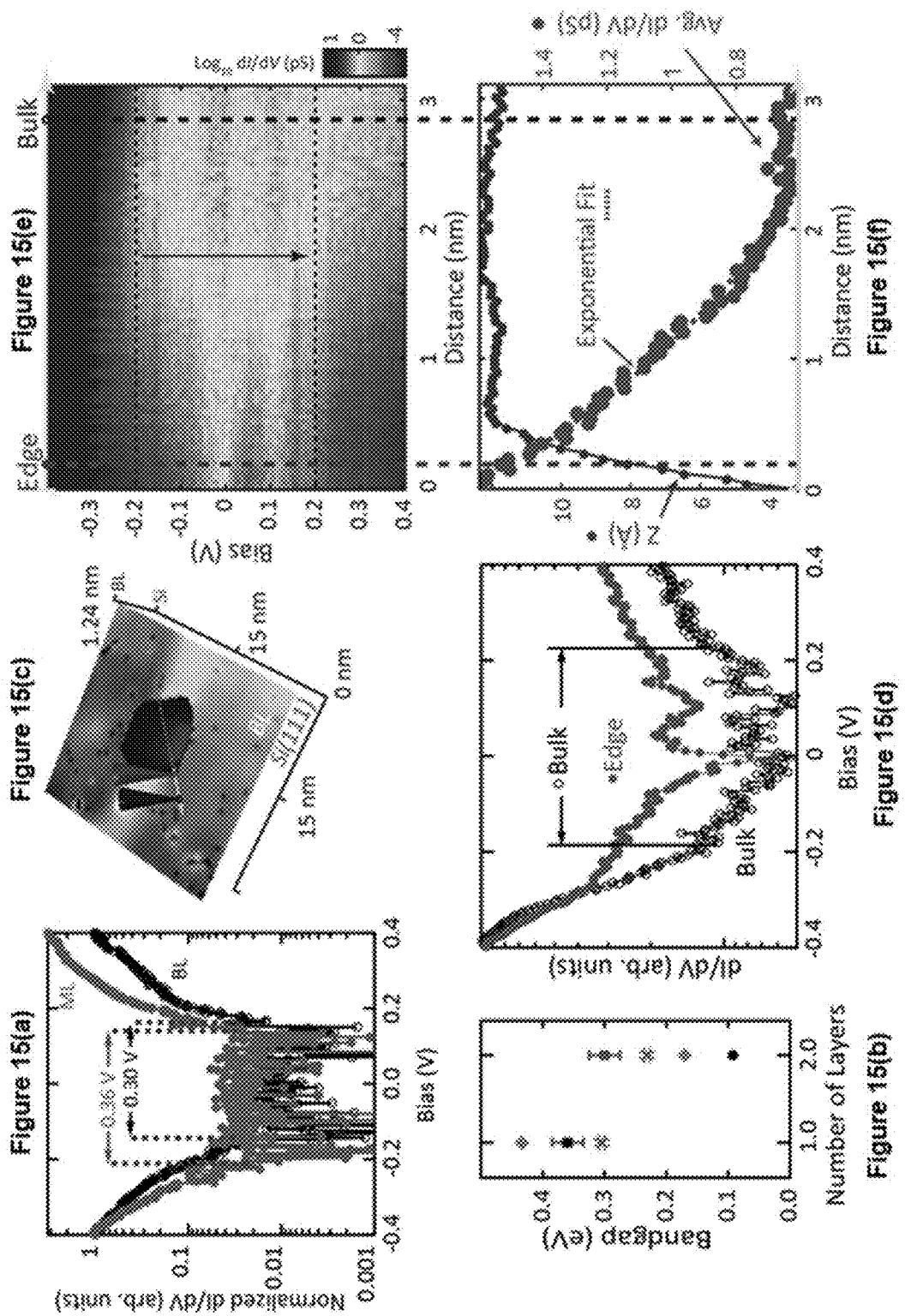

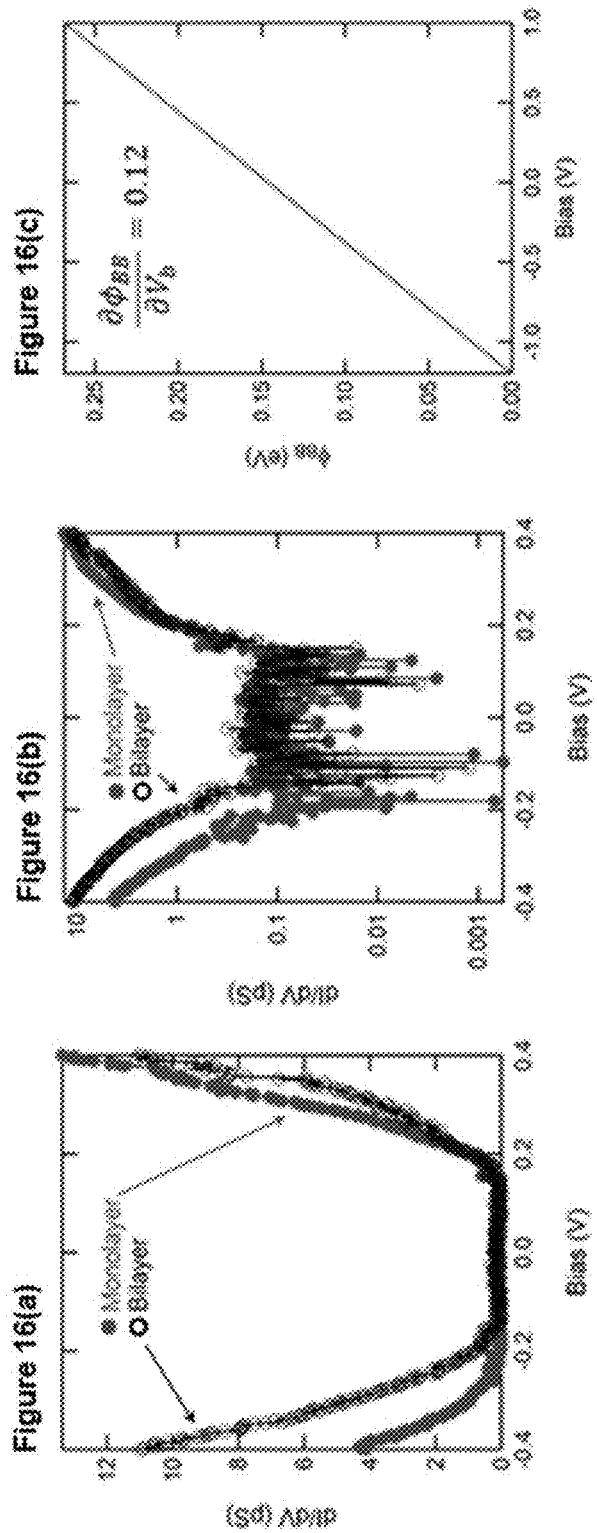

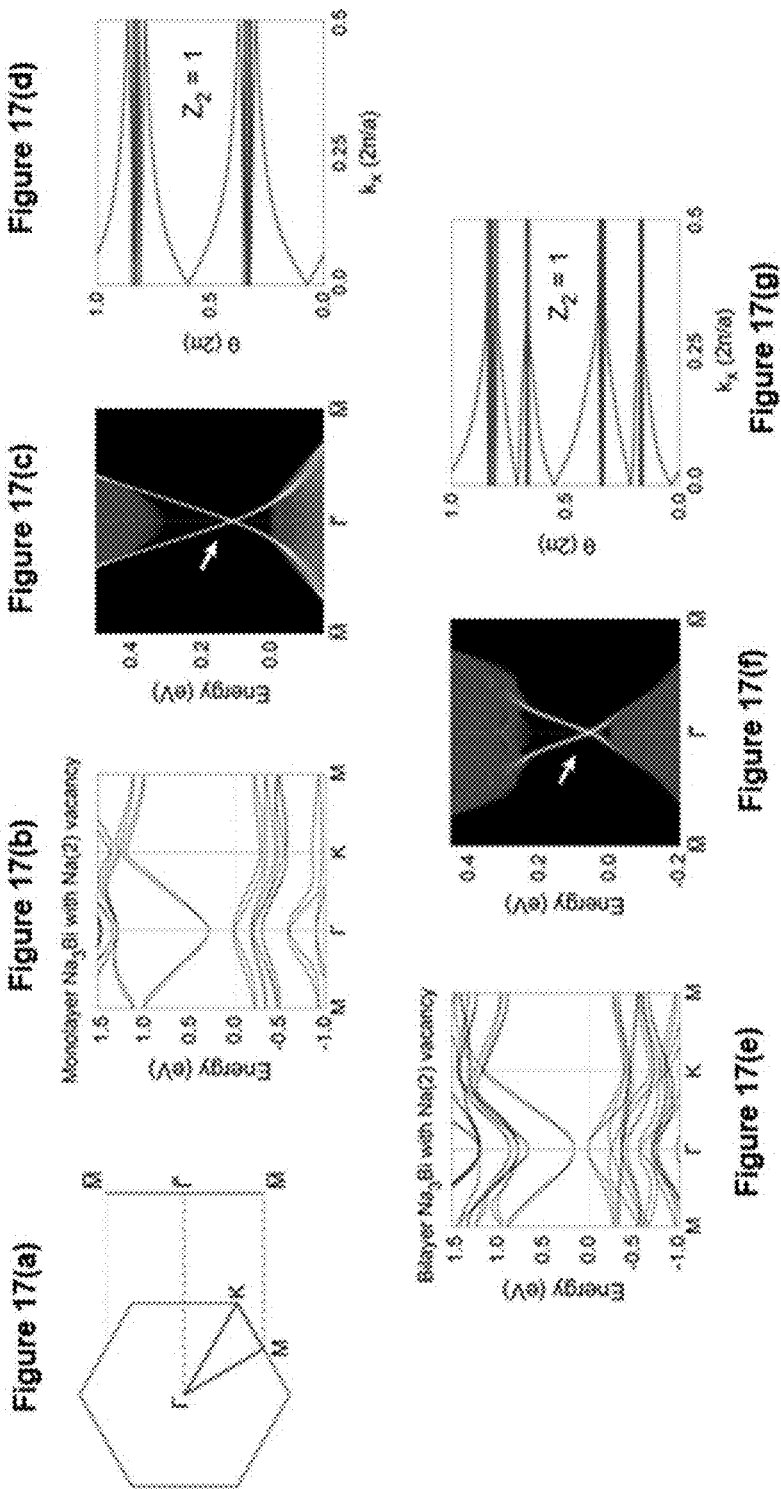

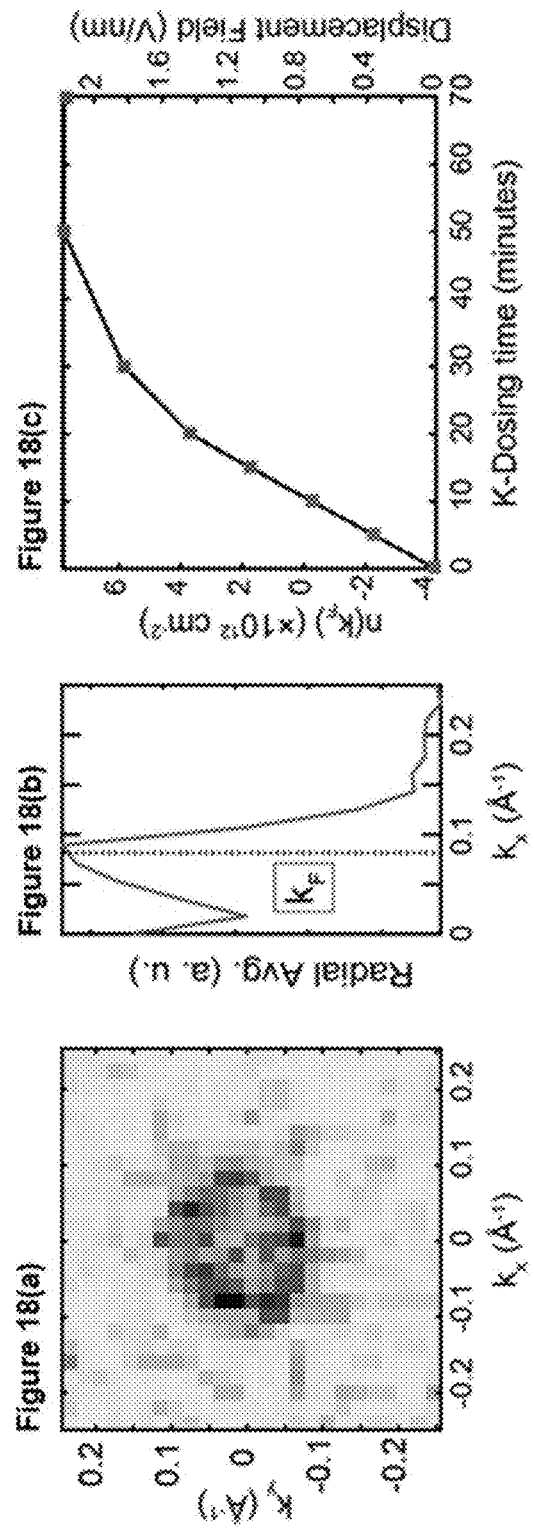

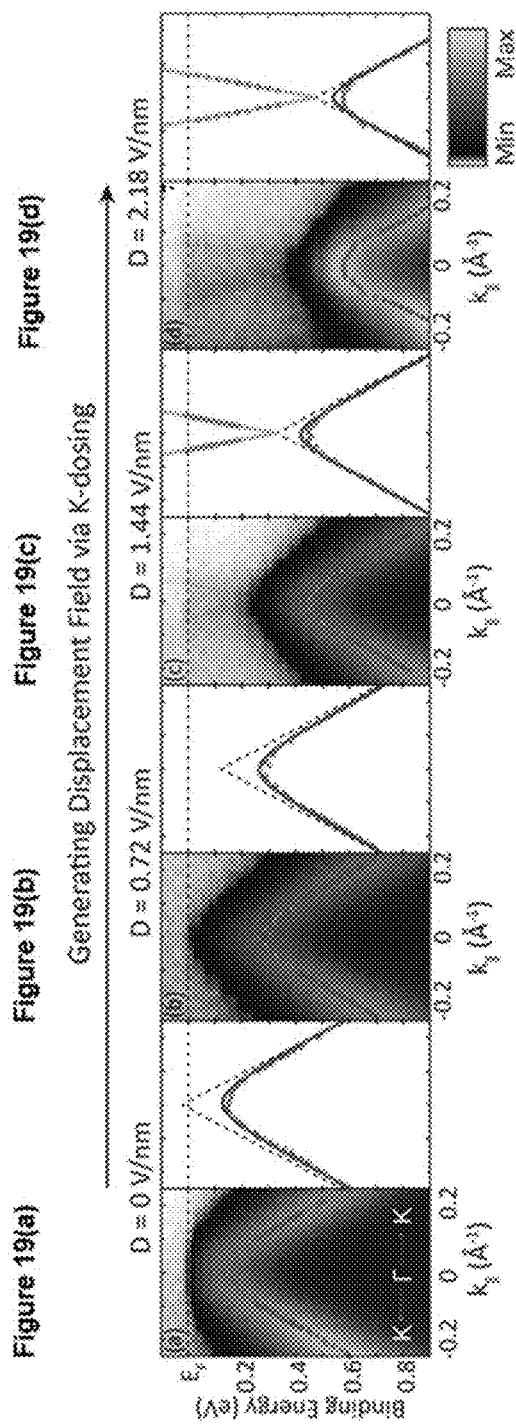

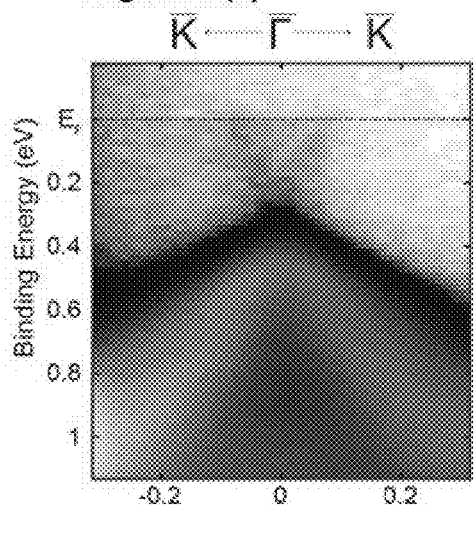
Figure 20(a)
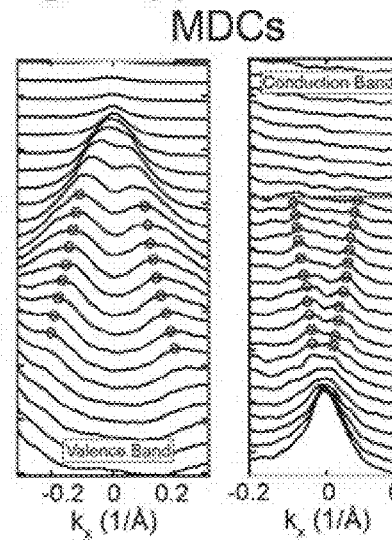
Figure 20(b)
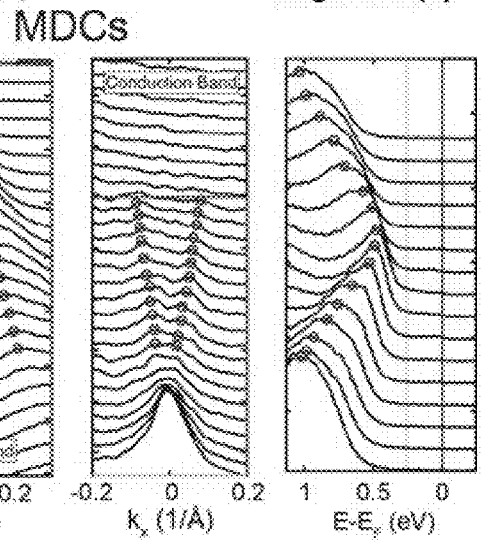
Figure 20(c)
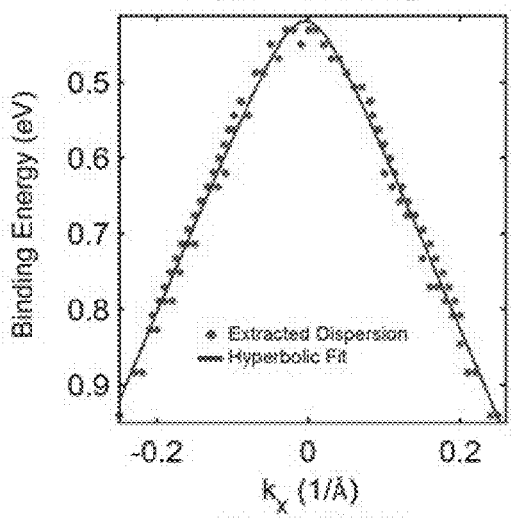
Figure 20(d)
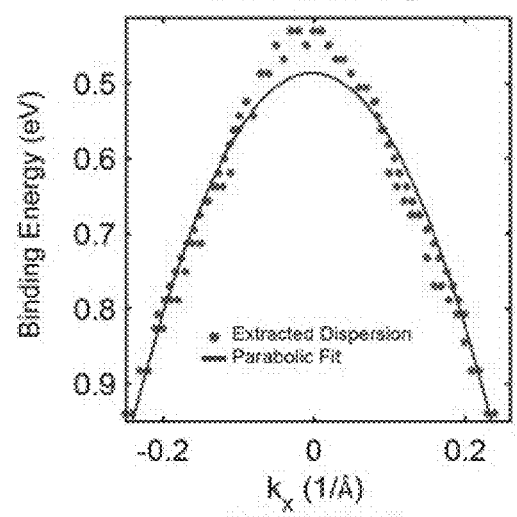
Figure 20(e)
Figure 20(a) – Figure 20(e)

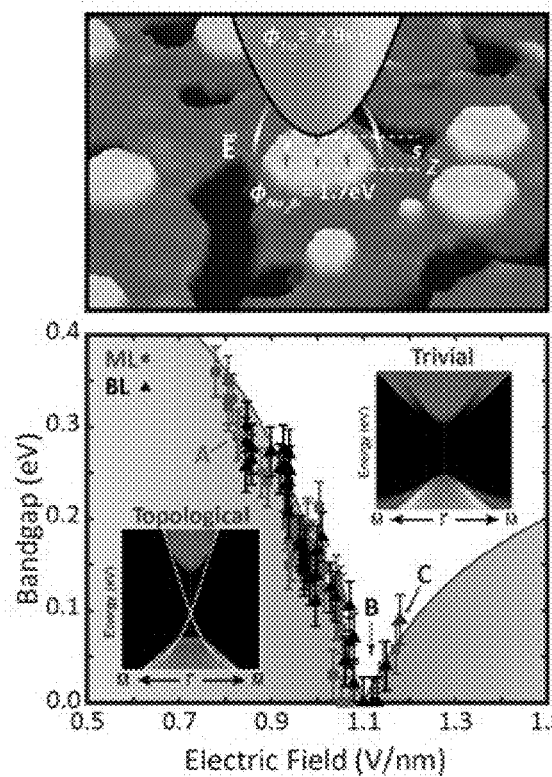
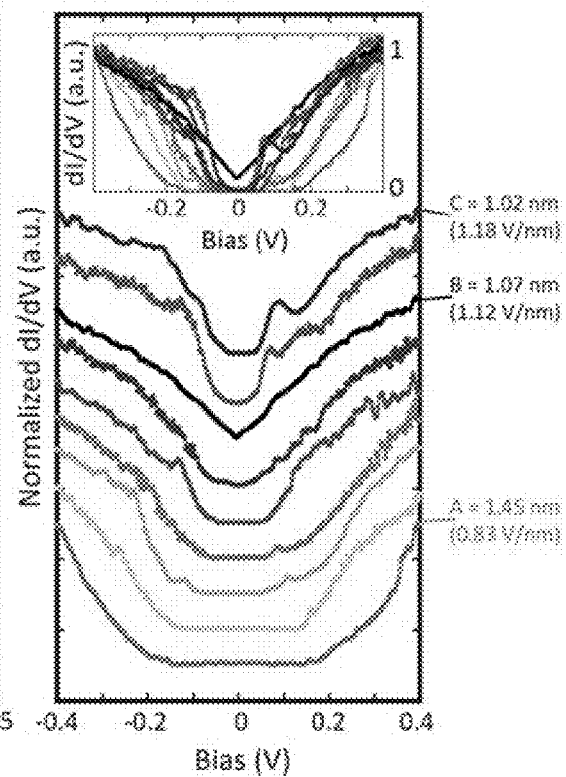
Figure 22(a) – Figure 22(c)

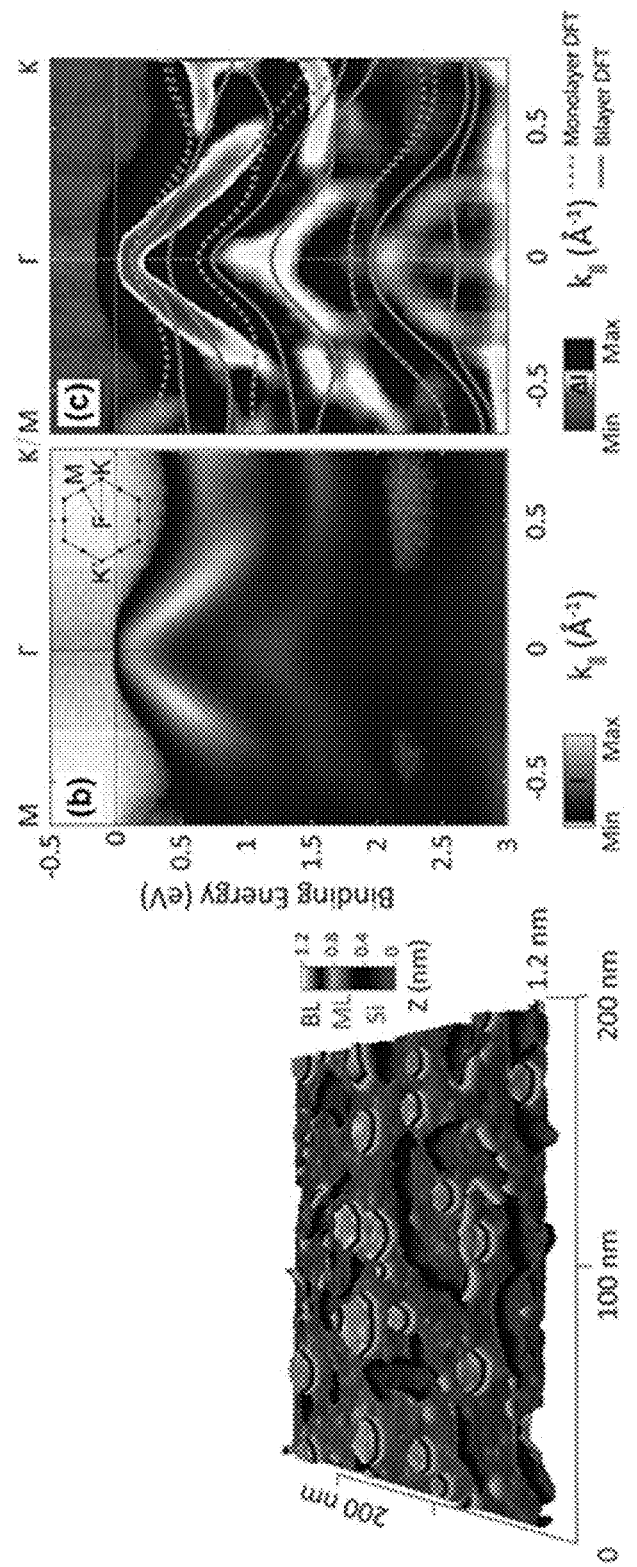

Figure 27(a)
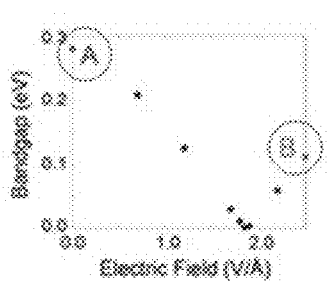
Figure 27(c)
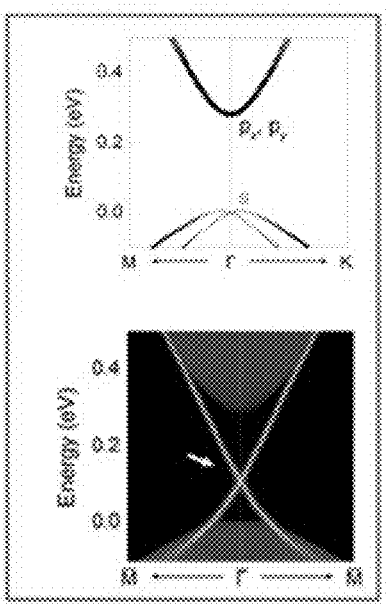
Figure 27(e)
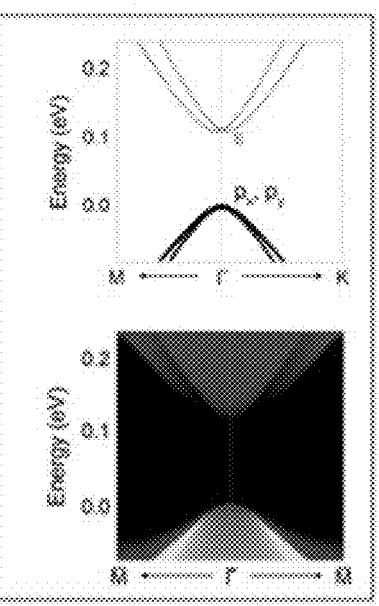
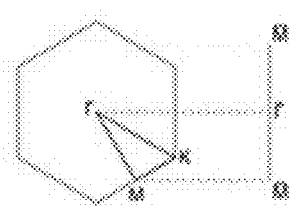
Figure 27(b)
Figure 27(d)
Figure 27(f)
Figure 27(a) – Figure 27(f)

METHODS AND STRUCTURES FOR ALTERING CHARGE CARRIER DENSITY OR BANDGAP OF A TOPOLOGICAL DIRAC SEMIMETAL LAYER

PRIORITY AND CROSS REFERENCE TO RELATED APPLICATIONS

This application is a Continuation-In-Part Application of International Application No. PCT/AU2017/050399, filed May 1, 2017, designating the U.S. and published as WO 2017/190184 A1 on Nov. 9, 2017, which claims the benefit of Australian Patent Application No. AU 2016901607, filed May 2, 2016. The entireties of each of the foregoing applications are hereby incorporated by reference.

FIELD

Embodiments herein relate to Dirac semimetals, methods for modulating charge carrying density and/or band gap in a Dirac semimetal, devices including a Dirac semimetal layer, and methods for forming a Dirac semimetal layer on a substrate.

BACKGROUND

Topological Dirac semimetals (TDS) are a recently proposed state of quantum matter that has attracted significant interest. TDS may be considered as three-dimensional analogues of graphene, with linear electronic dispersions in three dimensions.

Detailed theoretical calculations on the TDS $Na_3Bi$ have predicted a conventional-to-topological quantum phase transition (QPT) occurs with increasing film thickness, and that the QPT can also be tuned by electric field (by e.g. gate electrodes) to enable a topological transistor. However, these calculations and predictions are either purely theoretical or relate to thin films of $Na_3Bi$ which have been formed on conducting substrates such as graphene and Si[111], which makes the characterisation, analysis, and exploitation of these electronic transport properties difficult.

Control of carrier density and electronic conduction via electric fields is an important step toward electronic devices based on TDS. However, to date useful structures including Dirac semimetal layers have not been reported. Embodiments herein address this issue.

Reference to any prior art in the specification is not an acknowledgment or suggestion that this prior art forms part of the common general knowledge in any jurisdiction or that this prior art could reasonably be expected to be understood, regarded as relevant, and/or combined with other pieces of prior art by a skilled person in the art.

SUMMARY

In some embodiments, there is provided a structure including: means for generating an electric field, and a topological Dirac semimetal layer, wherein the topological Dirac semimetal layer is non-conductively separated from the means for generating the electric field, and the means for generating the electric field is configured to apply the electric field to at least a portion of the topological Dirac semimetal layer. By non-conductively separated, it is meant that the topological Dirac semimetal layer is not in conductive contact with the means for generating the electric field, and may be, for example, separated from the means for generating the electric field by an insulator.

In some embodiments, there is provided a structure for altering the charge carrier density in a topological Dirac semimetal, the structure comprising: a conductor, an insulating layer; a topological Dirac semimetal layer separated from the conductor by at least the insulating layer, and at least one electrode contacting the topological Dirac semimetal layer, wherein the conductor and the at least one electrode are configured to apply an electric field to at least a portion of the topological Dirac semimetal layer to alter the charge carrier density of the topological Dirac semimetal layer.

The inventors have found that charge carrier density of a topological Dirac semimetal layer can be changed by subjecting the topological Dirac semimetal layer to an electric field. This effect can advantageously be used to control the current passing through the topological Dirac semimetal layer to enable the topological Dirac semimetal to act as a a structure in an electronic component, such as a diode or transistor.

It will be understood that a range of different Dirac semimetals may be used. For example, the Dirac semimetal may be selected from: $WTe_2$, bismuthene, $Cd_3As_2$, $Bi_2Se_3$, or of the form $A_3Bi$ where A is an alkali metal as discussed in Wang, Z. et al. Dirac semimetal and topological phase transitions in $A_3Bi$ (A=Na, K, Rb). Physical Review B, 85(19):195320 (2012). doi: 10.1103/PhysRevB.85. 195320. The disclosure of which is hereby incorporated by reference. Preferably, A is selected from the group consisting of Na, K and Rb. Most preferably, A is Na.

In an embodiment, the topological Dirac semimetal layer is an $A_3Bi$ layer. Preferably the thickness of the $A_3Bi$ layer is at least 7 nm. More preferably, the thickness of the topological Dirac semimetal layer is at least 10 nm. Even more preferably, the thickness of the topological Dirac semimetal layer is at least 15 nm. Most preferably, the thickness of the topological Dirac semimetal layer is at least 18 nm.

In one or more embodiments a surface of the topological Dirac semimetal layer exhibits point defects. Preferably, the point defects are vacancy defects. In embodiments where the topological Dirac semimetal layer is an $A_3Bi$ layer, it is preferred that the vacancy defects are due to missing A atoms.

In some embodiments, there is provided a structure for altering the band gap of a topological Dirac semimetal, the structure comprising: a conductor, an insulating layer; a topological Dirac semimetal layer separated from the conductor by at least the insulating layer, and wherein the conductor is configured to apply an electric field to at least a portion of the topological Dirac semimetal layer to alter the band gap of the topological Dirac semimetal layer.

As above, in an embodiment, the topological Dirac semimetal layer is an $A_3Bi$ layer. Preferably, A is selected from the group consisting of Na, K and Rb. Most preferably, A is Na.

In an embodiment of the aspect relating to a structure for altering the band gap of a topological Dirac semimetal, the topological Dirac semimetal layer has a thickness of less than 20 nm. Preferably, the topological Dirac semimetal layer is an ultrathin film and has a thickness of 3 unit cells or less. More preferably, the Dirac semimetal film layer has a thickness of 2 unit cells or less. Most preferably, the Dirac semimetal film layer has a thickness of 1.5 unit cells or less.

In an embodiment of the third aspect, the topological Dirac semimetal layer undergoes a transition from topological insulator to convention insulator with increasing electric field. Preferably the transition occurs at an electric field strength value in the range of from about 0.5 V/nm to about 2 V/nm. More preferably, the transition occurs at an electric field strength value in the range of from about 1.0 V/nm to about 1.5 V/nm.

In an embodiment of one or more of the above aspects, the structure further comprises a layer for donating or accepting charge carriers from the topological Dirac semimetal layer. This layer is preferably deposited on a surface of the topological Dirac semimetal layer. The layer may be an organic layer, such as an organic electron accepting layer or an organic electron donating layer. Preferably the layer is an electron accepting layer, such as an organic electron accepting layer. More preferably, the layer is a tetrafluorotetracyanoquinodimethane (F4-TCNQ) layer. F4-TCNQ doping can achieve charge neutrality and even a net p-type doping. That is, under certain conditions, F4-TCNQ allows the topological Dirac semimetal layer to undergo an n– type to p– type transition.

In an embodiment of one or more of the above aspects, the structure further comprises a capping layer for preventing oxidation of the topological Dirac semimetal layer. In one form, the capping layer is deposited on the surface of the topological Dirac semimetal layer. However, in other forms where additional layers are present, such as where the structure comprises a layer for donating or accepting charge carriers, the capping layer is applied to the exposed surface of an outermost layer—which in this example is the layer for donating or accepting charge carriers. In preferred forms the capping layer is a layer of a material selected from a metal oxide and/or a metalloid oxide. More preferably, the material is an aluminium or silicon oxide. It is preferred that the capping layer has a thickness in the range of from about 1 nm to about 1000 nm in thickness.

In embodiments where the structure includes an organic electron accepting or electron donating layer, it is preferred that the layer has a thickness of 0.25 Å or greater. More preferably, the layer has a thickness of 0.85 nm or greater. Most preferably, the layer has a thickness that is about 1 nm or greater. It is also preferred that the layer has a thickness of less than 2 nm due to saturation of the charge transfer process.

In particular embodiments, such as where the structure includes an F4-TCNQ of thickness of greater than 0.25 Å, modulation of the electrical field can affect an n– to p-type transition in the topological Dirac semimetal layer. Ideally, the structure is configured such that the n– to p– type transition occurs at an applied voltage between the conductor and the electrode of between –100 and 100 V. More preferably, the n– to p– type transition occurs at an applied voltage of between –75 and 75 V. Most preferably, n– to p– type transition occurs at an applied voltage of between –60 and 60 V.

In some embodiments where the structure includes an insulating layer, it is preferred that the insulating layer is formed directly on a surface of the conductor. It is further preferred that the topological Dirac semimetal is formed directly on the surface of the insulating layer. It will be appreciated that a wide range of different conductors and insulating layers may be used. However, it is preferred that the insulating layer is a passivation layer that is formed on the surface of the conductor. That is, where the conductor is a metal, the insulator may be an oxide of that metal formed, for example due to natural oxidation. However, it will be appreciated that other forms of passivation may be used. In one illustrative embodiment, where the conductor is aluminium, then the insulating layer may be aluminium oxide, such as $\alpha$-$Al_2O_3$. Alternatively, the conductor may be a metalloid, such as Si in which case the insulating layer may also be an oxide of that metalloid, for example $SiO_2$. As discussed above, other forms of passivation may also be employed which result in non-oxide passivation layers, an example of this is silicon nitride on a silicon conductor. The advantage of having a passivated insulating layer is that the insulating layer can be formed as a very thin film, which is particularly useful in certain applications. It is preferred that the insulating layer has a thickness in the range of from about 1 nm to about 1000 nm in thickness. Minimising the thickness of the insulator is desirable as larger distances between the conductor and the topological Dirac semimetal reduces the strength of the applied electric field at a given applied voltage between conductor and electrode.

The structure may be a layered structure with various embodiments exhibiting a different layered arrangement. In a first form, the device has the following layered arrangement: conductor, insulator, topological Dirac semimetal. In a second form, the device has the following layered arrangement: conductor, insulator, topological Dirac semimetal, electron donating or electron accepting layer. In a third form, the device has the following layered arrangement: conductor, insulator, electron donating or electron accepting layer, topological Dirac semimetal. Each of these layered structures may additionally comprise a capping layer on the outermost layer, e.g. directly on the surface of the topological Dirac semimetal in the first or third of the aforementioned forms, or directly on the electron donating or electron accepting layer in the second of the above mentioned forms.

In embodiments of one or more of the above aspects, the structure further comprises at least two conductive electrodes in contact with the topological Dirac semimetal layer, the at least two electrodes being spaced apart from each other and between which current may flow from a current or voltage source through the topological Dirac semimetal layer; and at least one electrode of the at least two electrodes is configured to be connected to the current or voltage source. This arrangement is particularly useful where the structure is a transistor.

In some embodiments, there is provided a method of altering the charge carrier density in a topological Dirac semimetal, the method comprising: providing a structure including: a conductor, an insulating layer, a topological Dirac semimetal layer separated from the conductor by at least the insulating layer, at least one electrode contacting the topological Dirac semimetal layer; and applying a voltage to the conductor relative to the at least one electrode to subject at least a portion of the topological Dirac semimetal layer to an electric field to alter the charge carrier density of the topological Dirac semimetal layer. This method may be practiced in respect of the structures generally discussed above.

In some embodiments, there is provided a method of altering the band gap of a topological Dirac semimetal, the method comprising: providing a structure including: a conductor, an insulating layer, a topological Dirac semimetal layer separated from the conductor by at least the insulating layer, at least one electrode contacting the topological Dirac semimetal layer; and applying a voltage to the conductor relative to the at least one electrode to subject at least a portion of the topological Dirac semimetal layer to an electric field to alter the band gap of the topological Dirac semimetal layer.

In preferred form of the above aspect, the method further includes varying a strength of the electric field to vary the band gap. In addition or alternatively, it is preferred that the topological Dirac semimetal layer has a thickness of less than 20 nm. Preferably, the topological Dirac semimetal layer is an ultrathin film and has a thickness of 3 unit cells or less. More preferably, the Dirac semimetal film layer has a thickness of unit cells or less. Most preferably, the Dirac semimetal film layer has a thickness of 1.5 unit cells or less.

In embodiments of the above aspects, the method further includes switching the voltage between a first voltage and a second voltage to increase or decrease the charge carrier density in the topological Dirac semimetal layer.

In embodiments of the above aspects, the method further includes switching the voltage between a first voltage and a second voltage to change a charge carrying mechanism from n– type to p– type, or from p– type to n– type.

In embodiments of the above aspects, the method further includes providing at least two electrodes in contact with the topological Dirac semimetal, the at least two electrodes spaced apart from each other and between which current may flow from a current or voltage source through the topological Dirac semimetal layer; wherein when current is passing between the at least two electrodes, the step of subjecting the topological Dirac semimetal to an electric field alters the magnitude of the voltage between the at least two electrodes.

In embodiments of the above aspects, the method further includes providing at least two electrodes in contact with the topological Dirac semimetal, the at least two electrodes spaced apart from each other and between which current may flow from a voltage source through the topological Dirac semimetal layer; wherein when current is passing between the at least two electrodes, the step of subjecting the topological Dirac semimetal to an electric field alters the magnitude and/or direction of the current passing between the at least two electrodes.

In an embodiment, the method further includes providing a capping layer for preventing oxidation of the topological Dirac semimetal layer.

In some embodiments, there is provided a method of forming a topological Dirac semimetal layer on a substrate; the method including: (a) providing constituent elements of a Dirac semimetal to a surface of a substrate at a first temperature to nucleate the Dirac semimetal on the surface of the substrate forming a nucleation layer of the topological Dirac semimetal layer having a first thickness; and (b) increasing the first temperature to a second temperature and further providing constituent elements of the Dirac semimetal at the second temperature to grow the thickness of the Dirac semimetal layer to a final thickness.

In an embodiment, the first temperature is from about 100° C. to about 140° C. Preferably, the first temperature is from about 110° C. to about 130° C.

In an embodiment, the second temperature is from about 240° C. to about 400° C. In an embodiment, the second temperature is from about 250° C. to about 390° C.

In an embodiment the Dirac semimetal layer is an $A_3Bi$ layer, and the constituent elements are A and Bi, wherein A is an alkali metal, and the method further comprises: providing A and Bi atoms with a Bi:A flux ratio of at least 1:8 to about 1:12 or possibly higher, and preferably the flux ratio is about 1:10. In an embodiment, Bi is provided at a flux rate of at least 0.03 Å/sec and A is provided at a flux rate of at least 0.7 Å/sec. It is preferred that A is selected from the group consisting of Na, K and Rb. Most preferably, A is Na.

In an embodiment, the constituent elements are continuously provided to the surface of the substrate until the thickness of the Dirac semimetal layer has reached the final thickness.

In an embodiment, the step of increasing the first temperature to the second temperature commences when the first thickness reaches 2 nm.

In an embodiment, as the first temperature increases to the second temperature, the process further includes an intermediate growth stage wherein the constituent elements are provided to the surface of the substrate, and the topological Dirac semimetal layer increases in thickness from the first thickness to an intermediate thickness.

In an embodiment, during the intermediate growth stage, the thickness of the topological Dirac semimetal layer increases by up to 30% or less of the final thickness. Preferably up to 25% or less of the final thickness. Thus, for a topological Dirac semimetal layer with a final thickness of 20 nm, during this intermediate growth stage where the temperature is ramped from the first temperature to the second temperature, the film grows preferably up to 6 nm or less, and more preferably up to 5 nm or less. In still other embodiments, the increase in thickness of the topological Dirac semimetal layer during the intermediate stage is not dependent on the final thickness. In such cases, during this intermediate stage, the thickness of the topological Dirac semimetal layer increases by up to 6 nm or less. Preferably up to 5 nm or less.

In an embodiment, the pressure during steps (a) and (b) is about $3 \times 10^{-9}$ Torr or less.

In an embodiment, the method further includes, after step (b), a step (c) of annealing the topological Dirac semimetal layer at an annealing temperature for an annealing time. Preferably, the annealing temperature is from about 240° C. to about 400° C. More preferably, the annealing temperature is from about 250° C. to about 390° C. Even more preferably, the annealing temperature is the second temperature. Additionally, or alternatively it is preferred that the annealing time is less than 1 hour. Preferably, less than 30 minutes. More preferably, the annealing time is less than 20 minutes. Most preferably, the annealing time is about 10 minutes or less.

It is further preferred that step (c) is conducted under a flux of A. Such as that a flux of Bi is not provided during step (c).

It is further preferred that the topological Dirac semimetal layer does not increase in thickness during step (c).

In another embodiment, the substrate is an electrically insulating material, and/or the substrate includes a layer of an electrically insulating material disposed thereon, and wherein the topological Dirac semimetal layer is formed on a surface of the electrically insulating material.

In still another embodiment, the method can include providing an electron donating or accepting layer for donating or accepting charge carriers from the topological Dirac semimetal layer. This may include applying the electron accepting layer over the topological Dirac semimetal layer as discussed previously. In some embodiments the method can include tuning charge carrier donating or accepting properties of the topological Dirac semimetal layer by altering a property of the electron donating or accepting layer. For example, in certain embodiments the thickness of the electron accepting or electron donating layer can affect the charge carrying properties of the Dirac semimetal layer. Thus, particularly where it is desired that the Dirac semimetal layer undergo an n-type to p-type transition in the presence of a stimuli (such as an electric field), it is preferred that the electron accepting or electron donating layer has a thickness that 0.25 Å or greater. More preferably, the electron accepting or electron donating layer has a thickness greater than 0.85 nm. Most preferably, the electron accepting or electron donating layer has a thickness greater that is about 1 nm. It is also preferred that the electron accepting or electron donating layer has a thickness of less than 2 nm.

As used herein, except where the context requires otherwise, the term "comprise" and variations of the term, such as "comprising", "comprises" and "comprised", are not intended to exclude further additives, components, integers or steps.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The embodiments herein will become apparent from the following description, given by way of example and with reference to the accompanying drawings.

FIG. 1(a) is a schematic representation of device geometry showing location of Ti/Au pads used to make electrical contact with the $Na_3Bi$ film grown on sapphire. The inset shows the crystal structure of $Na_3Bi$ with the in-plane and c-axis lattice constants labelled, where Na and Bi atoms are coloured grey and black, respectively. FIG. 1(b) is a large-scale STM image showing the morphology of $Na_3Bi$ with step height 4.7 Å ($V_{bias}$=1 V, I=100 pA, T=5K). The inset is an atomic-resolution STM image of surface with lattice constant 5.45 Å ($V_{bias}$=500 mV, I=200 pA, T=5K). FIG. 1(c) is a LEED image taken at 17.5 eV showing the 1×1 symmetry of the $Na_3Bi$ surface. FIG. 1(d) is a scanning tunnelling spectrum dI/dV vs V averaged over 20 nm×20 nm area. (Bias modulation amplitude $V_{mod}$=5 $mV_{rms}$). The bias voltage position of minimum dI/dV is labelled ED=−35 mV and identified as the Dirac point energy.

FIG. 2(a) illustrates mobility and FIG. 2(b) illustrates Hall carrier density (n-type) plotted against the final growth temperature for the various samples. As can be seen, the 120-345° C. growth profile achieves the highest measured mobility (6,310 $cm^2$/vs) and lowest carrier density (4.6×$10^{17}$ $cm^{-3}$). The grey shaded region represents the range of final growth temperatures for which the sample quality significantly degrades. FIG. 2(c) is a log-log plot of experimental mobility vs. carrier density (black squares). The hashed region was calculated for best estimates of the effective fine structure constant $\alpha$=0.06-0.17. The dashed line is a fit to the experimental data yielding an effective fine structure constant $\alpha$=0.44.

FIG. 3(a) shows the normalized magnetoresistance $\rho_{xx}(B)=\rho_{xx}(B=0)$ as a function of B for samples prepared at final growth temperatures indicated in the legend. "345* no flux" indicates growth without the post-growth anneal in Na flux. Lines are fits to Eqn. 1. FIG. 3(b) shows the quadratic coefficient of MR A from fits to Eqn. 1 in FIG. 3(a) as a function of carrier density for the various films measured. FIG. 3(c) is a plot of residual magnetoconductance $\Delta\sigma=\sigma$(B)−$\sigma$(B=0) vs B after subtraction of fit to Eqn. 1 from data in FIG. 3(a). Fits are to the strong spin-orbit limit of the HLN theory (Eqn. 2). The single fitting parameter, the coherence length $L_\varphi$, is plotted against carrier density in FIG. 3(d). The points in FIG. 3(b) and FIG. 3(d) correspond to the sample growth temperatures indicated.

FIG. 4b is a device diagram, showing Hall bar film geometry defined by a surface stencil mask affixed on the Si:$SiO_2$ substrate that serves as a back gate.

FIG. 12(a) is a large area (400 nm×380 nm) topographic STM image of 20 nm $Na_3Bi$ on Si(111) (bias voltage V=−3 V and tunnel current I=50 pA). Inset: Atomic resolution STM image with lattice constant 5.45 Å (taken on separate 20 nm $Na_3Bi$ film) showing an individual Na vacancy at the surface.

FIG. 12(b) is an STM topography image (V=300 mV and I=250 pA) on a 45 nm×45 nm region of $Na_3Bi$.

FIG. 12(c) is an STM topography image (V=−550 mV and I=200 pA) on a 30 nm×30 nm region of $Na_3Bi$.

FIG. 12(d) is an STM topography image (V=−50 mV and I=100 pA) on a 30 nm×30 nm region of $Na_3Bi$ on sapphire ($\alpha$-$Al_2O_3$(0001).

FIG. 12(e) is an area-averaged STS spectra (vertically offset for clarity) corresponding to four different regions of the sample.

FIG. 13(a) is a Dirac point energy map of 45 nm×45 nm (90 pixels×90 pixels) region of $Na_3Bi$ (V=−250 mV and I=250 pA), corresponding to Region A represented in FIG. 12(b). Scale bar is 15 nm.

FIG. 13(b) is a Dirac-point energy map of 30 nm×30 nm (60 pixels×60 pixels) region of $Na_3Bi$ corresponding to Region B of FIG. 12(c) (V=−150 mV and I=200 pA). Scale bar is 10 nm.

FIG. 13(c) is a Dirac-point energy map of 30 nm×30 nm (60 pixels×60 pixels) region of $Na_3Bi$ grown on $\alpha$-$Al_2O_3$ (0001) (labelled Region C) (V=−150 mV and I=200 pA). Scale bar is 10 nm.

FIG. 13(d) are upper, middle and lower panels representing histograms of the Dirac point energy maps in FIG. 13(a)-FIG. 13(c) respectively.

FIG. 15(a) Normalized dI/dV spectra displayed on a logarithmic plot corresponding to ML and BL Na$_3$Bi. The conduction and valence band edges are reflected by the sharp onset of dI/dV intensity.

FIG. 15(b) Evolution of the bandgap as a function of layer thickness determined from STS experiment, DFT calculations on pristine Na$_3$Bi and with an Na(2) vacancy.

FIG. 15(c) STM topography of a region of bi-layer Na$_3$Bi, monolayer Na$_3$Bi\, and the underlying Si(111) substrate. The line represents the region over which the dI/dV measurements were performed in FIG. 15(e).

FIG. 15(d) dI/dV spectra taken near the step edge of BL Na$_3$Bi to ML Na$_3$Bi to Si(111) substrate and in the bulk of BL Na$_3$Bi.

FIG. 15(e) dI/dV colour map taken at and then moving away from the step edge where the dashed vertical lines reflect the spectra shown in (d) and the horizontal lines represent the averaged dI/dV signal region that is shown in FIG. 15(f).

FIG. 15(f) Shows the corresponding intensity profile of dI/dV in the bulk gap showing the exponential decay away from the step edge.

FIG. 16(a) and FIG. 16(b) dI/dV spectra taken for mono- and bilayer Na$_3$Bi plotted on a (a) linear and (b) logarithmic scale.

FIG. 16(c) Calculated tip-induced band bending, $\phi_{BB}$ using equation (5) for different biases.

FIG. 17(a) Two-dimensional Brillouin zone for Na$_3$Bi layered structures. Here we also show the projected 1D Brillouin zone used for studying the edge spectrum.

FIG. 17(b)-FIG. 17(g) Results for monolayer (FIG. 17(b)-FIG. 17(d)) and bilayer (FIG. 17(e)-FIG. 17(g)) Na$_3$Bi with Na(2) vacancies [with one Na(2) vacancy in a 2×2 supercell]. (FIG. 17(b), FIG. 17(e)) Electronic band structures, where the energy zero is set to be at the valence band maximum. (FIG. 17(c), FIG. 17(f)) Orbitally resolved bandstructure without SOC and (FIG. 17(d), FIG. 17(g)) orbitally resolved bandstructure with SOC. Band inversion induced by SOC can be clearly observed at the $\Gamma$ point for both ML and BL cases, which indicates that both ML and BL Na$_3$Bi are nontrivial 2D topological insulators.

FIG. 18(a) Electron-band Fermi-surface of few-layer Na$_3$Bi after 30 minutes of K-dosing.

FIG. 18(b) Radially averaged momentum profile through the Fermi surface, showing the ring structure at $k_F$.

FIG. 18(c) Calculated charge-density assuming degeneracy of bands g=4 using Eqn. (8) and the corresponding electric displacement field associated with the associated net charge transfer from the undosed film as a function of K-dosing time. The last five points are as-measured, and the first three points are extrapolated based on the $E_F$ shifting rate with K-dosing between 15-50 minutes.

FIG. 19(a)-FIG. 19(d) Bandstructure modulation in ARPES in ML and BL Na$_3$Bi using K dosing. FIG. 19(a)-FIG. 19(d) ARPES intensity plots showing the evolution of the band dispersion with K dosing, where the left panel represents the ARPES spectra and the right panel is the extracted MDC and EDC curves along with a bi-partite model fit. FIG. 19(a) Before in-situ K dosing. The hole band is located ~140 meV below $E_F$; FIG. 19(b) K dosing equivalent to a 0.72 Vnm$^{-1}$ displacement field; the hole band is now 257 meV below $E_F$; FIG. 19(c) K dosing equivalent to a 1.44 Vnm$^{-1}$ displacement field has n-type doped the system to an extent that an electron band has now emerged, separated from the hole band by ~100 meV; FIG. 19(d) K dosing equivalent to 2.18 Vnm$^{-1}$ displacement field results in further n-type doping with the band separation 90 meV.

FIG. 20(a) ARPES intensity plot along K-$\Gamma$-K direction after 30 minutes of K-dosing.

FIG. 20(b) stack plots of MDCs for the valence band (left panel) and conduction band (right panel) extracted from FIG. 20(a).

FIG. 20(c) EDCs extracted from FIG. 20(a).

FIG. 20(d) and FIG. 20(e) Fitting extracted band coordinates by MDC and EDC analysis (dots) to a hyperbola FIG. 20(d) and parabola FIG. 20(e), showing that Na$_3$Bi like bands are best described by a hyperbola function.

FIG. 21(a) The sum of $\Delta$ parameters from the best fit of (3) to ARPES dispersion vs. applied electric displacement field. Both $\Delta_{n,p}$ are directly calculated from the high-field (open squares) measurements, however at low-field (circles) measurements, $E_F$ is not sufficiently shifted for the electron dispersion to be clearly resolved. Here we have used the ratio $$\frac{\Delta_p + \Delta_n}{\Delta_p} \approx 1.4$$

measured from the open squares to extrapolate $\Delta_n$ for undosed film. FIG. 21(b) The valence edge (circles) and conduction edge (open squares) calculated from the fitted ARPES dispersion is shown for two high-symmetry directions: circles and squares as K-$\Gamma$-K and M-$\Gamma$-M respectively.

FIG. 22(a) Schematic representation of a metallic tip (with work function $\phi_{Tip}$) at a fixed distance above the surface of Na$_3$Bi (with work function $\phi_{Na3Bi}$), with the difference in work function generating a localized electric field. The potential difference of ~1.2 eV is much larger than the bias applied for dI/dV measurements.

FIG. 22(b) Individual dI/dV spectra taken on BL Na$_3$Bi at different tip-sample separations (electric fields) as labelled on the figure. The spectra have been normalized and offset for clarity.

FIG. 22(c) Bandgap extracted from dI/dV spectra as a function of electric field for monolayer (squares) and bilayer (triangles). At a critical field of ~1.5 Vnm$^{-1}$ the system is no longer gapped, above this a bandgap reopens in the conventional regime. The left shaded region and the right shaded region represent guides to the eye. Insets represent projected edge state bandstructures calculated by DFT below and above the critical field.

FIG. 24(a) Large area (300 nm×200 nm) topographic STM image (bias voltage V=−2.5 V and tunnel current I=100 pA) of few layer $Na_3Bi$ on Si(111).

FIG. 24(b) and FIG. 24(c) Overall band structure measured along the M-Γ-K directions measured with ARPES at hv=48 eV. FIG. 24(c) Second derivative spectra of FIG. 24(b) in order to enhance low intensity features. The overlaid broken line and full line curves are calculated DFT band structures for mono- and bi-layer $Na_3Bi$ respectively.

FIG. 27(a) Bandgap variation as a function of electric field for monolayer $Na_3Bi$ with Na(2) vacancy. The gap closes and reopens at ~1.85 V/Å.

FIG. 27(b) 2D Brillouin zone and the projected 1D boundary Brillouin zone.

FIG. 27(c)-FIG. 27(f) Results for the system at the electric field of (FIG. 27(c), FIG. 27(d)) 0.0 V/Å and (FIG. 27(e), FIG. 27(f)) 2.5 V/Å, which are marked by points A and B in FIG. 27(a). FIG. 27(c) Orbital-resolved band structures with spin-orbital coupling (SOC) in the absence of electric field (the energy zero is set to be at the valence band maximum at F point). The A dots represent the contribution from the Na-s and Bi-s atomic orbitals, and the B dots represent the contribution from the Bi-$p_x$/$p_y$ atomic orbitals. One clearly observes a band inversion at Γ induced by SOC, indicating that it is a nontrivial 2D topological insulator. FIG. 27(d) Projected edge spectrum (edge along [010] direction) in the absence of electric field, showing topological edge states. (FIG. 27(e), FIG. 27(f)) are the corresponding results at electric field of 2.5 V/Å. In FIG. 27(e), one observes that after the gap closing and reopening, the band ordering at F is inverted compared to FIG. 27(c), indicating a topological phase transition to a trivial insulator phase. This is confirmed by the disappearance of topological edge states as shown in FIG. 27(f).

DETAILED DESCRIPTION

Figure 1A:
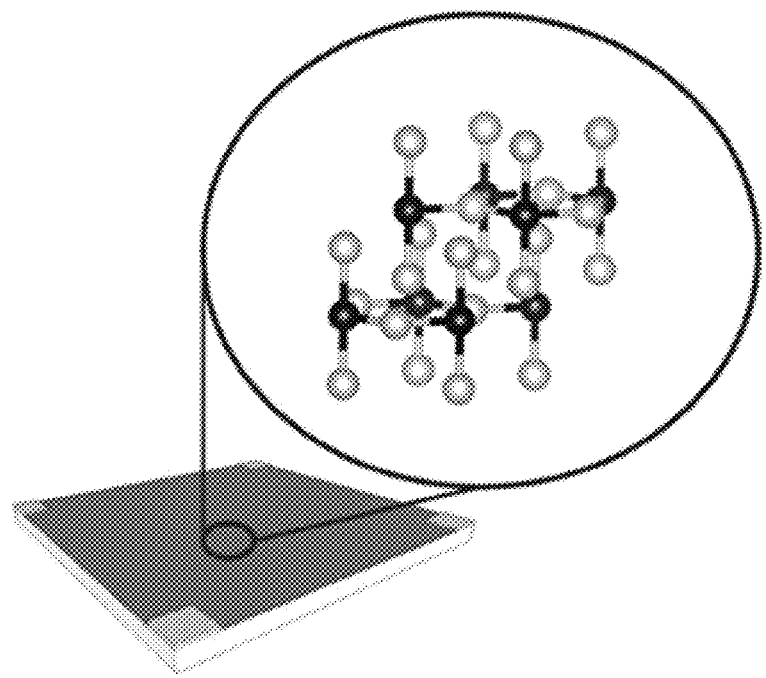
FIG. 1(a)-FIG. 1(d) illustrate the structure of $Na_3Bi$ thin films. All data corresponds to 20 nm-thick $Na_3Bi$ grown at 345° C. on $\alpha$-$Al_2O_3$[0001].

Topological Dirac semimetals (TDS) are three-dimensional analogues of graphene, with linear electronic dispersions in three dimensions. The inventors have found a method for forming a topological Dirac semimetal layer on a range of substrates, including electrically insulating materials, which allows the characterisation and analysis of the properties of these Dirac semimetals, and exploitation of their unique electronic properties, such as in an electronic component.

Example 1

This example demonstrates the formation of high quality, c-axis oriented thin film $Na_3Bi$ on insulating $Al_2O_3$[0001] substrates. It will be appreciated that a wide variety of different substrates can be selected for formation of the $Na_3Bi$ Dirac semimetal layer. However, in this instance and as discussed above, the use of insulating $Al_2O_3$ is advantageous as it allows the properties of the $Na_3Bi$ to be analysed in a controlled manner in the absence of a conductive layer.

Films are grown using the two-step method of some embodiments described herein. Briefly, a thin (2 nm) nucleation layer is deposited under simultaneous Bi and Na flux at low (120° C.) temperature, followed by additional growth at a higher final temperature of between 250 and 390° C. The resultant films were subsequently characterized using low temperature magneto-transport and scanning tunnelling microscopy and spectroscopy (STM and STS) in situ in ultrahigh vacuum (UHV).

To form the films, $Al_2O_3$[0001] substrates were annealed in air at 1350° C. for three hours, and subsequently annealed at 1050° C. in pure 02 atmosphere, to provide an atomically flat surface for film growth. Ti/Au contacts (5/50 nm) were deposited through a stencil mask onto the corners of the substrate, and wirebonded to a contact busbar on the sample plate. Substrates were introduced into ultra-high vacuum (UHV) immediately after wire bonding to minimise exposure to ambient conditions, and then annealed at 400° C. for 1 hour to remove adsorbed atmospheric species.

Effusion cells were used to simultaneously evaporate elemental Bi (99.999%, Alfa Aesar) in an overflux of Na (99.95%, Sigma Aldrich) with a Bi:Na flux ratio not less than 1:10, calibrated by quartz microbalance. The Bi rate used was about 0.03 Å/sec, and Na was about 0.7 Å/sec. The pressure during growth was less than $3 \times 10^{-9}$ Torr.

For each sample, the first 2 nm of $Na_3Bi$ was deposited with the substrate temperature at 120° C. The substrate temperature was then increased to a value ranging between 250-390° C. over the next 5 nm of film growth as determined by the bismuth deposition rate. Once the desired temperature was reached, the remaining 13 nm of film was grown to form a 20 nm thick film. The samples were then annealed at the growth temperature for an additional 10 minutes in Na flux only, before cooling to room temperature for subsequent transfer to the analysis chamber. An additional sample grown only at 330° C. (without the low temperature nucleation layer) was of similarly inferior quality to the samples grown at hot temperatures above 380° C. (or much thinner than expected), indicating the importance of the low temperature nucleation layer.

Sample characterization was carried out in a Createc LT-STM operating in ultra-high vacuum (UHV) ($10^{-11}$ Torr) with base temperature 4.8K. A PtIr STM tip was prepared and calibrated using an Au(111) single crystal and the Shockley surface state before all measurements. STM differential conductance (dI/dV) was measured using a 5 mVrms AC excitation voltage (673 Hz) that was added to the tunnelling bias. Differential conductance measurements were made under open feedback conditions with the tip in a fixed position above the surface. The data in FIG. 1(a)-FIG. 1(d) was analysed and prepared using WSxM software. LEED measurements were done with the commercial 8" system (OCI) on the soft X-ray endstation of the Australian synchrotron. Transport measurements were carried out in the Createc LT-STM using van der Pauw geometry and standard DC electrical measurements in a magnetic field up to 0.5 T at 5K.

Figure 1B:
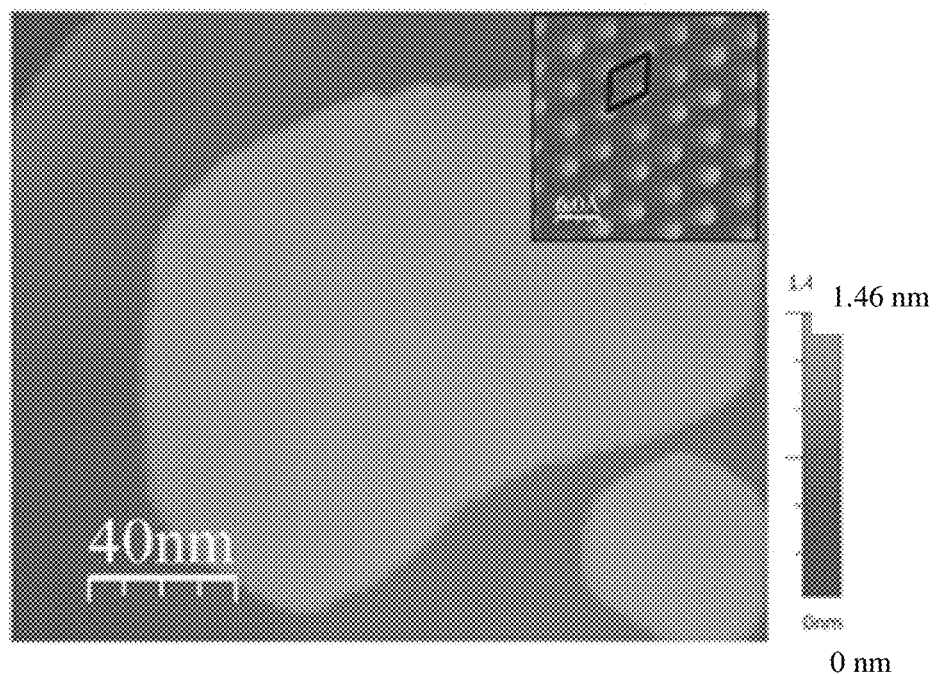
Figure 1C:
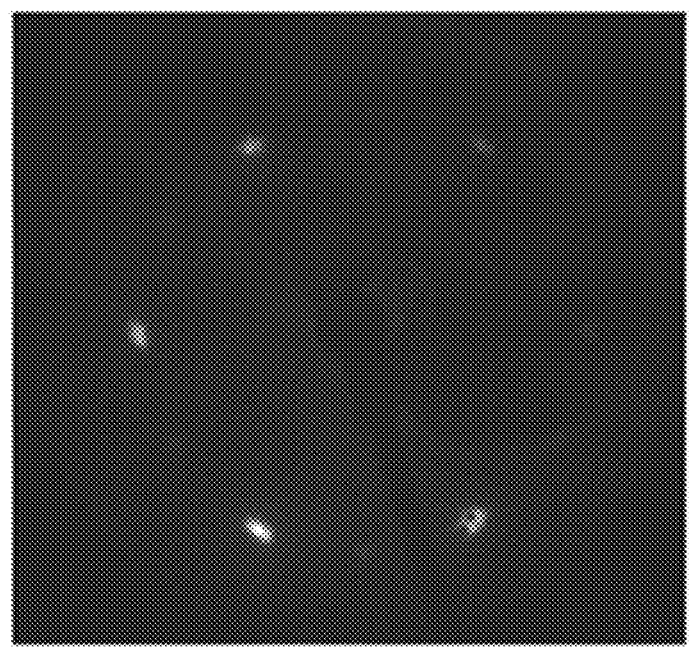
Figure 1D:
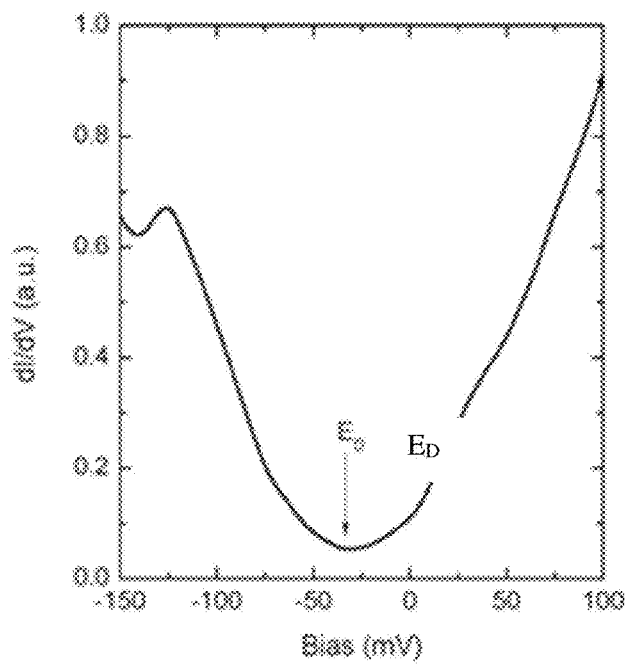

FIG. 1(a)-FIG. 1(d) shows the crystalline quality of $Na_3Bi$ thin films formed according to the embodiments described herein. As shown in FIG. 1(a)-FIG. 1(d), the structure comprises single crystal $Al_2O_3$[0001] pre-patterned with electrical contacts in van der Pauw geometry, and the $Na_3Bi$ is deposited on top, making electrical contact. FIG. 1(a) inset shows the crystal structure of $Na_3Bi$. FIG. 1(b) shows STM topography at a temperature of 5 K, showing a large area (about 80×80 nm) atomically flat terrace, with a step height of 4.7 Å, consistent with the half-unit cell distance of 4.83 Å between NaBi planes. Atomic resolution of the surface (inset) shows a (1×1) termination with the expected in-plane lattice constant of 5.45 Å. The 1×1 triangular lattice rather than hexagonal lattice is strongly suggestive that the surface is Na-terminated. FIG. 1(c) shows low energy electron diffraction (LEED) image taken at 17.5 eV. The low background and sharp hexagonal diffraction pattern confirm that the (1×1) structure is coherent across the LEED spot size of about 200 µm. Faintly visible is the same pattern rotated 30°, indicating the presence of a small fraction of the sample with that alignment. Similar quality LEED patterns were observed on samples grown across the range of final temperatures tested. FIG. 1(d) shows STS (differential conductance vs bias voltage) averaged over an area of 400 $nm^2$. STS reflect the energy dependent local density of states of the sample. The sharp dip near zero energy reflects the dip in LDOS at the Dirac point, with Dirac point energy ED=−35 meV, consistent with the n-type doping measured via transport. This value in conjunction with carrier density measured via transport (see below, about $3.8 \times 10^{18}$ $cm^{-3}$) can be used to estimate the average Fermi velocity in the samples, $v_F = 1.4 \times 10^5$ m/s, in reasonable agreement with the value $2.4 \times 10^5$ m/s obtained from ARPES.

Figure 2A:
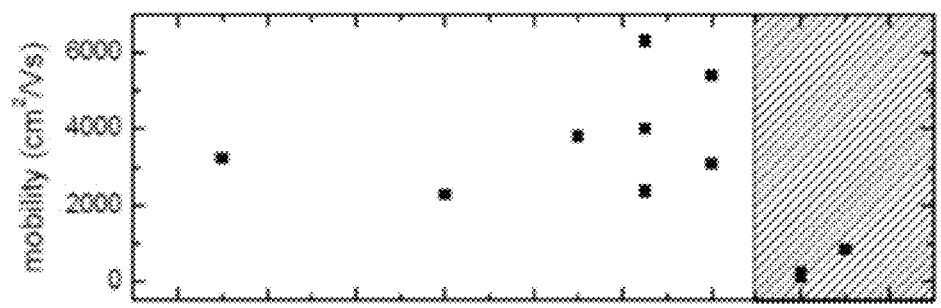
FIG. 2(a)-FIG. 2(c) illustrate Hall mobility and Hall carrier density of $Na_3Bi$ thin films measured at a temperature of 5 K for samples grown with different thermal profiles.
Figure 2B:
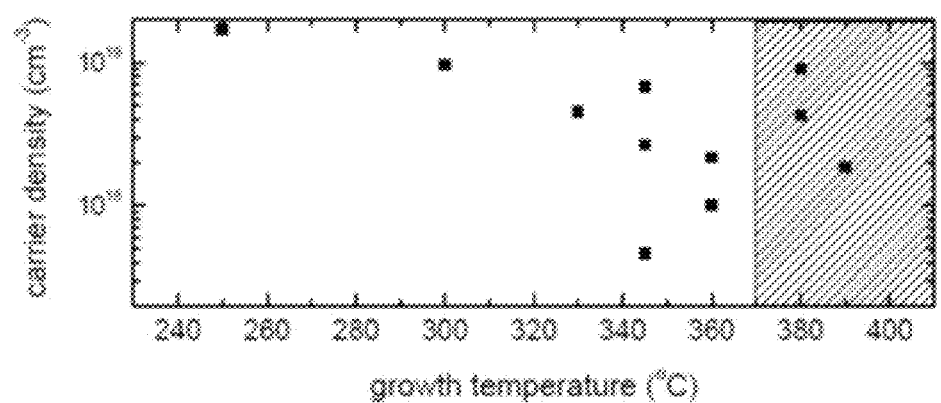
Figure 2C:
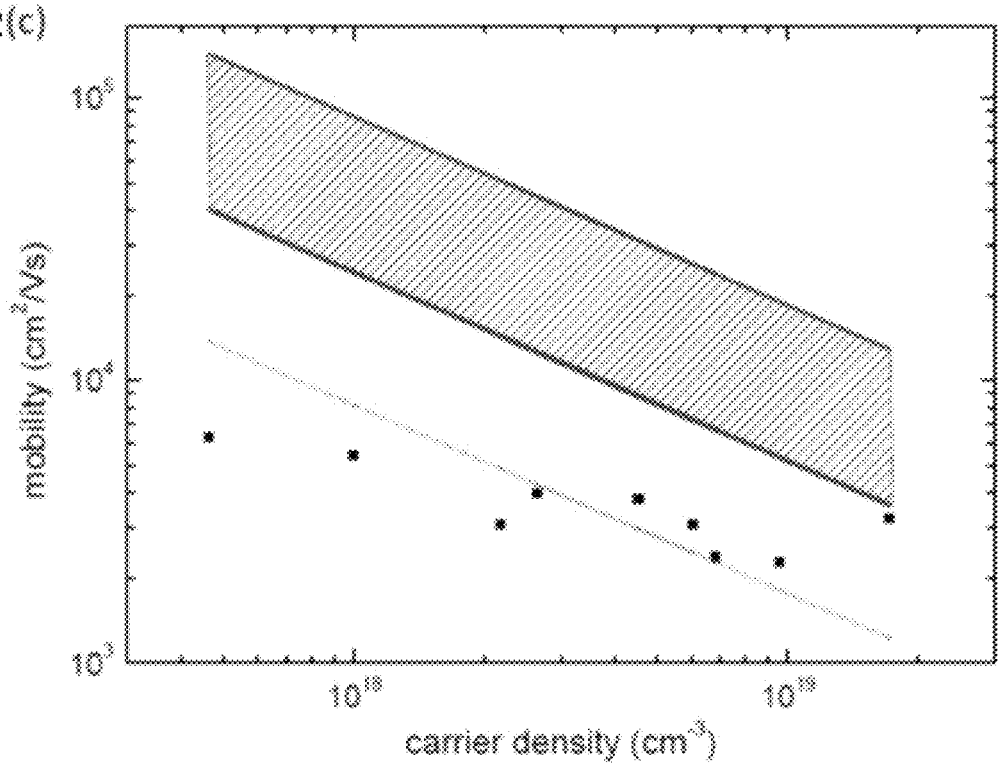

The ex situ prepared corner contacts illustrated in FIG. 1(a) allows van der Pauw measurements of the longitudinal and transverse resistivity $\rho_{xx}$ and $\rho_{xy}$ in magnetic field up to 0.5 T at a temperature of 5 K, from which the Hall carrier density $n=(e d.d\rho_{xy}/dB)^{-1}$ and the Hall mobility $\mu=(ne\rho_{xx})^{-1}$ can be determined, where d=20 nm is the thickness, and e is the elementary charge. FIG. 2(a)-FIG. 2(c) show p (FIG. 2(a)) and n (FIG. 2(b)) plotted against the final growth temperature for each sample. Samples with a final temperature above 380° C. had a substantial reduction in measured mobility, and intermittent electrical contact problems, probably indicating dewetting of the film on the substrate at these growth temperatures. Therefore these samples were discounted from further analysis. A trend of decreasing n and increasing µ was exhibited with increasing growth temperature, up to 360° C. The highest measured mobility (6,310 $cm^2$/Vs) and lowest carrier density ($4.6 \times 10^{17}$ $cm^{-3}$) were measured on a sample grown at 345° C. This lowest carrier density is still about an order of magnitude larger than the lowest reported bulk crystal value in literature. However, the observed range of doping ($4.6 \times 10^{17}$ to $1.7 \times 10^{19}$ $cm^{-3}$) falls within the range observed in bulk crystal values reported in literature. For the desired ambipolar effect to be observable in the operable range of the $SiO_2$ voltage gate, the n-type minimum carrier density should not exceed $4.4 \times 10^{15}$ $cm^{-3}$. Given the Fermi wavevector $k_F=(6\pi_2 n/g)^{1/3}$, the mean free path L can be calculated, which ranged between 75-135 nm for the prepared samples.

Increasing mobility with decreasing carrier density is consistent with expectations assuming that the impurities that give rise to doping are also responsible for the disorder limiting the mobility. To better understand the relationship between the mobility and carrier density, these parameters were plotted against one another (FIG. 2(c)).

The hashed region is the theoretical prediction for a TDS using the random phase approximation (RPA) assuming that all the impurities are dopants of a single sign, i.e. the impurity density $n_{imp}$ equals the carrier density n. The only materials parameters are the fine structure constant $\alpha = e^2/\kappa h v_F$ and the spin/valley degeneracy product g=4. Based on the results, the effective fine structure constant for $Na_3Bi$ was estimated to be between $\alpha=0:06$ to $0:17$, based on a κ of about $120_{-30}^{+10}$, and a Fermi velocity between $v_F=1:4 \times 10^5$ m/s from STS (FIG. 1(d)), and $v_F=2:43 \times 10^5$ m/s from single crystal ARPES experiments.

This data lies close to, but about an order of magnitude below the theoretical prediction of the mobility. There are several possible reasons for this. First, an incorrect value for alpha may have been used. If alpha is taken as a fit parameter in the theory, the best fit to the data (line in FIG. 2(c)) yields $\alpha=0:44$, 2.5-7 times higher than expected. Second, theory disregards other contributions to disorder in the prepared samples, notably point defects, structural incoherence due to grain boundaries or strain effects, all of which should be expected to some degree for a large area, van der Waals epitaxial film. Third, the theory assumes $n_{imp}$=n however the presence of both positive and negative charge carriers will cause $n_{imp}$>n. For the latter two reasons, the theoretical prediction is an upper bound.

Figure 3A:
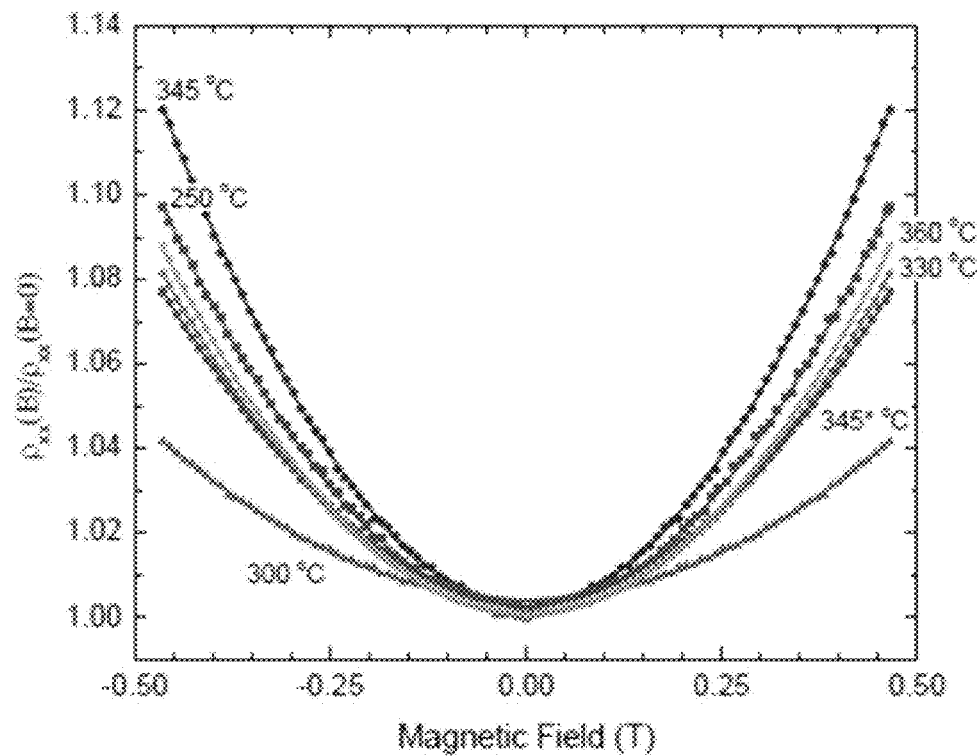
FIG. 3(a)-FIG. 3(d) illustrate the transverse magnetoresistance (about 0.5 T) of $Na_3Bi$ thin films at a temperature of 5 K.

FIG. 3(a) shows the transverse MR $\rho_{xx}(B)=\rho_{xx}(B=0)$ plotted as a function of perpendicular applied field, labelled according to the final growth temperature. An overall positive magnetoresistance (MR) is observed, with a cusp below about 0.1 T. For field values above 0.1 T the data are well described by a quadratic dependence:

$$\rho_{xx}(B)=\rho_{xx}(B=0)[1+A(\mu B)^2] \quad (1)$$

Figure 3B:
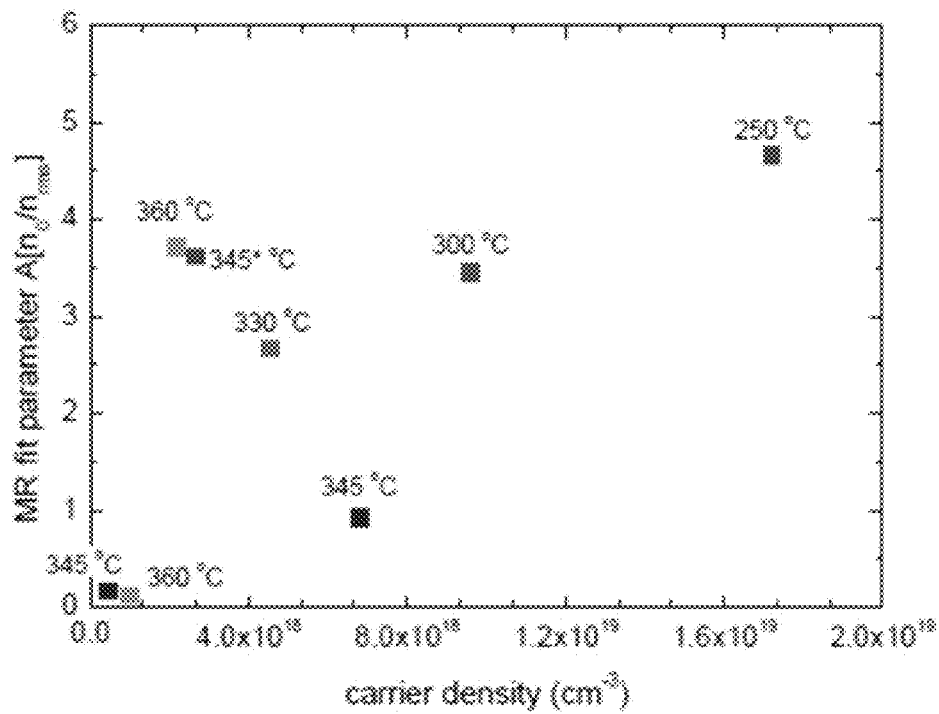

FIG. 3(b) shows the prefactor A determined from fits to Eqn. 1 plotted as a function carrier density n.

In the simplest instance, a single band, two-dimensional system evinces zero transverse MR. There are several possible origins for the observed quadratic MR. Without wishing to be bound by theory, the inventors postulate the following. Multiple conduction bands of differing mobility and/or carrier density can produce quadratic low-field MR, however this possibility is excluded due to the close proximity of the Dirac point as measured by both Hall effect and STS. Another possible explanation is spatial inhomogeneity, for example in carrier density, known to give a quadratic MR at low field. However, to our knowledge all theories of spatial inhomogeneity give A<½. This strict limit contrasts with the values we have obtained in the present work, ranging from about 0.1 to 4.5 (FIG. 3(b)). Notably, measurements on single crystal samples show similar unusually large quadratic MR coefficients A >½ in the low field regime (µB<<1). Recent theoretical efforts have been made to understand charge inhomogeneity in a Dirac semimetal system and propose that in the spatially inhomogeneous regime the Hall carrier density overestimates the average carrier density, and hence the mobility is underestimated and A overestimated. While the inhomogeneous theory can be made to be consistent with both the observed mobility and the large apparent A, this explanation seems very unlikely for the prepared samples.

The inhomogeneous regime is very small in $Na_3Bi$ (with α about 0:1); the characteristic carrier density inhomogeneity is only a few percent of the impurity density, requiring donor and acceptor concentrations to also be balanced within a few percent. We find this scenario unlikely to occur generically in all our samples across a range of growth conditions, where the observed Hall carrier density varies by almost two orders of magnitude.

Figure 3C:
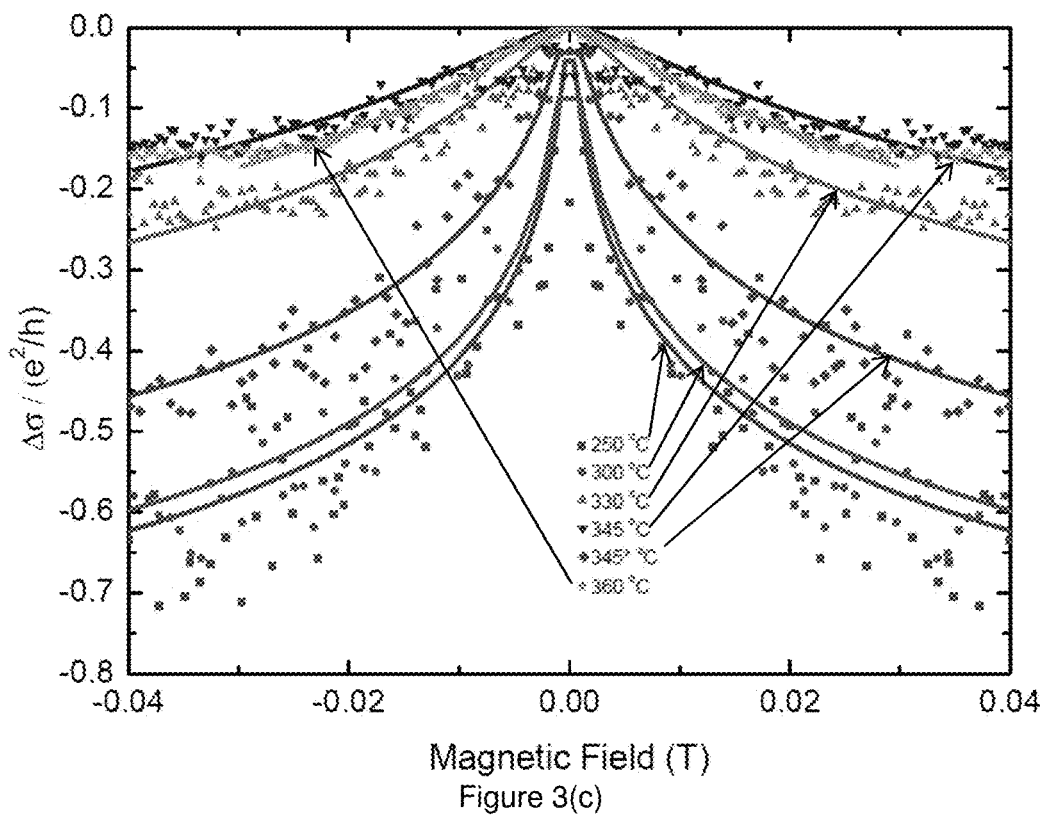
Figure 3D:
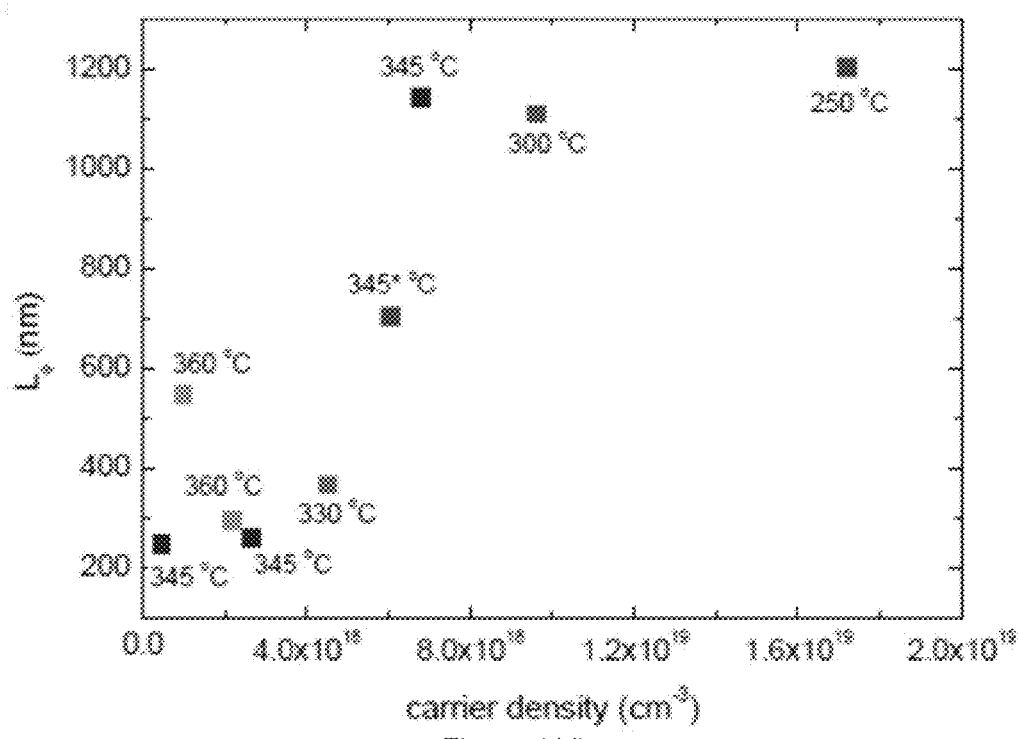

FIG. 3(c) shows the MR after subtracting the quadratic MR from fits to Eqn. 1). The low field data is replotted as the change in 2D conductivity ($\Delta\sigma=\sigma(B)-\sigma(B=0)$), in units of $e^2/h$. The low-field MR data are well described by the strong spin-orbit coupling limit of the Hikami-Larkin-Nagaoka (HLN) formula:

$$\sigma(B) - \sigma(0) = \frac{1}{2} \frac{e^2}{2\pi^2 h} \left( \ln\left(\frac{B_\phi}{B}\right) - \psi\left(\frac{1}{2} + \frac{B_\phi}{B}\right) \right)$$

where the only fit parameter is the phase coherence field $B_\phi$. FIG. 3(d)) shows the phase coherence length as a function of carrier density for the various films:

$$L_\phi = \sqrt{\frac{h}{4eB_\phi}}$$

In each instance the coherence length is substantially larger than the thickness of the samples (20 nm), consistent with the assumption of two-dimensionality. Efforts to fit this data using a three-dimensional theory for weak localization yielded poor fits regardless of the limiting cases in temperature and magnetic field used, again illustrating a deviation between practice and theory. 3D weak anti-localization in bulk crystals of TDS have previously been predicted. However, this was for a bulk crystal and not a thin film. The observations of 2D weak anti-localization in these films is a new and unexpected property. Accordingly, in certain embodiments, the topological Dirac semimetal layer in the structure exhibits 2D weak anti-localisation.

The coherence length $L_\phi$ at densities above $6\times10^{18}$ cm$^{-3}$ exceeds 1 µm, but is suppressed in lower carrier density samples, a phenomena that has been previously observed in other Dirac materials such as graphene and the Dirac surface state of bismuth selenide. The fact that the obtained weak field MR is well described by the HLN formula indicates that Na$_3$Bi films of the embodiments described herein are well described by non-interacting Dirac cones, i.e. intervalley scattering is weak.

In summary, the growth of electrically isolated, highly oriented, large area thin film Na$_3$Bi on $\alpha$-Al$_2$O$_3$[0001] substrates has been demonstrated. The high sample quality is reflected in a record high mobility and near-ideal weak anti-localization behaviour. High quality TDS thin films on insulators open a route toward novel topological phenomena and devices, including electric field control via gate electrodes, as illustrated in Example 2.

Example 2

Figure 4A:
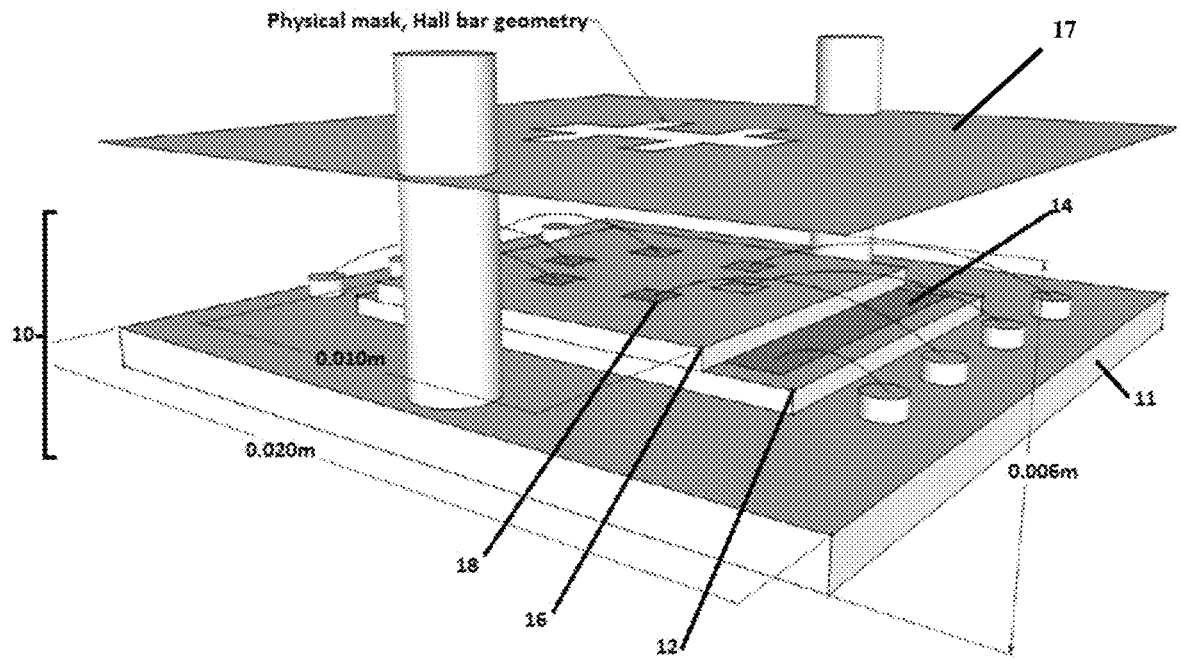
FIG. 4(a) and FIG. 4(b) show, diagrammatically, devices used in film deposition.
Figure 4B:
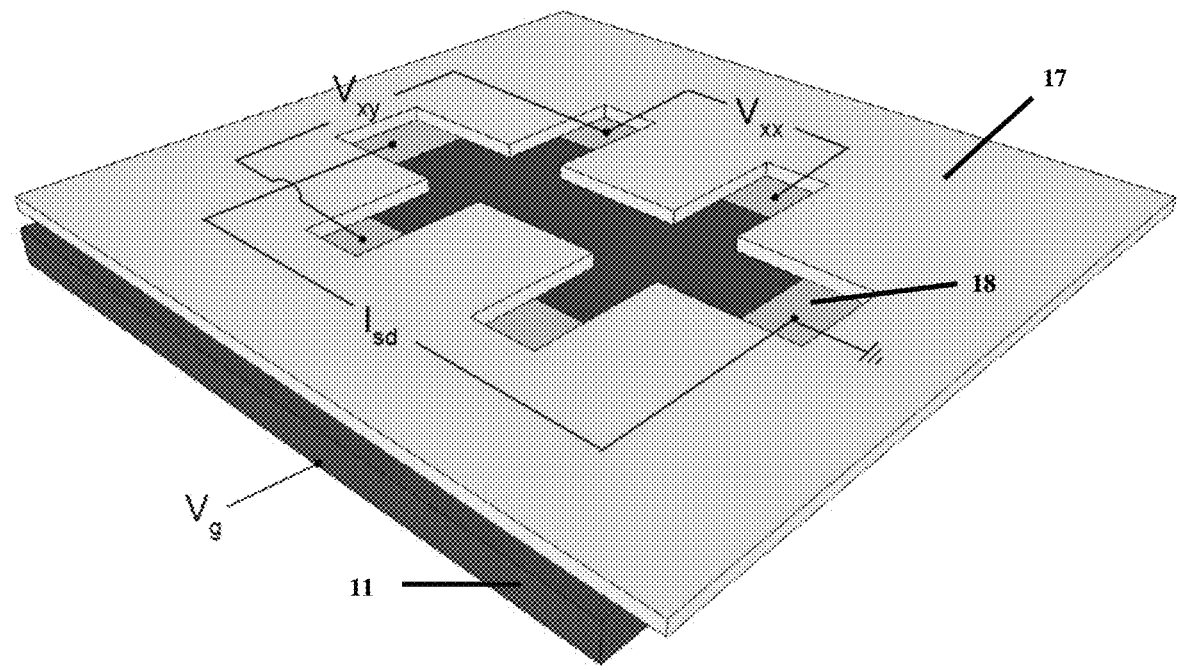

FIG. 4(a) and FIG. 4(b) illustrate a stencil mask 17 and prepared substrate structure 10 used in some embodiments described herein. The substrate structure 10 includes a sample plate 11. An insulating substrate was applied over it to electrically insulate the created structure. Next a back gate electrode 14 is provided on top of which an Si:SiO$_2$ substrate is placed.

Ti/Au contacts (5/50 nm) 18 were deposited through a stencil mask 17 onto the solvent-cleaned pieces of 1 µm oxide thickness Si:SiO$_2$ substrate pieces 16. A stencil mask 17 in the Hall bar pattern was affixed to the substrate surface, and the electrodes were subsequently wire bonded to a contact busbar on the sample plate. Substrates were introduced into UHV immediately after wire bonding to minimise exposure to ambient conditions, and then annealed at 450° C. for 90 minutes to remove adsorbed atmospheric species.

Effusion cells were used to simultaneously evaporate elemental Bi (99.999%, Alfa Aesar) in an over flux of Na (99.95%, Sigma Aldrich) with a Bi:Na flux ratio not less than 1:10, calibrated by quartz microbalance. The Bi deposition rate was about 0.03 Å/sec, and the Na deposition rate was about 0.7 Å/sec. The pressure during growth was less than $3\times10^{-9}$ Torr.

For each sample, the first 2 nm of Na$_3$Bi was deposited with the substrate temperature at 120° C. The substrate temperature was then increased to 345° C. over the next 5 nm of film growth as determined by the bismuth deposition rate. Once a temperature of 345° C. was reached, the remaining 13 nm of film was grown, thus forming the structure illustrated in FIG. 4(b). The samples were annealed at the growth temperature for an additional 10 minutes in Na flux only, before cooling to room temperature for subsequent transfer to the analysis chamber. Sample characterization was carried out in a Createc LT-STM operating in ultra-high vacuum (UHV) ($10^{-11}$ Torr) with base temperature 4.8K using a Hall bar geometry and standard DC electrical measurements in a magnetic field up to 1 T at 5K.

Figure 5:
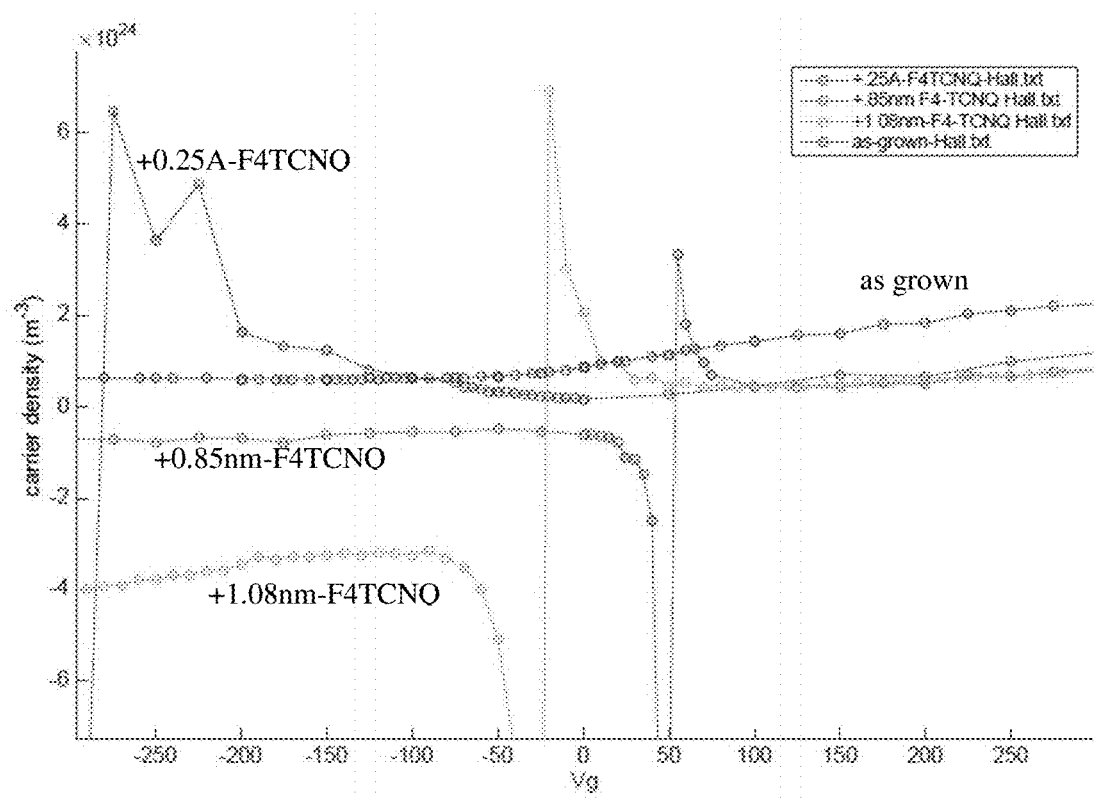
FIG. 5 plots Hall effect carrier density against gate voltage for various top surface coverages of molecular dopant F4-TCNQ. For coverages of +0.85 nm and +1.08 nm F4-TCNQ, the ambipolar, n− to p− type transition is clearly visible at +50 Vg and −35 Vg, respectively.

In FIG. 5, the Hall carrier density $1/n=edR_{xy}/dB$, rescaled by sample thickness t=18 nm, is plotted against the gate voltage applied across the SiO$_2$ dielectric. For sufficient top surface coverage of molecular electron acceptor F4-TCNQ, +0.85 nm and +1.08 nm, the ambipolar, n- to p-type transition is clearly observed at +50 Vg and −35 Vg, respectively.

Example 3

The example reports results relating to controlling the bandgap of ultra-thin topological Dirac semimetal Na$_3$Bi.

Ultrathin Na$_3$Bi films were grown in a ultra-high vacuum (UHV) ($10^{-10}$ Torr) molecular beam epitaxy (MBE) chamber and then transferred immediately after the growth to the interconnected Createc LT-STM operating in UHV ($10^{-11}$ Torr) for STM/STS measurements at 5 K. For Na$_3$Bi film growth effusion cells were used to simultaneously evaporate elemental Bi (99.999%, Alfa Aesar) in an overflux of Na (99.95%, Sigma Aldrich) with a Bi:Na flux ratio not less than 1:10, calibrated by quartz microbalance. The Bi rate used was ~0.03 Å/s, and Na was ~0.7 Å/s. The pressure during growth was less than $3\times10^{-9}$ Torr.

Growth on Si(111)—To prepare an atomically flat substrate, a Si(111) wafer was flash annealed in order to achieve 7×7 surface reconstruction, confirmed using STM and low energy electron diffraction (LEED). During the growth, the substrate temperature was 345° C. for successful crystallization. At the end of the growth the sample was left at 345° C. for 10 min in a Na overflux to improve the film quality. The sample was cooled to 315° C. in Na overflux to minimise Na vacancies due to desorption at elevated temperature before cooling to room temperature.

A PtIr STM tip was prepared and calibrated using an Au(111) single crystal and the Shockley surface state at 0.5V and flat LDOS near the Fermi level before all measurements.

STM differential conductance (dI/dV) was measured using a 5 mV AC excitation voltage (673 Hz) that was added to the tunnelling bias. Differential conductance measurements were made under open feedback conditions with the tip in a fixed position above the surface.

Figure 6:
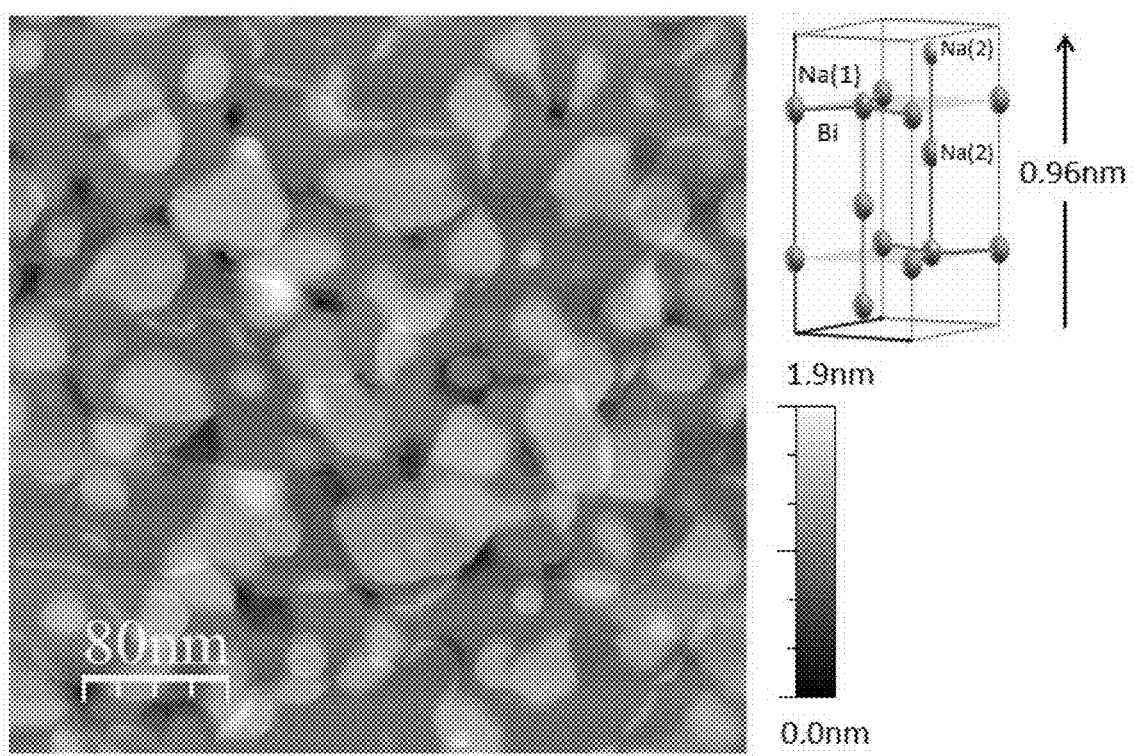
FIG. 6 is an STM topographic image (400 nm×400 nm) of few atomic layer $Na_3Bi$(001) film grown on Si(111).

FIG. 6 shows the successful growth of a continuous few atomic layer thick $Na_3Bi$ film grown via molecular beam epitaxy on a Si(111) substrate. The unit cell of $Na_3Bi$ is shown with the c-axis height of 0.96 nm (reflecting the thickness of a (001) film). The zero of the height scale represents the Si(111) substrate. The majority of the film has a thickness of 0.96 nm and 1.44 nm, demonstrating continuous film with atomically flat terraces larger than 40 nm.

Figure 7A:
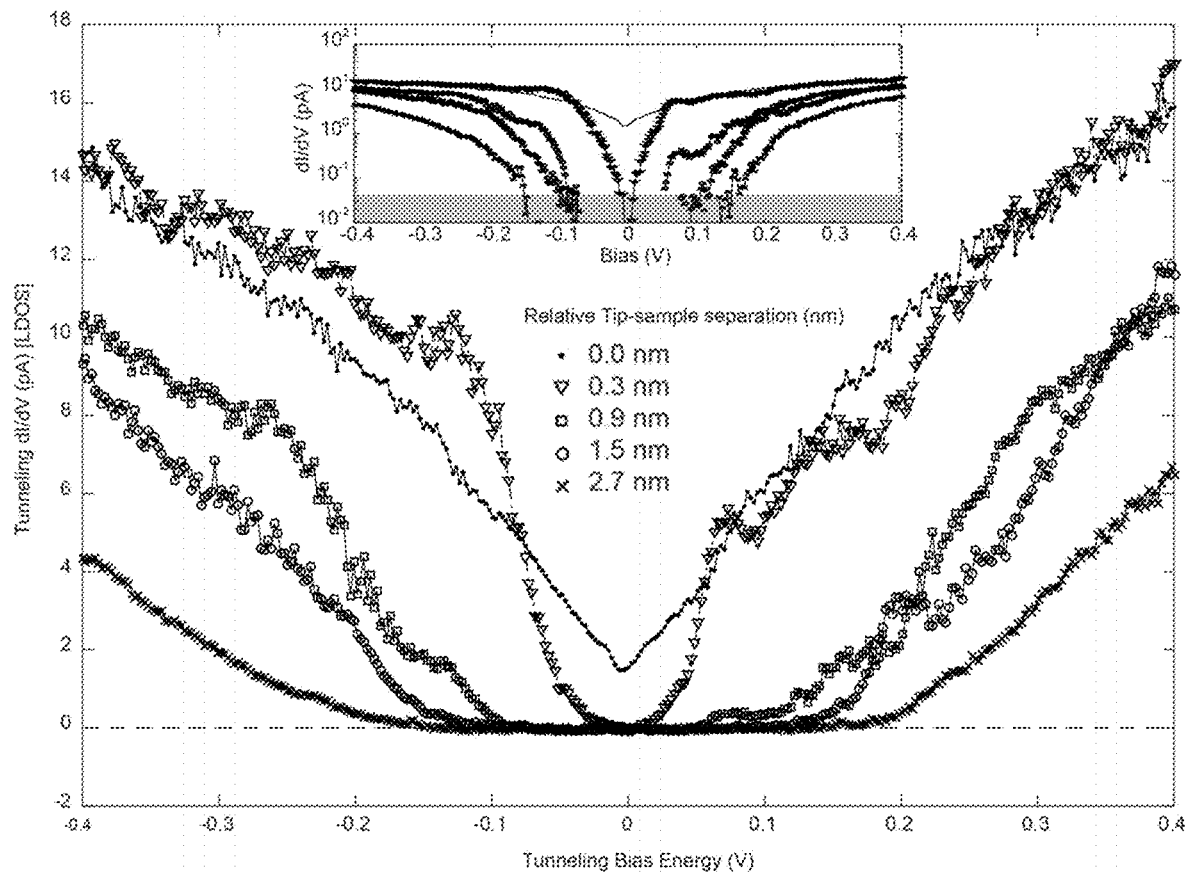
FIG. 7(a) shows differential conductance, dI/dV spectra taken on a pristine region of $Na_3Bi$ at different tip-sample separations.
Figure 7B:
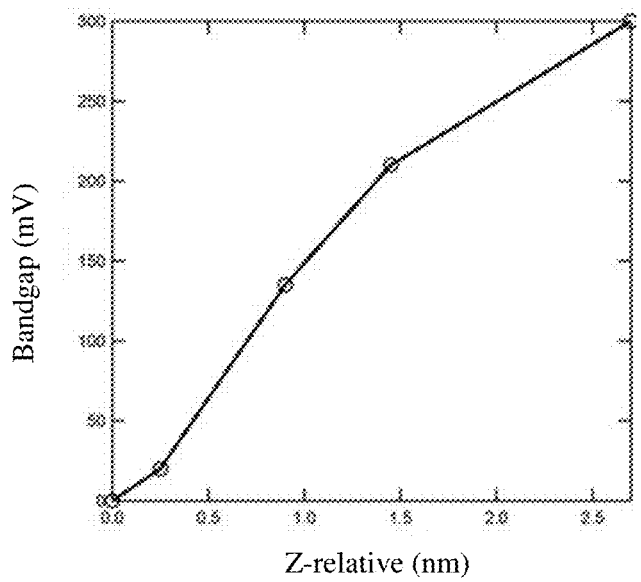
FIG. 7(b) shows extracted bandgap as a function of relative height (or tip-sample separation height) from the dI/dV spectra in FIG. 7(a).

Scanning tunnelling spectroscopy, which measures the differential conductance with respect to the bias voltage (reflecting the energy dependent local density of states of the material) was measured on the film at different uniform and atomically flat regions of the sample away from any step edges. FIG. 7(a) shows the differential conductance, dI/dV, at one such region at different tip-height separations. The black curve represents the dI/dV spectra taken at tunnelling parameters (V=−300 mV, I=500 pA, $V_{rms}$=5 mV, f=673 Hz). The spectra lines represents an increase in the tip-sample separation of 0.3 nm, 0.9 nm, 1.5 nm and 2.7 nm respectively with respect to the initial tip-sample separation. Changing the tip-sample separation changes the electric field induced from the potential difference between tip and sample. Initially the system has a dI/dV that possesses a sharp dip near the zero in energy but does not go all the way to zero (which is taken as 0.03 in the dI/dV scale and represents the noise floor of the instrument). This behaviour reflects a semi-metal (with zero bandgap) expected for bulk topological Dirac semimetal $Na_3Bi$. As the tip is moved further from the sample (i.e. decreasing the electric field) a distinct zero in the differential conductance emerges that reflects the opening of a bandgap. As the electric field is decreased, this zero increases in width with monotonic behaviour. The rapid increase in intensity below the zero in energy (which reflects the Fermi energy) represents the valence band edge and the rapid increase above zero represents the conduction band edge. The difference between these two values reflects the overall size of the bandgap. FIG. 7(b) plots the bandgap as a function of relative tip-sample separation for the dI/dV spectra in FIG. 7(a). In this Figure, the bandgap is extracted from the onset of the conduction and valence bands in each spectra. A clear trend emerges as the tip-samples separation increases (i.e. electric field decreases) the bandgap transitions from a 0 mV bandgap to saturation at a bandgap value of 300 mV.

This example demonstrates for the first time, electric field control of the bandgap in a topological Dirac semimetal.

Example 4

This example reports data from high quality thin films of $Na_3Bi$ grown on amorphous Si:SiO2 substrates. The films were grown using the two-step thermal process.

Ti/Au contacts (5/50 nm) were deposited through a stencil mask onto solvent-cleaned pieces of 1 μm oxide thickness $Si:SiO_2$ substrate pieces. A stencil mask in the Hall bar pattern was affixed to the substrate surface, and electrodes were subsequently wire-bonded to a contact busbar on the sample plate. FIG. 4(b) is a sample diagram, showing the stencil mask used to define the Hall bar geometry for thin film growth on the $Si:SiO_2$ substrate. Substrates were introduced into UHV immediately after wire bonding to minimise exposure to ambient conditions, and then annealed at 450° C. for 90 minutes to remove adsorbed atmospheric species.

Effusion cells were used to simultaneously evaporate elemental Bi (99.999%, Alfa Aesar) in an overflux of Na (99.95%, Sigma Aldrich) with a Bi:Na flux ratio not less than 1:10, calibrated by quartz microbalance. The Bi rate used was about 0.03_A/sec, and Na was about 0.7_A/sec. The pressure during growth was less than 3 $10^{-9}$ Torr.

For each sample, the first 2 nm of $Na_3Bi$ was deposited with the substrate temperature at 120° C. The substrate temperature was then increased to 345° C. over the next 5 nm of film growth as determined by the bismuth deposition rate. After the remaining 13 nm of film was grown, the samples were annealed at the growth temperature for an additional 10 minutes in Na flux only, before cooling to room temperature for subsequent transfer to the analysis chamber. Sample characterization was carried out in a Createc LT-STM operating in ultra-high vacuum (UHV) ($10^{-11}$ Torr) with base temperature 4.8K using a Hall bar geometry and standard DC electrical measurements in a magnetic field up to 1 T at 5K. The sample was transferred back to the growth chamber for sequential deposition of molecular dopant F4-TCNQ (Sigma-Aldrich) onto the surface, and subsequent transport characterization. The organic molecule F4-TCNQ acts as a p-type dopant due to its high electron affinity (as previously discussed in Example 2) and was deposited onto the surface of the as-grown $Na_3Bi$ to induce a depletion layer at the surface of the film, before further modulation of the carrier density using the $SiO_2$ back gate.

Figure 8:
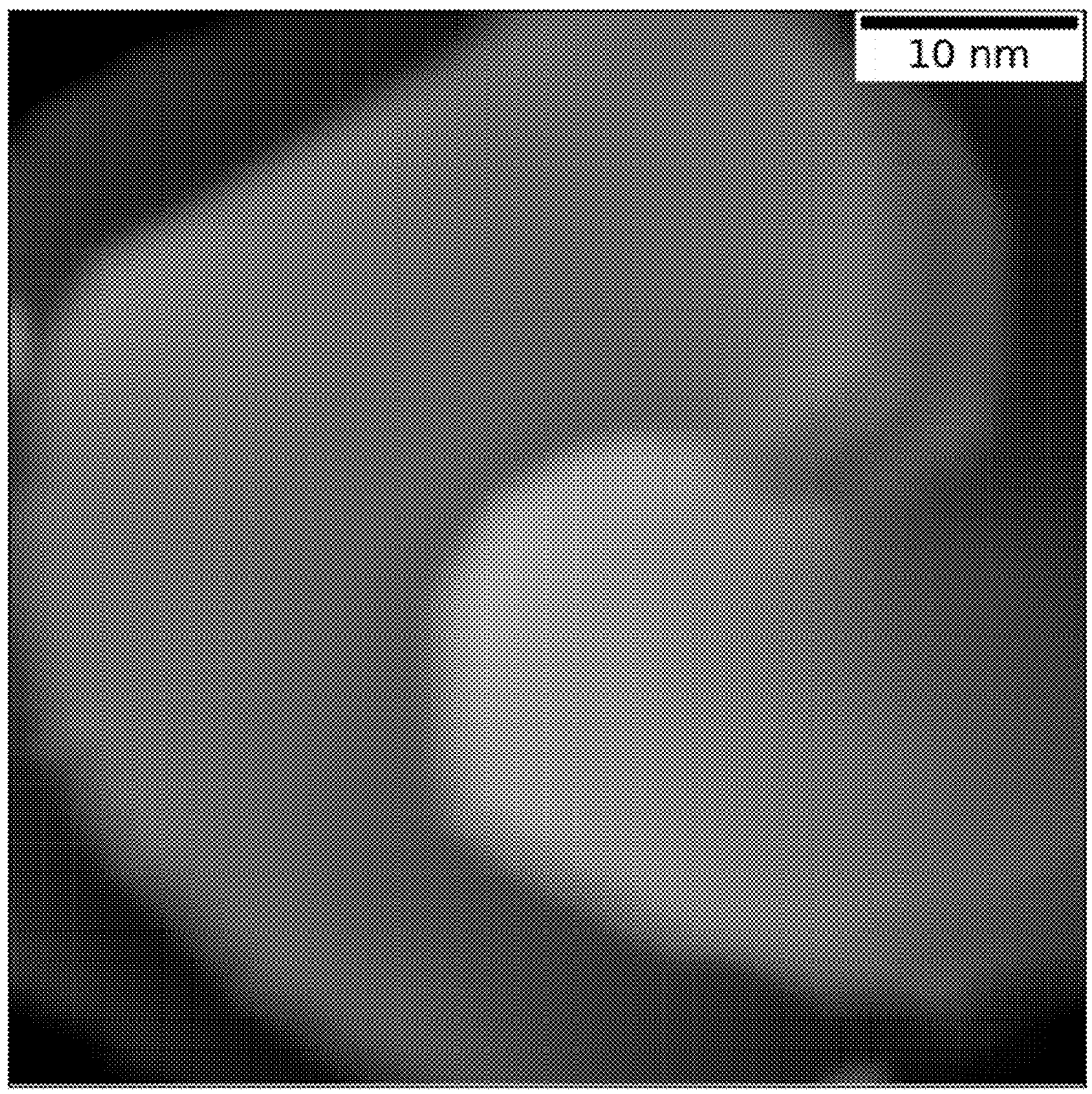
FIG. 8 is a Scanning tunneling microscopy (STM) image showing the morphology of a sample 50×50 nm, with 2 nm vertical scale, $V_{bias}$=−300 mV, I=200 pA. The observable step edges have height of 4.2 Å.
Figures 9A, 9B:
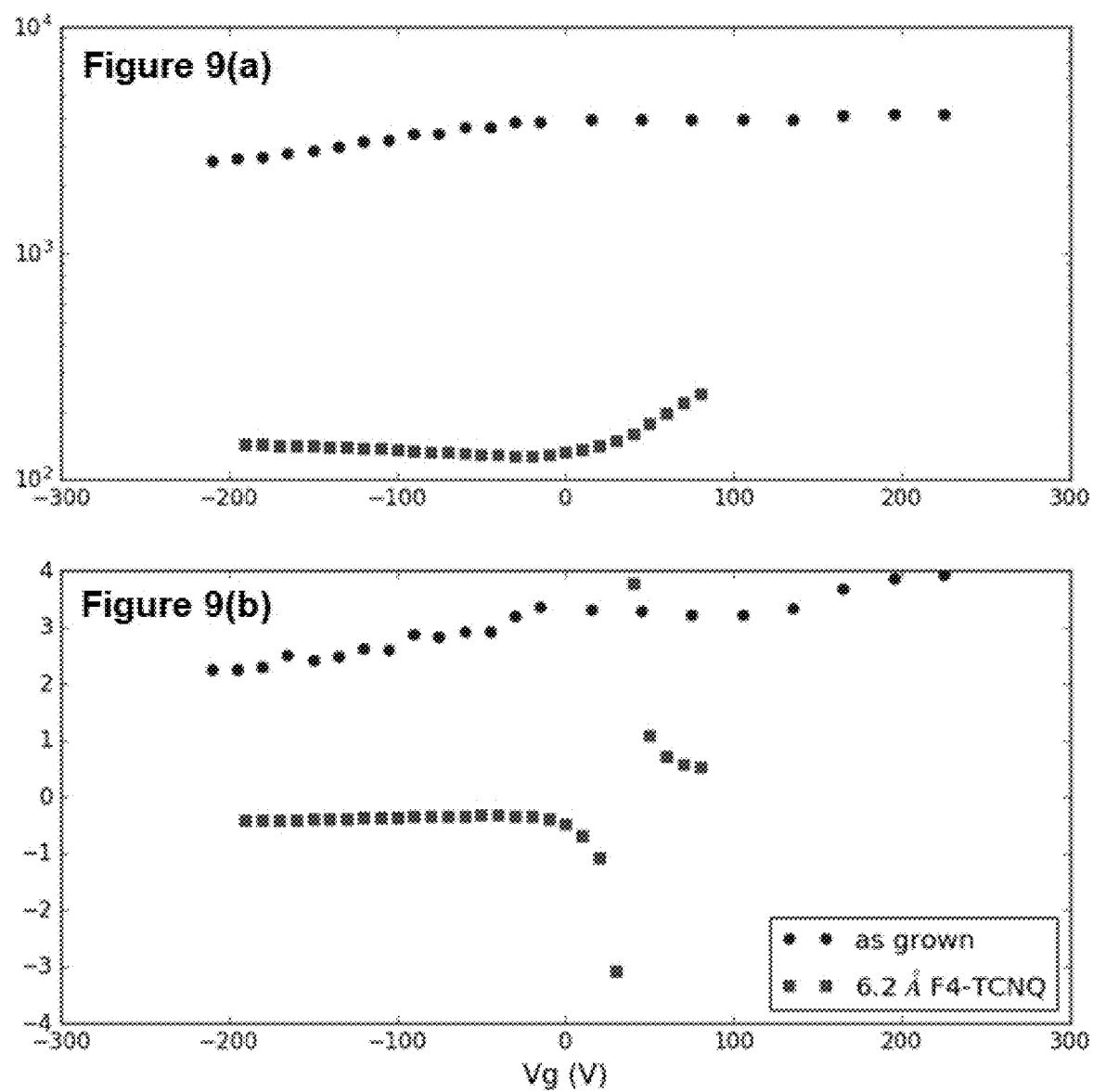
FIG. 9(a) shows zero field conductivity (S/cm) and FIG. 9(b) shows low-field Hall carrier density ($10^{18}$ $cm^{-3}$) vs. back gate voltage (Vg), for the $Na_3Bi$ film as-grown (circles), and after the deposition of 6.2 Å F4-TCNQ on the surface (squares)

FIG. 8 is a Scanning tunneling microscopy (STM) image showing the morphology of a sample 50×50 nm, with 2 nm vertical scale, $V_{bias}$=−300 mV, I=200 pA. The observable step edges have height of 4.2 Å. FIG. 9(a) and FIG. 9(b) demonstrate the effects of depositing F4-TCNQ on the sample surface. The 'as-grown' $Na_3Bi$_film (circles) has an intrinsic ($V_g$=0) n-type carrier density of $5.7 \times 10^{12}$ $cm^{-2}$, calculated from the low-field (B<0.05 T), linear Hall response: n=1/(e d$\rho_{xy}$/dB). This corresponds to a Hall mobility of 0.7 $T^{-1}$ ($\mu=\sigma_{xx}/ne$). The roughly linear dependence of the gate dependent carrier density in b) confirms that the sample is above the Dirac point, away from the charge puddling regime. Two features are apparent when 6.2 Å of F4-TCNQ is deposited on the film surface (squares). The conductivity of the sample is reduced by more than an order of magnitude, and the gate dependence reveals a minimum conductivity value as expected for a Dirac system. This is correlated with an asymptotic divergence in carrier density, caused by a change in sign of the slope of the low-field $\rho_{xy}(B)$ dependence.

Figure 10A:
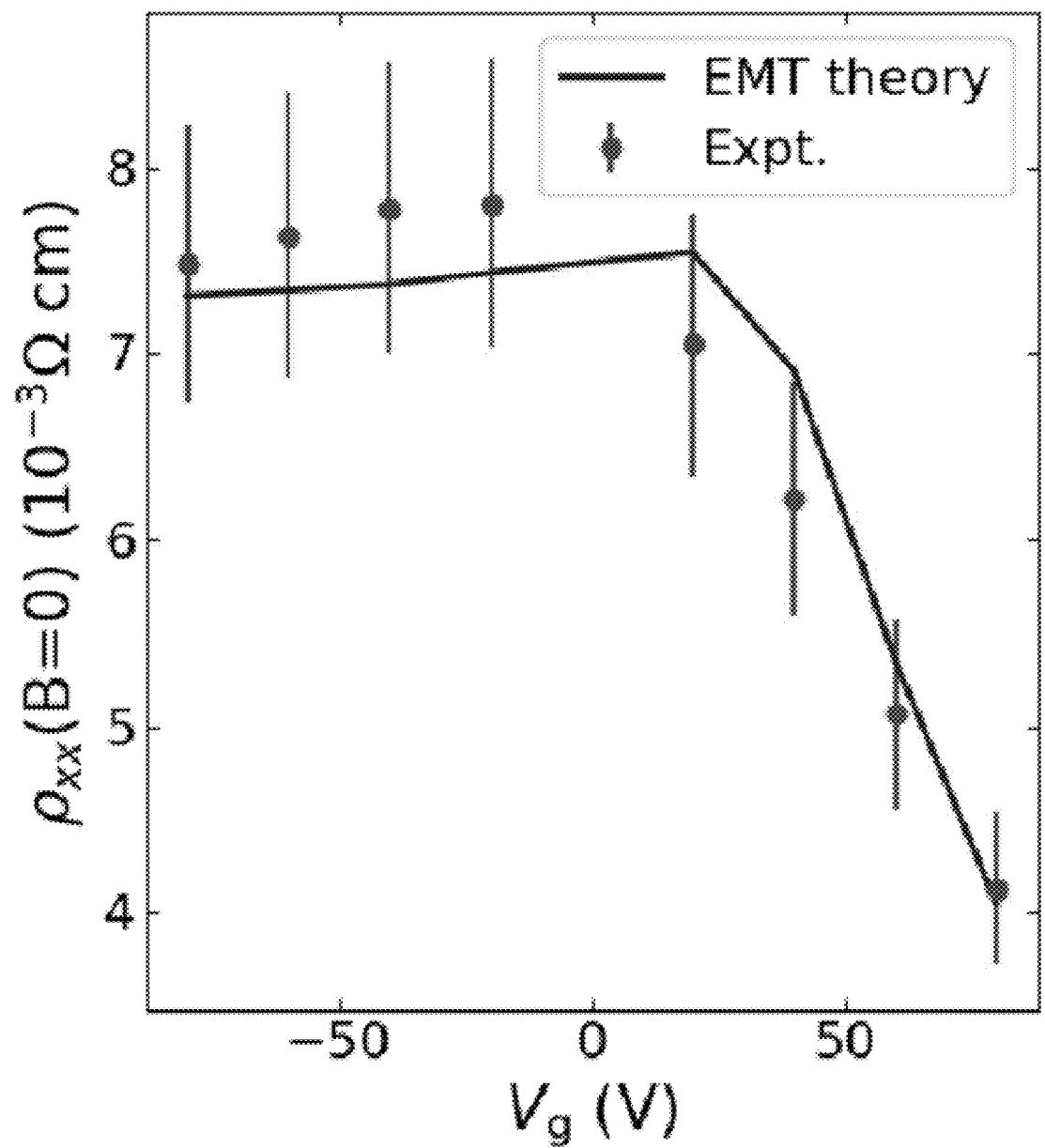
FIG. 10(a) shows the gate dependence of the zero-field resistivity $\rho_{xx}$ ($\Omega$-cm) after top-gating with F4-TCNQ.
Figure 10B:
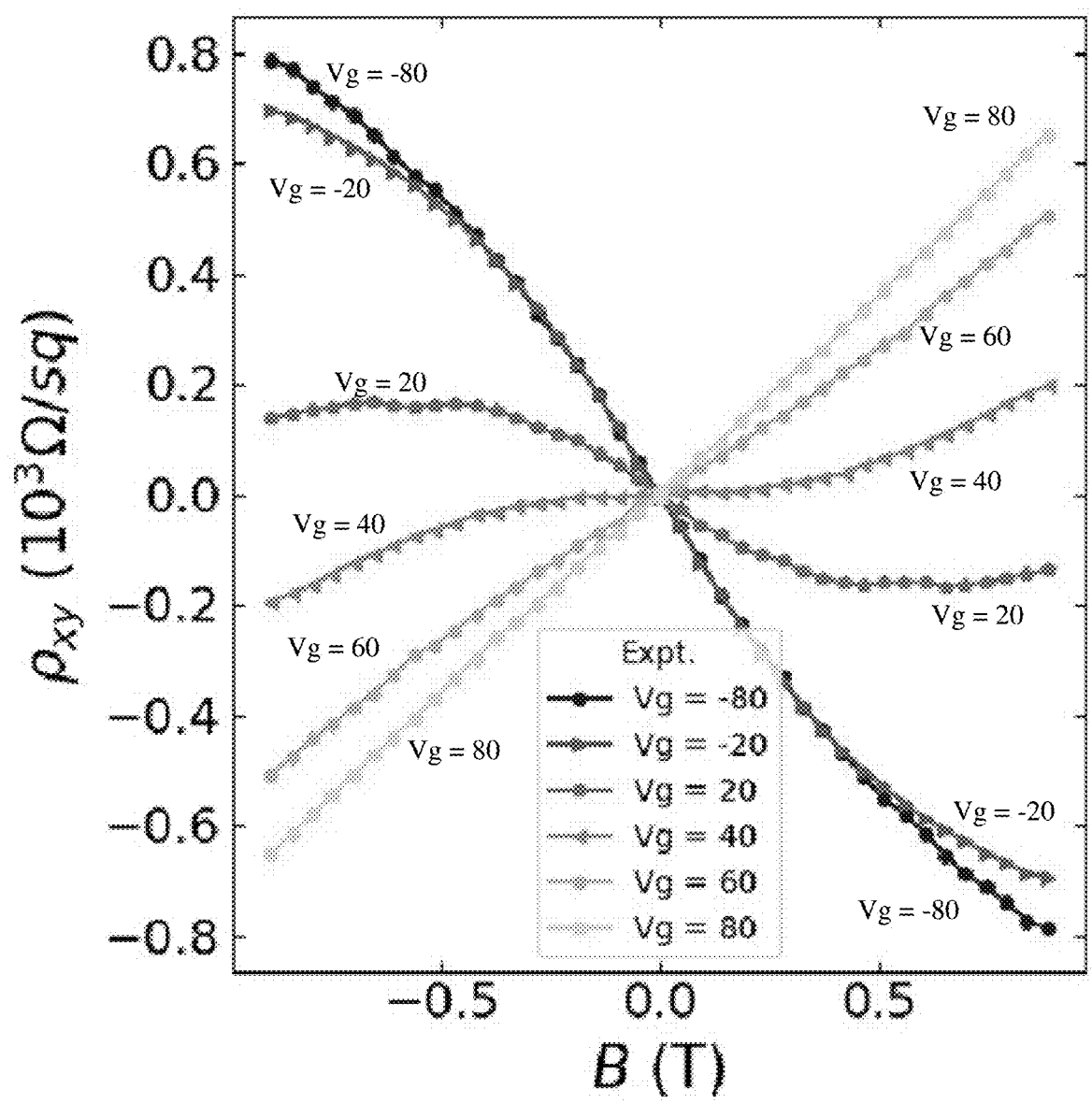
FIG. 10(b) shows transverse magnetoresistance $\rho_{xy}$ ($\Omega$/sq) plotted versus perpendicular applied magnetic field (T), for back gate voltages (Vg) indicated in the legend (V).

Before and after depositing F4-TCNQ, the full-field (1 T) MR shows anomalously large quadratic response. For the sample as-grown, the $\rho_{xy}(B)$ component is completely linear, indicating unipolar n-type response. This is in contrast to what is observed upon deposition of F4-TCNQ. FIG. 10(a) shows the gate dependence of the zero-field resistivity after deposition of F4-TCNQ. In the plot, =the line shows the measured values and the points represent the theoretical fit values. The plot shows a maximum at Vg=−20 V, as expected for a Dirac-like system ( ). There are several notable features in the gate dependent Hall response, shown in FIG. 10(b). In the measurement convention adopted in FIG. 10(b), a positive (negative) $\rho_{xy}$ slope corresponds to electron (hole) type conduction. As can be seen, at low-field (B<0.25 T) there is a clear transition from electron- to hole-like response as the gate is modulated from positive to negative bias. Furthermore, when the low-field response becomes hole-like (negative slope), the overall signal becomes non-linear, which indicates contributions from multiple carrier types. Reasonable fits to the $\rho_{xy}(B)$ data using the two-carrier model captured several essential features, namely the mobility of the hole-like channel is much higher than the electron-like channel: however the gate dependence of the total carrier number (e.g. the sum of the two contributions, n+p) is qualitatively incorrect, indicating that the number of electrons in the sample is increasing with negative applied gate voltage.

The anomalously large coefficient of the quadratic magnetoresistance, the change in slope sign, and non-linearity of the Hall response, all indicate that these samples are in the charge inhomogeneous regime near the Dirac point. For the data taken following the F4-TCNQ deposition, the MR response at each applied gate voltage is fitted using three global fit parameters: the proportionalities between electron/hole conductivity and $n^{4/3}$, denoted $A_e$, $A_h$, and $n_{rms}$, the measure of the disorder induced carrier density fluctuations. The carrier density n is taken as the only $V_g$ dependent fit parameter. Normally with a Si:SiO$_2$ capacitive gate, the change in carrier density can be treated as proportional to the change in gate voltage, $\Delta n$ is proportional to $\Delta V_g$. However in this instance a non-linear gate response on the negative side was observed, which is attributed to charge traps likely introduced as a result of the exposure to Na flux intrinsic to the sample growth process.

Figure 10C:
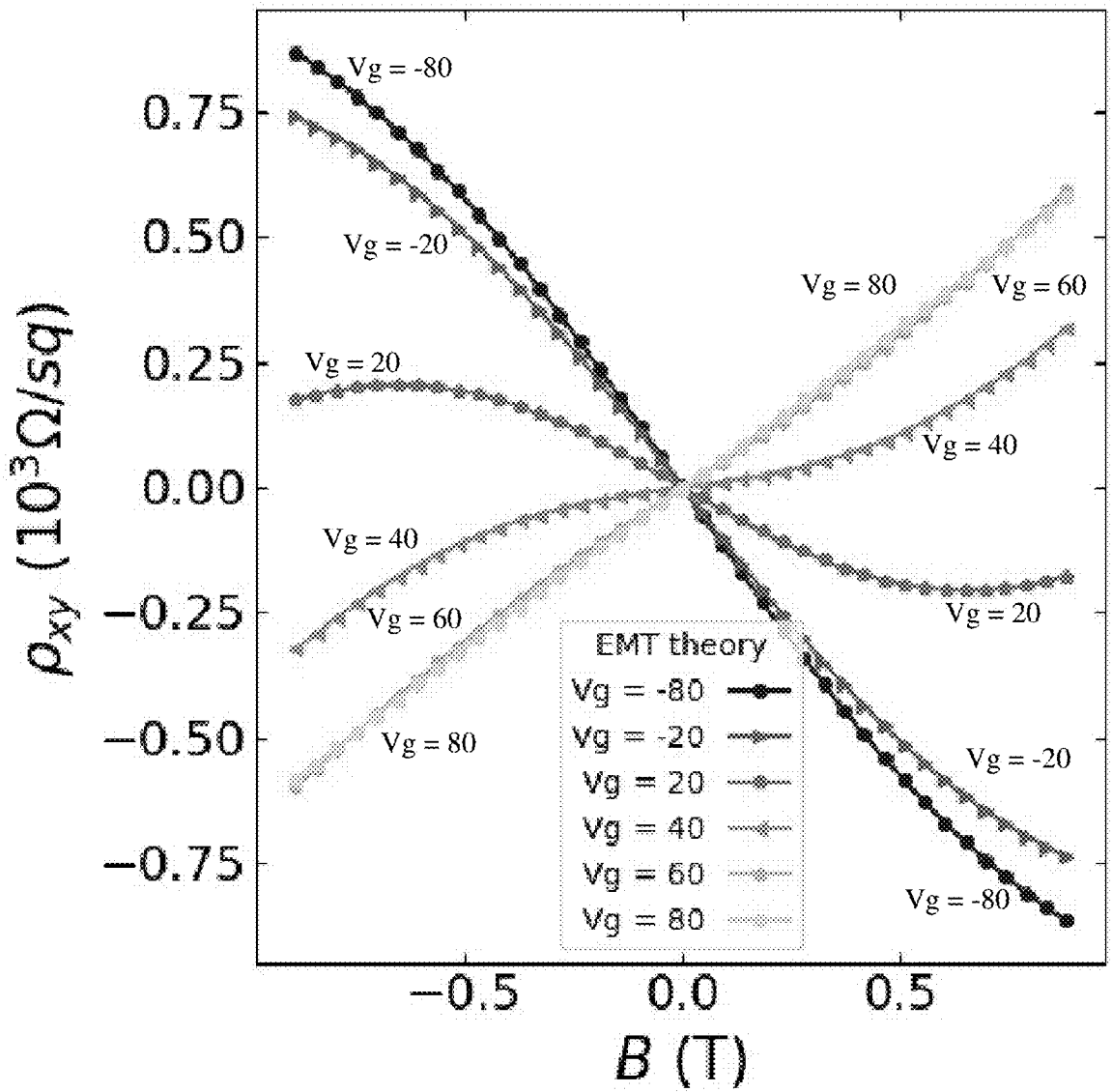
FIG. 10(c) shows theoretical fits to the data in FIG. 10(b) using charge puddling theory.
Figure 11:
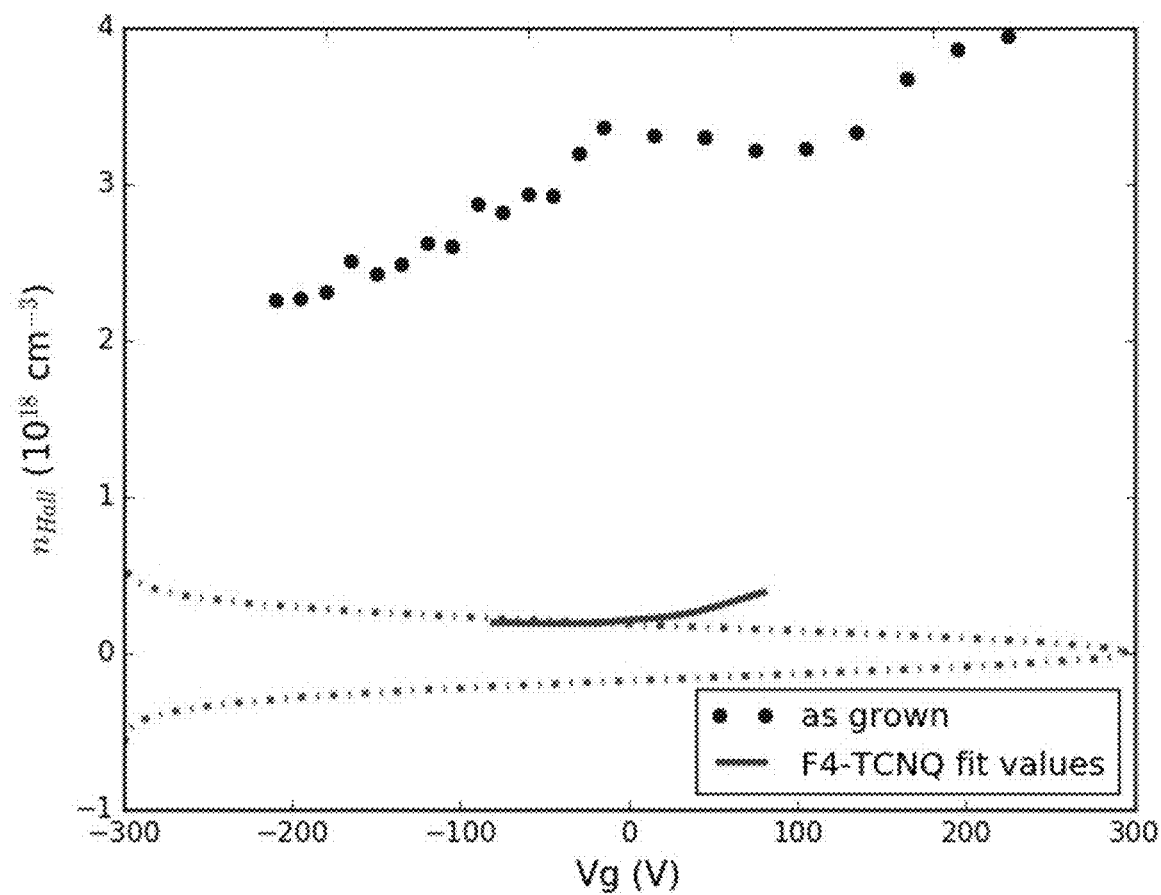
FIG. 11 shows carrier density plotted as a fit parameter to the curves in FIG. 10(b) against $V_g$ (line).

FIG. 10(c) and FIG. 11 show the results of using this theory to model the measured gate response of these samples. The measured zero (magnetic) field conductivity shows a non-zero minimum value of 5.6 e$^2$/h. We get the closest agreement between the experiment and theory (FIG. 10(b) and FIG. 10(c)) when there is asymmetry between the electron and hole mobilities, and that the appropriate proportionality constant is between $\sigma_{xx}$ and $n^{4/3}/n_{imp}$. For electrons and holes, these proportionalities were found to be $A_e$=0.009 and $A_h$=0.11 e$^2$/h/10$^{15}$ cm$^{-3}$, respectively. The final global fit parameter is the Gaussian width that determines the 'size' of the charge inhomogeneous regime $n_{rms}$=218×10$^{15}$ cm$^{-3}$.

This can be related to the density of impurities:

$$n_{imp} = \frac{3\sqrt{2\pi}}{\sqrt{g}\,\alpha^{3/2}} \frac{n_{rms}}{\sqrt{15}} = 1.14 \times 10^{19} \text{ cm}^{-3}$$

where g=4 and $\alpha$=0:07.

The hole conductivity coefficient is an order of magnitude larger than that for electrons: this interpretation is in qualitative agreement with the non-linear Hall response on the p-type side of the charge neutrality point: the high mobility, low field slope is p-type, but the (low mobility carrier) curvature at higher field is n-type. This observation could be taken as evidence that the Dirac point in this material is generated by the band inversion of the S and P states of different total angular momentum.

The values of the carrier density from the theory are all n-type, but are within the Gaussian profile of the inhomogeneous regime, characterized by $n_{rms}$. This is shown in FIG. 11, where the (only) $V_g$ dependent fit parameter n is plotted (see the plotted line), indicating that the sample remains on the n-type side of the Dirac point, but is in the inhomogeneous regime. To make this more apparent, the Gaussian profile defined by the fit parameter $n_{rms}$=218×10$^{15}$ cm$^{-3}$ is plotted on the carrier density axis. The (dashed) Gaussian envelope (arbitrary height) is the size of the charge inhomogeneous region determined by the global fit parameter $n_{rms}$. The dots are the as-grown carrier density for comparison. The overlap of the profile and the carrier density is a rough indication of how far into the inhomogeneous regime the sample approaches. The conductivity minimum at $V_g$=−20 V (FIG. 9(a)) does not correspond to a change in carrier sign; this counterintuitive observation is not unexpected in the case of this huge asymmetry between electron and hole conductivities.

In summary, this example demonstrates the growth of high quality, large area thin film of Na$_3$Bi directly on amorphous SiO$_2$. The gate dependent MR shows two distinct features, a non-zero minimum of the zero-field conductivity, and a non-linear Hall response indicating the presence of electrons and holes with different mobilities. These fits indicate that our samples are on the n-type side of the Dirac point, in the inhomogeneous regime, and unexpectedly, that the hole conductivity in this material is two orders of magnitude higher than the electron conductivity.

Example 5

This example reports potential fluctuations in Fermi energy in three-dimensional topological Dirac semimetals TDS Na$_3$Bi using a scanning tunneling microscope (STM).

TDS such as Na$_3$Bi and Cd$_3$As$_2$ express the pseudorelativistic physics of two-dimensional Dirac material graphene, but extended to three dimensions. TDS can yield ultra-high mobilities as well as new physics such as the chiral anomaly. The close approach of the Fermi energy $E_F$ of a Dirac semimetal to the Dirac point ED uncovers new physics such as velocity renormalization, and the Dirac plasma at $|E_F-E_D|<k_BT$, where $k_BT$ is the thermal energy. However, this close approach can be limited by fluctuations in the Fermi energy due to charge puddling. Potential fluctuations arise in Dirac semimetals when the Fermi energy $E_F$ measured relative to the Dirac point energy $E_D$ approaches zero, meaning the carrier density tends to zero and metallic screening disappears. Poorly screened disorder induces spatial fluctuations in the local $E_D$ and hence fluctuations $\Delta E_F$, corresponding to local electron and hole "puddles". The carriers in puddles in turn screen the disorder, with $\Delta E_F$ determined self-consistently by the disorder and the screening properties of the Dirac materials. Puddles have been visualized in graphene using scanning single electron transistor microscopy and scanning tunnelling spectroscopy, where the fluctuations are largely governed by the underlying substrate, and have also been measured in the Dirac surface state of a topological insulator.

This example reports the use of 20 nm Na$_3$Bi thin films grown via molecular beam epitaxy (MBE) on both semiconducting [Si(111)] and insulating [α-Al$_2$O$_3$(0001)] substrates in ultra-high vacuum (UHV) to probe $\Delta E_F$ fluctuations using scanning tunneling microscopy and spectroscopy (STM/STS).

FIG. 12(a) shows a large area (400 nm×380 nm) topographic STM image of a thin 20 nm film of Na$_3$Bi on Si(111), with several atomically flat terraces>100 nm in size. The inset to FIG. 12(a) reveals the (1×1) Na-terminated atomic lattice (a=5.45 Å) with an individual Na vacancy. FIG. 12(b) (45 nm×45 nm taken immediately after growth) and FIG. 12(c) (30 nm×30 nm taken seven days after growth) show the topography of two atomically flat regions away from step edges or the screw dislocations seen in FIG. 12(a). FIG. 12(d) shows an atomically flat region (30 nm×30 nm) of $Na_3Bi$ grown on sapphire ($\alpha$-$Al_2O_3$(0001)). Whilst atomically flat regions of $Na_3Bi$ up to 100 nm×100 nm can be obtained on Si(111), sparse defect cluster sites (few per 100 nm×100 nm) give rise to tip-induced ionization ring features that will be discussed further below. This necessitated focusing on smaller areas free of ionization rings in order to unambiguously determine the variation in Dirac point.

FIG. 12(e) shows area-averaged scanning tunneling spectra (STS) of the $Na_3Bi$ film. STS measures the differential conductance dI/dV as a function of sample bias V, proportional to the local density of states (DOS) at energy eV relative to $E_F$. STS was performed at points on a grid encompassing the entire regions shown in FIG. 12(b) and FIG. 12(c), along with two other regions not shown. FIG. 12(e) shows the averaged spectra of these four areas. In FIG. 12(e) the "as-grown" spectra (i) corresponding to the region in FIG. 12(b) and spectra (ii)—topography not shown—were taken immediately after growth, whilst spectra (iii) corresponding to the region in FIG. 12(c) and spectra (iv)—topography not shown—were taken one week after growth. Feature $E_D$ reflects the Dirac point, which corresponds to the minimum in the LDOS, and D represents the resonance feature. Two key features are prominent in all spectra: a distinct minimum in the DOS corresponding to the Dirac-point energy ($E_D$), and a resonant feature 35 meV below $E_D$, labelled D. As-grown, the Dirac point is located ~20 meV above the Fermi level indicating p-type doping. Similar doping (~25 meV) has been reported on similar thickness $Na_3Bi$ films on Si(111) measured with angle-resolved photoelectron spectroscopy (ARPES), validating our assumption that the minimum in the DOS reflects the Dirac point. Seven days after growth, the Dirac point has shifted to approximately 15 meV below the Fermi level, reflecting a gradual global n-type doping of the $Na_3Bi$ due to the adsorption of atomic species present in UHV. This adsorption results in the formation of intermittent impurity clusters on the surface, as such all topography and spectroscopic measurements were deliberately performed away from such sites. The resonance feature D is unambiguously tied to $E_D$, and not to the $E_F$, as the relative energy shift of D with respect to $E_D$ remains unchanged within experimental accuracy during the transition from p-type to n-type doping.

The spatial variation of the Dirac point energy, $E_D$, can be found by tracking the position of the minimum differential conductance in STS (alternatively, the shift in the defect resonance D in each spectrum gives similar results). FIG. 13(a) and FIG. 13(b) show the spatial variation of $E_D$ for regions 'A' and 'B' corresponding to FIG. 12(b) and FIG. 12(c) respectively. In both Dirac-point energy maps, it can be seen that a clear, continuously connected local potential modulation emerges, correlated on a scale much larger than the crystal lattice or point-spectroscopy grid. This modulation in $E_D$ represents the puddling of charge density at the surface. The variation in $E_D$ is found to be correlated with the individual Na vacancy sites which possess a more positive Dirac point energy, identifying the Na vacancies as acceptors and a significant source of charge disorder. In addition, FIG. 13(c) shows the local $E_D$ of 20 nm $Na_3Bi$ on $\alpha$-$Al_2O_3$(0001) (labelled Region C) which possesses a larger n-type doping. The upper, middle and lower panels of FIG. 13(d) show histograms of $E_D$ relative to $E_F$ for the scans in FIG. 13(a)-FIG. 13(c) respectively. From spatial autocorrelation analysis of the puddle maps, we determine spatial coherence lengths $\xi$ of 13.4±5.2 nm, 9.3±2.4 nm and 5.1±1.9 nm for Regions A, B and C respectively. The observed histograms of $E_D$ have mean values 19.7±1.7 meV (Region A), −15.4±1.3 meV (Region B) and −47.2±0.6 meV (Region C), and standard deviations $\Delta E_F$ of 5.6 meV, 4.2 meV and 3.5 meV respectively. These values are comparable to the 5.4 meV observed for graphene on h-BN. However, undersampling results in an underestimate in the magnitude of $\Delta E_F$ by a factor $(L/\xi)^2/[(L/\xi)^2-1]$ where is L is the scan size in each region, hence the corrected $\Delta E_F$ values are 6.1 meV and 4.6 meV for Regions A and B respectively, whilst Region C remains essentially unchanged due to the small coherence length.

This example has demonstrated, using scanning tunneling microscopy and spectroscopy, the existence of charge puddles in the topological Dirac semimetal, $Na_3Bi$. The ultra-low Dirac-point energy fluctuations, which occur over length scales of approximately 5-15 nm, are of the order of 4-6 meV=40-70 K well below room temperature and comparable to the highest quality graphene on h-BN. The ultra-low potential fluctuations in this 3D Dirac system will enable the exploration of novel physics associated with the Dirac point.

Example 6

This example reports the formation of ultrathin mono- and bi-layers of $Na_3Bi$ on a semiconducting Si(111) substrate and the characterization of those layers, and the properties of those layers when exposed to electric field. In particular, the properties of these ultrathin $Na_3Bi$ layers are explored using angle-resolved photoelectron spectroscopy (ARPES) and scanning tunnelling spectroscopy STS.

TDS are promising systems in which to look for topological field-effect switching, as they lie at the boundary between conventional and topological phases. This example reports the fabrication and characterization of an ultrathin layer of the TDS material $Na_3Bi$.

Ultra-thin $Na_3Bi$ thin films were grown in ultra-high vacuum (UHV) molecular beam epitaxy (MBE) chambers and then immediately transferred after the growth under UHV to the interconnected measurement chamber (i.e. Createc LT-STM at Monash University, Scienta R-4000 analyser at Advanced Light Source and SPEC Phoibos 150 at Australian Synchrotron). To prepare an atomically flat substrate, a p-type Si(111) wafer was flash annealed to 1250° C. in order to achieve a (7×7) surface reconstruction (this was achieved via direct current heating at Monash University and the Australian Synchrotron, and via electron bombardment heating at the Advanced Light Source).

For $Na_3Bi$ film growth effusion cells were used to simultaneously evaporate elemental Bi (99.999%) in an overflux of Na (99.95%) with a Bi:Na flux ratio not less than 1:10, calibrated by quartz microbalance. During growth the substrate temperature was between 300° C.-330° C. for successful crystallization. At the end of the growth the sample was left at the growth temperature for 10 min in a Na overflux to improve the film quality before cooling to room temperature.

Figure 14D:
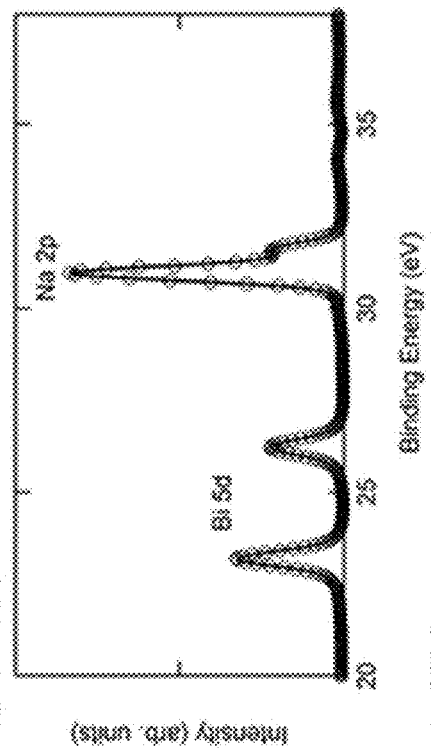
FIG. 14(d) XPS of Na 2p and Bi 5d core level taken at hv=100 eV for few-layer Na$_3$Bi.
Figure 14E:
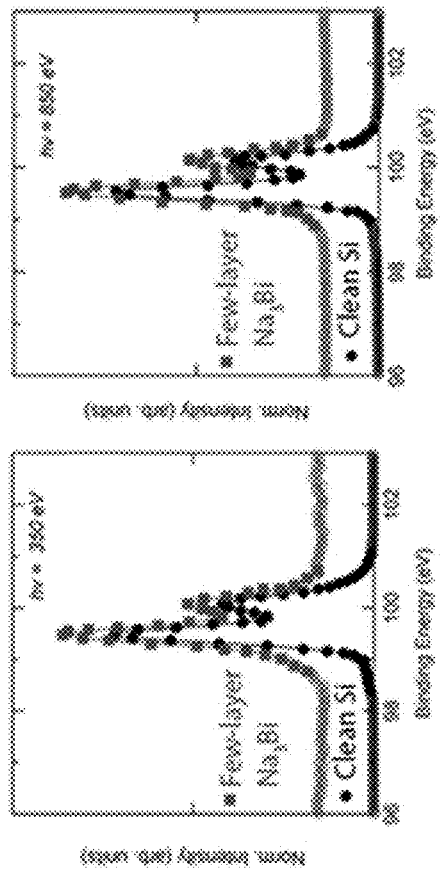
FIG. 14(e) Normalized XPS of Si 2p core level taken at 350 eV (left panel) and eV (right panel). Each panel shows the Si 2p of the clean Si substrate and with few-layer Na$_3$Bi grown on top. The spectra have been offset in intensity for clarity.
Figure 14A:
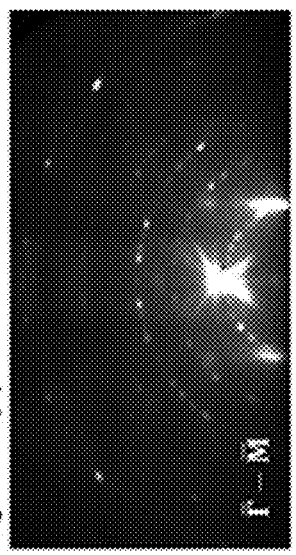
FIG. 14(a) and FIG. 14(b) RHEED patterns of FIG. 14(a) Si(111) 7×7 reconstruction along $\bar{\Gamma}$-$\bar{M}$ direction and FIG. 14(b) few-layer Na$_3$Bi along the $\bar{\Gamma}$-$\bar{K}$ direction.
Figure 14B:
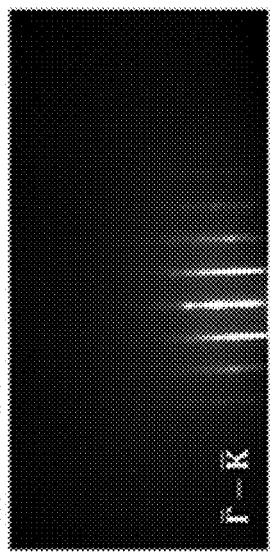
Figure 14C:
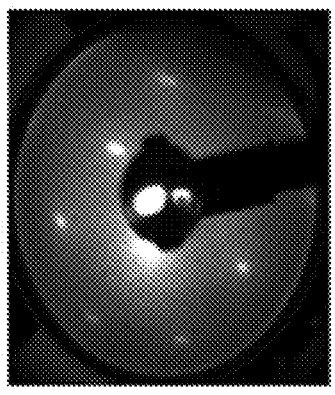
FIG. 14(c) is a 1×1 LEED image of few-layer Na$_3$Bi taken at 32 eV.

In order to confirm that the few-layer films of $Na_3Bi$ are high quality and epitaxial over large areas, reflection high-energy electron diffraction (RHEED), low energy electron diffraction (LEED) and X-ray photoelectron spectroscopy (XPS) were performed as shown in FIG. 14(a)-FIG. 14(e). FIG. 14(a) shows the characteristic RHEED pattern for Si(111) 7×7 reconstruction along $\overline{\Gamma}$-$\overline{M}$, whilst FIG. 14(b) shows the RHEED pattern for few-layer $Na_3Bi$ along $\overline{\Gamma}$-$\overline{K}$, consistent with RHEED reported on films of 15 unit cell thickness, where the lattice orientation of $Na_3Bi$ is rotated 300 with respect to the Si(111) substrate. FIG. 14(c) shows the 1×1 LEED pattern consistent with growth of Na$_3$Bi in the (001) direction. The sharpness of the spots and absence of rotational domains indicates high-quality single crystal few-layer Na$_3$Bi over a large area. FIG. 14(d) shows the Bi 5d and Na 2p core levels of a few-layer Na$_3$Bi film taken at hv=100 eV, with the peak positions consistent with published results on 20 nm film and bulk Na$_3$Bi.

To rule out reaction of Na$_3$Bi with the Si substrate, depth-dependent XPS was performed (by varying the photon energy in order to increase the kinetic energy of emitted photoelectrons, as a result increasing the mean free path) to examine the Na$_3$Bi and Si(111) interface. The Na and Bi core levels exhibited no additional components. FIG. 14(e) shows XPS of the Si 2p core level (reflecting the substrate) at photon energy hv=350 eV (left panel) and hv=850 eV (right panel). In each panel the black curve represents the Si 2p core level of the bare Si(111) 7×7 and the few-layer Na$_3$Bi curve represents the Si 2p core level with few-layer Na$_3$Bi grown on top. In each case, the spectra have been normalized to the maximum in intensity and energy-corrected (to account for the small interfacial charge transfer that occurs) in order to overlay the core levels. The spectra have been offset for clarity. It is clear there is negligible change to the Si 2p core level after Na$_3$Bi growth, with no additional components or significant broadening arising, verifying that Na$_3$Bi is free-standing on Si(111). This is consistent with the fact that the ARPES measurements on ultrathin Na$_3$Bi showed no features with the Si(111) 7×7 symmetry (discussed below).

To clearly demonstrate electric field control over the magnitude, electric field-dependence, and topological nature of the bandgap in ultrathin Na$_3$Bi, this example reports two independent experimental techniques. First, ARPES was utilized to directly measure the electronic band structure and its modification as a result of doping the surface with potassium to generate an electric field. Second, scanning tunneling spectroscopy (STS), which measures the local density of states (DOS) as a function of energy, was used to directly probe the energy gap while varying the tip-sample separation and consequently the induced electric field caused by the potential difference between tip and sample. STS also resolves the topological edge state in Na$_3$Bi at low electric field, demonstrating the topological nature of this phase. These experimental observations are well supported by DFT band structure and edge state calculations with and without electric field.

The unit cell of Na$_3$Bi contains two stacked triple layers in z direction, comprising Na and Bi atoms that form a honeycomb lattice, with interleaved Na atoms as shown in the crystal structures of FIG. 24(a). One triple layer and two stacked triple layers correspond to monolayer (ML) and bilayer (BL) Na$_3$Bi respectively. In FIG. 24(a) STM on few-layer Na$_3$Bi(001) epitaxial films grown via molecular beam epitaxy (MBE) on Si(111) reveals coexisting regions of ML and BL Na$_3$Bi islands that are atomically flat and up to 40 nm in size, along with small areas of bare substrate. Monolayer regions are identified by an additional 0.22 nm distance to the underlying substrate, due to interfacial spacing or structural relaxation which has been observed previously in other atomically thin materials. FIG. 24(b) shows the overall band structure of few-layer Na$_3$Bi films along the M-Γ-K surface directions measured with ARPES at hv=48 eV, along with an inset of the 2D Brillouin Zone (BZ). FIG. 24(c) shows the second derivative of the spectra in order to enhance low intensity features. This has been overlaid with density functional theory (DFT) calculations for ML (broken line) and BL (full line) Na$_3$Bi showing qualitatively good agreement, consistent with the STM topography which shows coexisting ML and BL regions. Photon-energy dependent ARPES (as discussed below) demonstrates that the film is electronically 2D, with no dispersion in k$_z$ unlike its bulk or 15 nm thin-film counterparts.

In more detail, photon energy-dependent ARPES can be utilized to determine whether a material possesses a 3D band dispersion, i.e. the binding energy E$_B$ depends not only on in-plane wavevectors k$_x$ and k$_y$, but also on out-of-plane wavevector k$_z$. To determine the momentum perpendicular to the surface requires measuring energy distribution curves as a function of the photon-energy in order to measure E$_B$ vs k$_z$, using the nearly free-electron final state approximation:

$$k_z = \sqrt{\frac{2m}{\hbar^2}(E_k + V_0 - E_k \sin^2\theta)} \qquad \text{Equation (5)}$$

where, θ is the emission angle, m is the effective mass of electrons, V$_0$ is the inner potential (reflecting the energy difference between the bottom of the valence band to the vacuum level) and E$_k$ is the kinetic energy of the emitted photoelectrons where E$_k$=hv−Φ−E$_B$ with hv the photon energy, Φ the work function and E$_B$ the energy. At normal emission (i.e. θ=0) Eqn. (5A) simplifies to $$k_z = \sqrt{\frac{2m}{\hbar^2}(E_k + V_0)} \qquad \text{Equation (6)}$$

Therefore, using Eqn. (6A) and measuring energy distribution curves at normal emission as a function of photon energy we can directly measure E$_B$ vs k$_z$ assuming an inner potential, V$_0$=12.5 eV for Na$_3$Bi determined in.

Figure 25:
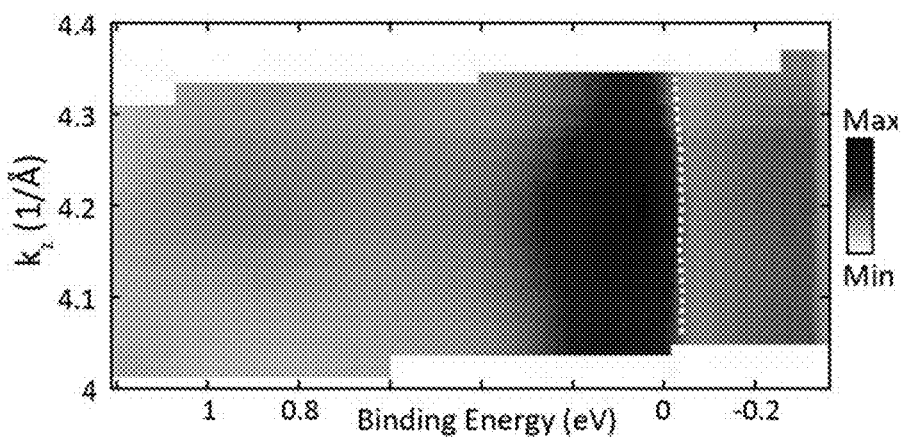
FIG. 25 $k_z$ band dispersion of few-layer $Na_3Bi$ from photon-energy dependent ARPES measurements. Photon-energy dependent ARPES of ML/BL $Na_3Bi$ demonstrating effectively 2D dispersion. Cut through the photon-energy (hv=45-55 eV) dependent Fermi surface showing non-dispersion of the gapped Dirac valence band along $k_z$.

FIG. 25 shows a plot of k$_z$ as a function of binding energy (and reflects energy distribution curves taken at normal emission for photon energies between 45-55 eV. A flat band is observed near 0 eV (the Fermi energy) and represents the valence band maximum. This band possesses no dispersion in k$_z$ (i.e. no bulk band dispersion), verifying that few-layer Na$_3$Bi is indeed electronically 2D, unlike its thin-film and bulk counterparts.

Depth dependent X-ray photoelectron spectroscopy (XPS), revealed no additional components observed in either the Si 2p core level corresponding to the Si(111) substrate or the Na and Bi core levels of Na3Bi, verifying Na3Bi is free-standing on Si(111).

In more detail, XPS measurements were performed at the Soft X-ray Beamline of the Australian Synchrotron using a SPECS Phoibos-150 spectrometer at room temperature. The Bi 5d and Na 2p of the Na3Bi, as well as the Si 2p of the Si(111) substrate were measured at photon energies of 100 eV, 350 eV, 800 eV and 1487 eV. This ensured surface sensitivity for the low photon energy scans at 100 eV, with the higher photon energies used to characterize the depth dependence of the core levels, in particular whether there was any chemical bonding between the Na3Bi film and the Si(111) substrate. The binding energy scale of all spectra are referenced to the Fermi energy (EF), determined using either the Fermi edge or 4f core level of an Au reference foil in electrical contact with the sample. Core level spectra were analysed using a Shirley background subtraction. Kelvin probe measurements to determine the work function of Na3Bi were also performed on this system.

The size of the bulk bandgap for ML and BL regions of Na$_3$Bi was measured by probing the electronic structure with STS, in which the dI/dV spectrum (the differential conductance dI/dV as a function of sample bias V) is proportional to the local density of states at energy $E_F$+eV. FIG. 15(*a*)-FIG. 15(*f*) illustrate the bandgap in mono- and bilayer Na$_3$Bi and edge state behaviour. FIG. 15(*a*) shows typical dI/dV spectra for ML and BL with bandgaps corresponding to 0.36±0.025 eV and 0.30±0.025 eV respectively.

Determining the bulk electronic bandgap of mono- and bilayer Na$_3$Bi was achieved by performing scanning tunnelling spectroscopy (dI/dV as a function of sample bias V) more than 5 nm away from step edges. The valence and conduction band edges in the local density of states (LDOS) are defined as the onset of differential conductance intensity above the noise floor. Due to the large variation in dI/dV signal near a band edge, it was useful to plot the logarithm of the dI/dV curves for accurate band gap determination as shown in FIG. 16(*a*) and FIG. 16(*b*).

For measurements involving tuning the electric field by varying the tip-sample distance dI/dV spectra were taken over a wide range of tunnelling currents (0.01-1 nA), resulting in large changes in signal at band edges and a change in the relative magnitude of signal to noise. In order to determine the magnitude of the gap without reference to the noise magnitude, spectra were normalized to a relatively featureless point in the LDOS away from the band edge onset and the dI/dV signal corresponding to a bias of −400 meV was chosen for normalization. After the normalization procedure was completed for all spectra, the band edges were taken as the point at which the dI/dV has fallen to 0.01 of the normalized value. This definition closely corresponds to the onset of conductance above the noise floor (see FIG. 16(*c*)). Normalization was also performed at −300 meV, 300 meV and 400 meV with only a small variation <15 meV observed, due to the sharp onset in conductance in both the valence and conduction bands. Accounting for error in the normalization and the tip-induced band bending discussed below, yields an error in determining the gap magnitude of ±25 meV.

Tip-induced band bending (TIBB) effects have the potential to overestimate the size of the electronic bandgap due to unscreened electric fields and can strongly influence the interpretation of STM data. The absence/presence of TIBB is usually verified by performing dI/dV spectra at different initial current set points (different tip-sample separations). In the absence of TIBB there will be negligible change in the band edges of the spectra, however, if the spectra are strongly influenced by TIBB increasing the current set point (reducing tip-sample separation) will lead to increased band bending, and overestimation of the bandgap. As will be discussed later in relation to FIG. 22(*b*) the exact opposite is observed for few-layer Na$_3$Bi. In this case the bandgap becomes smaller, closes and then re-opens upon increasing the current (and consequently electric field), and is clearly not consistent with TIBB.

The effects of tip-induced band bending (TIBB) were estimated using a model based on a uniformly charged sphere with the analytic expression for the difference (BB between the apparent (measured) and actual energy position of a spectral feature (e.g. band edge) due to TIBB:

$$\phi_{BB}(V_b, r, h, \varepsilon) = \frac{1}{1+\varepsilon\frac{h}{r}}(eV_b - W_0) \qquad \text{Equation (7)}$$

where ε is the dielectric constant, h the tip height, r the tip radius and $W_0$ the work function difference between sample and tip (i.e. $W_0=W_{sample}-W_{tip}$). Here h=1.5 nm and $W_0$=−1.2 eV and tip radius, r=25 nm. The static dielectric constant for bulk Na$_3$Bi was used, ε=120. FIG. 16(*c*) plots $\phi_{BB}$ as a function of bias voltage calculated from Eqn. (7). The correction factor for tip-induced band bending is given by $$1\bigg/\left(1-\frac{\partial\phi}{\partial V}\right),$$

which yields 1.13 for Na$_3$Bi.

The uniformly charged sphere model is known to overestimate TIBB by almost a factor of 2 when more detailed modelling that incorporates charge redistribution is taken into account. Therefore, we adopt the image charges method for a charged sphere in front of a dielectric sample. In this case the TIBB expression is replaced by:

$$\phi_{BB}(V_b, r, h, \varepsilon) = F(r, h, \varepsilon)(eV_b - W_0) \qquad \text{Equation (8)}$$

where F is the ratio of the electrical potential on the tip surface and at the point of the sample closest to the tip. For h=1.5 nm, r=25 nm and ε=120, the value of F=0.064, yielding a TIBB correction factor of 1.07, meaning that the measured bandgap of ultra-thin Na$_3$Bi includes a systematic overestimation due to TIBB of 7%. For ML and BL Na$_3$Bi with bandgaps of 360 meV and 300 meV this corresponds to 25 meV and 21 meV respectively. Because this is comparable to the random error of ±25 meV, there was no correction for TIBB.

FIG. 15(*b*) plots the experimental bandgap (squares) in comparison to DFT calculated values using the generalized gradient approximation (GGA) for pristine Na$_3$Bi (crosses) and Na$_3$Bi layers that contain an Na(2) surface vacancy (circles).

The calculated band structures of Na$_3$Bi monolayer and bilayer with Na(2) vacancy including spin-orbital coupling (SOC) are displayed in FIG. 17(*b*) and FIG. 17(*e*) respectively. Bandgaps of 0.30 eV (0.28 eV) and 0.22 eV (0.16 eV) are obtained for monolayer (without structural relaxation) and bilayer respectively, with the band gaps obtained from DFT using the Quantum ESPRESSO code and the Vienna ab initio Simulation Package (VASP). The non-trivial topological character can be intuitively observed from the orbital components of the band edge states. As shown in FIG. 17(*c*) and FIG. 17(*f*) without spin-orbit coupling (SOC) for ML and BL respectively, the CBM is mainly contributed by Na-s and Bi-s orbitals, whereas the VBM is mainly from the Bi-$p_x/p_y$ orbitals, showing a normal band ordering. After including SOC (d, i) for ML and BL respectively, the band ordering is inverted at Γ, with p-orbitals at the CBM above the s-orbitals at VBM. This SOC-induced band inversion marks a topologically nontrivial phase, which indicates that both ML and BL Na$_3$Bi are nontrivial 2D topological insulators. The edge state spectrum is shown in FIG. 17(*b*) for ML and FIG. 17(*e*) for BL. The projected 1D Brillouin zone is shown in FIG. 17(*a*) in which a Kramers pair of topological edge states can be seen. To prove these systems are non-trivial, the topological invariant of both systems was determined. This is done by employing the Wilson loop method, in which one traces the evolution of the Wannier function centers. From the calculation, it is apparent that both the monolayer and the bilayer Na$_3$Bi with and without Na(2) vacancy are topologically nontrivial with the invariant $\mathbb{Z}_2=1$.

The large bandgap in ML Na$_3$Bi and the relatively small change in bandgap from monolayer (ML) to bilayer (BL) observed experimentally is well explained by the DFT calculations that include Na(2) surface vacancies; this vacancy gives rise to a delocalized resonance feature and enhancement of the electronic bandgap, resulting in only a small layer-dependent evolution in bandgap. DFT calculations using the GGA method are well known to underestimate the bandgap, therefore the more accurate hybrid functional approach with the modified Becke-Johnson (mBJ) potential was used to better determine the bandgaps for ML Na$_3$Bi (without vacancies).

First-principle calculations based on density-functional theory (DFT) were used to obtain electronic band structures of monolayer and bilayer Na$_3$Bi, with and without Na(2) vacancies. This was achieved using the projector augmented wave (PAW) method with calculations implemented in Quantum ESPRESSO code VASP. The generalized gradient approximation (GGA) using the PBE functional for the exchange-correlation potential were adopted. The plane-wave cutoff energy was set to be 400 eV. The Brillouin zone sampling was performed by using k grids with a spacing of $2\pi \times 0.02$ Å$^{-1}$ within a Γ-centered sampling scheme. For all calculations, the energy and force convergence criteria were set to be 10$^{-5}$ eV and 10$^{-2}$ eV/Å, respectively. For the ML and BL Na$_3$Bi calculations with Na surface vacancy there is 1 Na vacancy per 2×2 supercell. For the Na$_3$Bi layers, we used a vacuum region of thickness larger than 15 Å thickness to eliminate the artificial interaction between the periodic images. The edge states were studied by constructing the maximally localized Wannier functions and by using the iterative Green's function method as implemented in the WannierTools package. More accurate calculations of the bandgap for ML and BL Na$_3$Bi (without Na vacancies) were performed via a hybrid functional approach using the modified Becke-Johnson potential.

This approach yields a bandgap of 0.43 eV for ML Na$_3$Bi, compared to the 0.36 eV obtained for GGA. Whilst, the GGA value is in excellent agreement with the experimental value of 0.36±0.025 eV, this is probably a coincidence due to a reduction in the experimental bandgap as a result of the electric field effect modulation discussed later. The zero field value is likely to be larger and closer to the mBJ value.

To verify the prediction that ML and BL Na$_3$Bi are large bandgap QSH insulators the inventors then probed the step edge of these islands to the underlying Si(111) substrate to look for the conductive edge state signature of a QSH insulator.

STM topography FIG. 15(c) shows a BL Na$_3$Bi region decorated with Na surface vacancies and a ~1.2 nm step edge to the underlying Si substrate, with a small monolayer Na$_3$Bi protrusion ~0.7 nm above the substrate. FIG. 15(d) shows dI/dV spectra for BL Na$_3$Bi far away from the edge (black curve) and at the edge (blue curve). In contrast to the gap in the bulk, the dI/dV spectrum at the edge is quite different, with states filling the bulk gap along with a characteristic dip at 0 mV bias. Similar features observed in other QSH insulators 1 T'-WTe$_2$ and bismuthene have been attributed to one-dimensional (1D) non-trivial edge states and the emergence of a Luttinger liquid. FIG. 15(e) shows dI/dV spectra as a function of distance away from the edge, tracing the profile in FIG. 15(c), demonstrating the extended nature of the edge state feature, with FIG. 15(f) showing that the average dI/dV signal within the bulk bandgap moving away from the edge follows the expected exponential decay for a 1D topologically non-trivial state.

With ML and BL Na$_3$Bi verified as large bandgap QSH insulators, the role of an electric field on modifying the size and nature of the bandgap was examined. ARPES was utilised to measure the band structure after doping the surface with K to generate an electric field.

Potassium deposited on the Na$_3$Bi surface donates electrons leaving a positive K$^+$ ion behind, producing a uniform planar charge density. This is equivalent to a parallel plate capacitor, allowing the electric displacement field, $\vec{D}$ to be calculated across the Na$_3$Bi film using Gauss' law via:

$$\vec{D} = \frac{\vec{E}}{\varepsilon} = \frac{eQ}{\varepsilon_0} = \frac{e\Delta n}{\varepsilon_0} \quad \text{Equation (9)}$$

with, Q representing the total charge transferred due to potassium doping, i.e. Q=Δn.

The charge transfer to the system cannot be directly inferred when a Fermi surface cannot be clearly resolved, so our calculations make use of the conduction band Fermi surface that becomes distinct after 15 minutes of K-dosing. As seen in FIG. 18(a), the n-type Fermi surface is a nearly isotropic Dirac cone. By measuring k$_F$ as a function of K-dosing either from EDCs or a Fermi surface map as in FIG. 18(b), the charge density can be directly calculated using:

$$n(k_F) = \frac{g}{4\pi} k_F^2 \quad \text{Equation (10)}$$

where, a band degeneracy of g=4 can be taken for Dirac systems. The charge density n(k$_F$) is also consistent with the assumption of a Dirac dispersion centred at D, i.e. k$_F$=D/$\hbar v_F$.

The change in n(k$_F$) as a function of K-dosing is approximately 2×10$^{12}$ cm$^{-2}$ between consecutive K-dosing until the 50-minute mark (where charge saturation occurs). By assuming that in this regime every K atom donates one electron and a constant dose rate we can extrapolate the total n(k$_F$) back to the doping of the as-grown film growth. For the as-grown film this corresponds to a p-type doping of 4×10$^{12}$ cm$^{-2}$. From this as-grown doping we can then calculate the electric displacement field using Eqn. 9, as shown on the right hand axis of FIG. 18(c).

FIG. 19(a)-FIG. 19(d) show the bandstructure along Γ-K for values of the electric field of 0.0, 0.72, 1.44 and 2.18 V/nm respectively, with dots points reflecting the extracted maxima from energy distribution curves (EDC) and momentum distribution curves.

Energy dispersion curves (EDCs) and momentum dispersion curves (MDCs) are slices through constant-momentum and constant-energy of the photoemission spectra (such as FIG. 20(a)) along high-symmetry directions (M-Γ-M) or (K-Γ-K) respectively. Band energy and momentum coordinates are extracted by Gaussian fitting of the photoemission intensity on a flat background (as shown in FIG. 20(b) and FIG. 20(c) by the circles). We find that band edges are extracted more reliably from EDCs, whilst MDC peak positions are used at larger binding energies where clearly distinct peaks can be resolved (see left panel of FIG. 20(b)).

The measured bands are observed to fit hyperbolae as shown in FIG. 20(d), as expected of gapped Dirac systems. Fits of the bands to a parabola are much poorer, as shown in FIG. 20(e). In order to accurately model the band dispersion of a 2D gapped Dirac system we use a bi-partite model for the valence (p) and conduction (n) bands that assumes the form:

$$(E_{B,i}-D)^2 = \Delta_i^2 + \hbar^2 v_{F,i}^2 (k+k_0)^2, i \in p,n \qquad \text{Equation (11)}$$

where $\Delta = \Delta_n + \Delta_p$ represents the energy gap, $v_{F,i}$ the asymptotic Fermi velocities at large momenta, and D a doping or energy-shift of the bands.

The velocities $v_{F,i}$ measured for the valence and conduction bands for both films are nearly independent of K dosing, with near-isotropic dispersion in $k_x$, $k_y$ (also shown in FIG. 18(a)-FIG. 18(c)). Hence we take $v_{F,n}$ and $v_{F,p}$ to be a global fit parameter, with best fit values $v_{F,n} \approx 1 \times 10^6$ m/s; $v_{F,p} \approx 3 \times 10^5$ m/s.

We then fit the valence band photoemission i.e. the negative solution for Eqn. (11) using the global $v_{F,p}$ parameter, allowing us to determine $\Delta_p$ and D as a function of K-dosing. A monotonic increase of D with K-dosing is observed as expected, reflecting the shift of the valence band to larger binding energy.

The photoemission intensity of the electron band is two orders of magnitude less than that of the valence band—possibly due to the different orbital characters of the two bands resulting in a lower intensity due to matrix element effects. Due to the large band gap of few-layer Na$_3$Bi, the conduction band lies well above the Fermi level in the as-grown film, meaning that significant charge transfer from K-dosing is needed to n-type dope the film in order to observe the conduction band. As such the fitting parameter $\Delta_n$ for the electron bands can only be determined once the conduction band is resolvable below $E_F$, and in addition further seen to match with the valence band determined value for D.

Figure 21A:
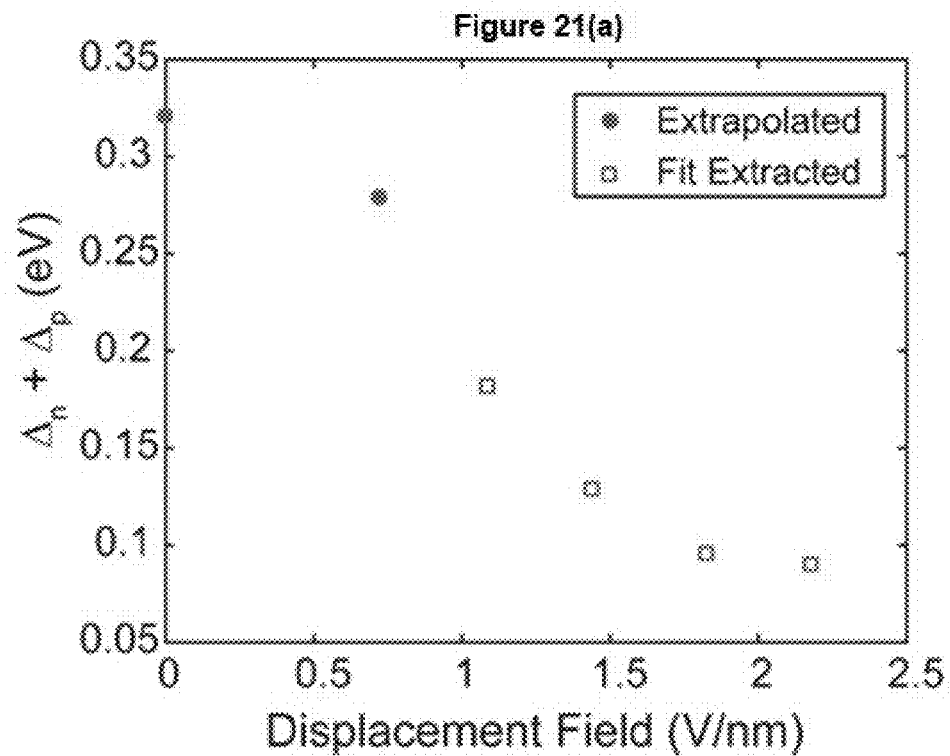
FIG. 21(a) and FIG. 21(b) Electric displacement field-dependence of topological insulator ML/BL Na$_3$Bi bands near $E_F$.
Figure 21B:
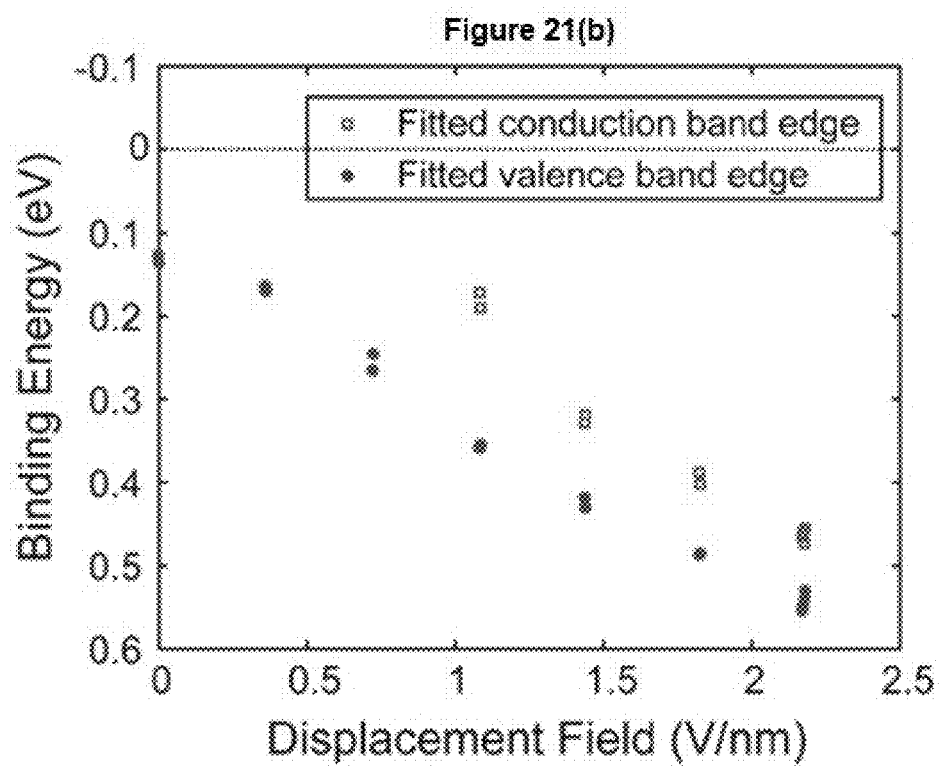

Next the calculated $\Delta_{n,p}$ (which reflects the size of the bandgap) is mapped at different K-dosing to a corresponding electric displacement field as shown in FIG. 21(a). The open squares FIG. 21(a) represent where $\Delta_{n,p}$ are directly extracted from the bi-partite model to the experimental data. At low displacement field, where the conduction band is still above the Fermi level, we cannot directly obtain a value for $\Delta_n$. As such the size of $\Delta_n$ at these low displacement fields is estimated using the ratio $$\frac{\Delta_p + \Delta_n}{\Delta_p} \approx 1.4,$$

which is directly obtained from the open squares. For the as-grown sample this yields a value of ~320 meV, which is in reasonable agreement with the experimental result from STS, and the theoretical DFT value. The reduction in bandgap is consistent with the independently measured gap-closing from STS in FIG. 22(c), with the relative energy separation of the electron and valence bands narrowing monotonically with increasing field.

In FIG. 19(a) only the hole band is observable, with a hyperbolic band dispersion and asymptotic hole Fermi velocity of $v_F \sim 3 \times 10^5$ m/s. The band dispersion near Γ displays the clear cusp of a band edge indicating a gapped system, with 140 meV separation between the valence band edge and the Fermi energy $E_F$. The effect of K dosing in FIG. 19(b)-FIG. 19(d) is to n-type dope the sample and consequently increase the displacement field. At a displacement field of 0.7 V/nm the separation from the valence band edge to $E_F$ has increased to ~257 meV. The bandgap must be at least this amount, consistent with STS, though we cannot determine its exact magnitude since the conduction band lies above $E_F$ (although it can be estimated, see FIG. 21(a)). Upon increasing the displacement field, a Dirac-like electron band emerges with asymptotic Fermi velocity $v_F \sim 10^6$ m/s. The weakness in intensity of the conduction band is most likely due to the different orbital characters of the conduction and valence bands.

In order to confirm the predicted experimental observation of a topological phase transition, DFT calculations were performed on monolayer Na$_3$Bi with Na(2) surface vacancy as a function of electric field as shown in FIG. 27(a)-FIG. 27(f). FIG. 27(a) plots the bandgap variation as a function of electric field for monolayer Na$_3$Bi with Na(2) vacancies. The critical field where the bandgap closes and then reopens is 1.85 V/Å. This value is an order of magnitude larger than the experimental result of ~1.1 V/nm. A possible explanation is that in the modelling, there is 1 Na vacancy per 2×2 supercell (an order of magnitude greater than the defect density observed experimentally). These charged defects would be expected to induce stronger screening of external electric fields, which tends to make the critical electric field overestimated compared to experiment.

Importantly, the DFT results clearly demonstrate the topological phase transition as shown in FIG. 27(c)-FIG. 27(f). In FIG. 27(c) at 0 V/Å the orbital resolved bandstructure clearly shows a band inversion of the s and p atomic orbitals at F induced by SOC. This clearly indicates a non-trivial 2D topological insulator, as shown in the corresponding projected edge spectrum in FIG. 27(d) with the observation of topological edge states. In FIG. 27(e) the orbital resolved bandstructure above the critical field value where the gap has reopened has undergone a band ordering change at F as compared with FIG. 27(c). This indicates a topological to trivial insulator phase transition with electric field, and is confirmed by the disappearance of the topological edge states in FIG. 27(f).

At 1.4 V/nm the best estimate of the gap between the two band edges is ~100 meV and reduces to ~90 meV at 2.2 V/nm.

STM is again used to elucidate the effect of an electric field on the electronic structure more clearly. Here, the tip-sample separation is now varied in order to tune the electric field due to the electrostatic potential difference between the metallic tip and Na$_3$Bi as illustrated schematically in FIG. 22(a). The electrostatic potential difference is dominated by the difference in work function between the tip and the sample, approximately 1.2 eV. Changes in the bandgap can then be measured in the dI/dV spectra as a function of tip-sample separation and converted to electric field as shown in FIG. 22(b). The method used in this calculation is provided below.

In scanning tunnelling microscopy for a simple square barrier the tunnelling current (in atomic units) follows:

$$I_t = I_0 e^{-2(z-z_0)\sqrt{2\Phi}} \qquad \text{Equation (12)}$$

where Φ is the work function of the energy barrier and z and $z_0$ the tip and sample positions respectively, such that the distance between tip and sample is $s = z - z_0$. This allows the work function of the barrier to be obtained by measuring the tunnelling current as a function of tip position, then extracting the slope of $\ln(I_t)/z$:

$$\frac{d\ln(I)}{dz} = -2\sqrt{2\Phi} \qquad \text{Equation (13)}$$

FIG. 23(a)-FIG. 23(e) show logarithmic plots of the tunnelling current as a function of relative distance for (a) Au(111) (bias 500 mV) and (b) thin film $Na_3Bi$ (bias −300 mV) where the absolute current is plotted. For Au(111) the characteristic exponential dependence of I(z) (straight line on the semi-log plot) is observed with current increasing from 0.01 nA to 10 nA by moving the tip 3 Å closer to the surface. However, it is immediately clear that very different behaviour occurs for $Na_3Bi$ in FIG. 23(b). At low tunnelling current an exponential dependence with distance I(z) is observed, but as the distance from tip and sample decreases the current saturates to a value around 1 nA, which occurs over a length scale of ~1 nm. This corresponds to the barrier height going to zero as the tip approaches the sample surface.

This effect results from a modification of Eqn. (12) due to the lowering of the potential barrier by the mirror potential seen by an electron in close proximity to a metal surface, and is most pronounced for low work-function materials, such as $Na_3Bi$. This is shown schematically in FIG. 23(c). As shown in detail below, the theoretical treatment indicates that the effect of the mirror potential at large distances is simply a rigid shift in distance of the region in which the exponential behaviour occurs. Thus, it is possible to use the exponential region where Eqn. (12) is obeyed to determine the work function, and extrapolate Eqn. (12) to point contact to determine the tip-sample distance, provided a correction factor is applied to account for the rigid shift due to the mirror potential.

Figure 23A:
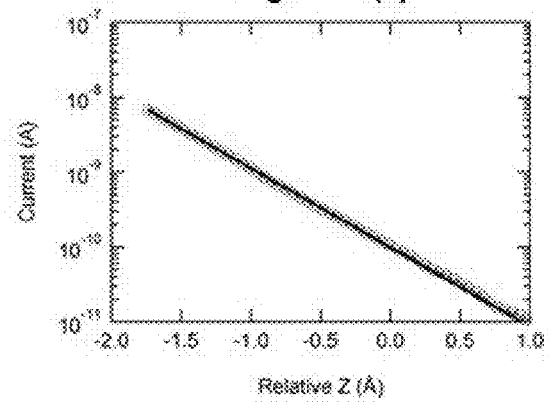
FIG. 23(a) and FIG. 23(b) Tunnelling current as a function of relative tip-sample distance Z for FIG. 23(a) Au(111) (Bias +500 mV) and FIG. 23(b) thin film Na$_3$Bi (Bias -300 mV). The top axis in FIG. 23(b) represents the total distance, s, between tip and sample. The black lines in FIG. 23(a) and FIG. 23(b) are exponential fits.
Figure 23B:
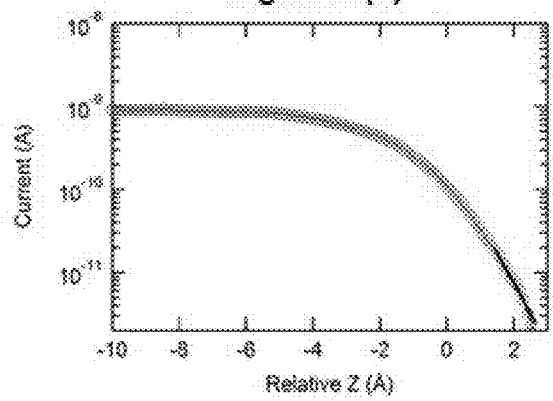
Figure 23C:
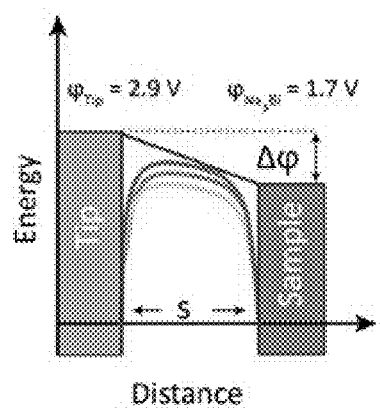
FIG. 23(c) Energy-level schematic illustrating the effects of an image potential on the (trapezoidal between tip and sample over separation distance s) junction barrier; progression from upper curve to lower curve indicating modification of the apparent barrier height due to the imaging potential at decreasing tip-sample distances s.

There has been significant work on modelling image potential effects whereby considering a simple model such as the square barrier depicted in FIG. 23(c) for long tip-sample distances, $\ln(2)/s \gg \Phi$ the tunnelling current can be expressed as:

$$I_t = I_0 e^{-2z\sqrt{2\Phi}} e^{\ln(2)\sqrt{2/\Phi}} \qquad \text{Equation (14)}$$

where the main effect of the image potential at very long tip-sample distances is to increase the tunnelling current by a constant factor $e^{\ln(2)\sqrt{2/\Phi}}$. For $I_t = I_0$, the increased distance between tip and sample is due to the image potential $s = \ln(2)/2\Phi$ in atomic units. Converting from atomic units to SI units gives $$s(\text{Å}) = \left(\frac{\ln(2)}{2\Phi(\text{eV})}\right) * 1 \text{ Bohr(Å)} * 1 \text{ Hartree(eV)} = \left(\frac{\ln(2)}{2\Phi(\text{eV})}\right) * 0.529 \text{ Å} * 27.2 \text{ eV}$$

such that Eqn. (12) would underestimate $z_0$ by a distance of 5 Å/[$\Phi$(eV)].

Figure 23D:
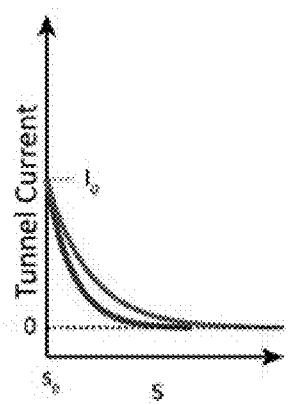
FIG. 23(d) Illustrative tunnelling current curve without (lower curve) and with (upper curve) imaging potential effects. A reference tunnelling current $I_0$ at tip-sample separation so is shown for comparison.
Figure 23E:
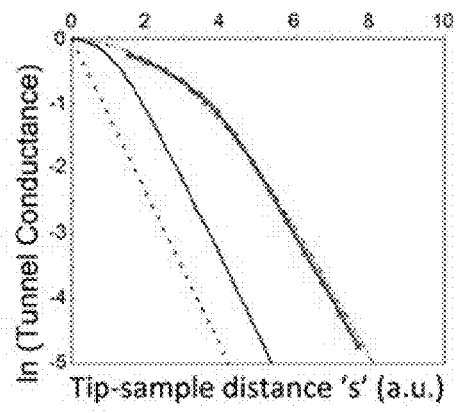
FIG. 23(e) $\ln(I(s)/I_0)$ shown as a function of distance for a square barrier model (dashed line); DFT-LDA (full line); and image potential model (dashed-dotted fitted line).

This value however, is most likely an underestimation as shown in FIG. 23(d) where $\ln(I(s)/I_0)$ as a function of distance is plotted for the simple square barrier model described above (dashed line), and more sophisticated calculations incorporating DFT-LDA (full line), that accounts for both non-local and local exchange and correlation effects (dashed-dotted fitted line). At large s the models still show an exponential I(s) with similar slope (FIG. 23(d)) but the distance at which similar current is achieved is increased by as much as a factor of 3 from the square barrier model, such that the underestimation of $z_0$ distance by Eqn. (12) is more likely to be ~15 Å/[$\Phi$(eV)].

To understand and quantify the tip-sample distance in $Na_3Bi$, first the slope is extracted from the linear region in FIG. 23(b) (as shown by the black line). This fit yields a slope of 1.5 Å⁻, and accounting for the bias of −300 mV yields a work function or barrier height of 2.3 eV. I vs z measurements (where z is the nominal distance between tip and sample as defined by the STM piezo controller with arbitrary zero) were taken at various negative and positive bias values and yielded work functions of 2.3±0.05 eV. This confirms a very low barrier height. From the above analysis we estimate that the effect of the mirror potential is to lead to an underestimation of $z_0$ in Eqn. (12) of ~15 Å/2.3 or ~6.5 Å.

In order to determine the value of $z_0$, we assume that at $z_0 = 0$ (point contact) the conductance is on order the conductance quantum $e^2/h \approx 40$ μS which gives $I_0 = 12$ μA at a bias voltage of −300 mV. Then the fit to the exponential region of I(z) in FIG. 23(b) to Eqn. (14) gives $z_0 = -13.2$ Å. This allows us to plot the absolute distance $s = z - z_0$ on the top axis of FIG. 23(b).

From this it is possible to estimate the tip-sample separation from the dI/dV measurements. For each dI/dV curve we extract a relative distance s for each dI/dV measurement by referencing the tunnelling current at −300 mV to the I vs. s data in FIG. 23(b).

The (a) and (b) dI/dV spectra in FIG. 22(b) are treated in the following manner:

(a): At a bias of −300 mV has a tunnelling current of 570 pA. From the I vs z plot taken at −300 mV this corresponds to relative z distance of −3 Å. Adding 13.2 Å to account for point contact and mirror potential yields a tip-sample separation of 10.2 Å.

(b): At a bias of −300 mV has a tunnelling current of 26 pA. From the I vs z plot taken at −300 mV this corresponds to relative z distance of 1.3 Å. Adding 13.2 Å to account for point contact and mirror potential yields a tip-sample separation of 14.5 Å.

This provides an estimate of the tip-sample separation, so to calculate a displacement field for each of our dI/dV measurements the potential difference needs to be calculated, i.e. the work function difference between the metallic tip and the few-layer $Na_3Bi$. The measured barrier height of 2.3 eV is an average of the tip and sample work functions, $\Phi_{Barrier} = (\Phi_{Tip} + \Phi_{Na_3Bi})/2$, meaning we need to know either the tip work function or measure the work function of the $Na_3Bi$.

The Kelvin probe technique was utilized to measure the work function of few-layer $Na_3Bi$. The work function was determined by measuring the contact potential difference of the $Na_3Bi$ relative to a gold reference of known work function (determined by photoelectron spectroscopy secondary electron cutoff measurements). A work function for few-layer $Na_3Bi$ of 1.7±0.05 eV was measured using this technique. This value and the 2.3 eV potential barrier gives a tip work function of 2.9±0.05 eV, and a potential difference between tip and sample of 1.2±0.1 eV. It should be noted that this is significantly lower than the expected value for a PtIr tip, suggesting that Na atoms have been picked up by the tip and consequently lower the work function (work function of Na is 2.23 eV). Whilst Na atoms were picked up they have little influence on the tip density of states, as spectroscopy performed on Au(111) after measurements on $Na_3Bi$ were completed revealed a flat LDOS near the Fermi energy.

Figure 26:
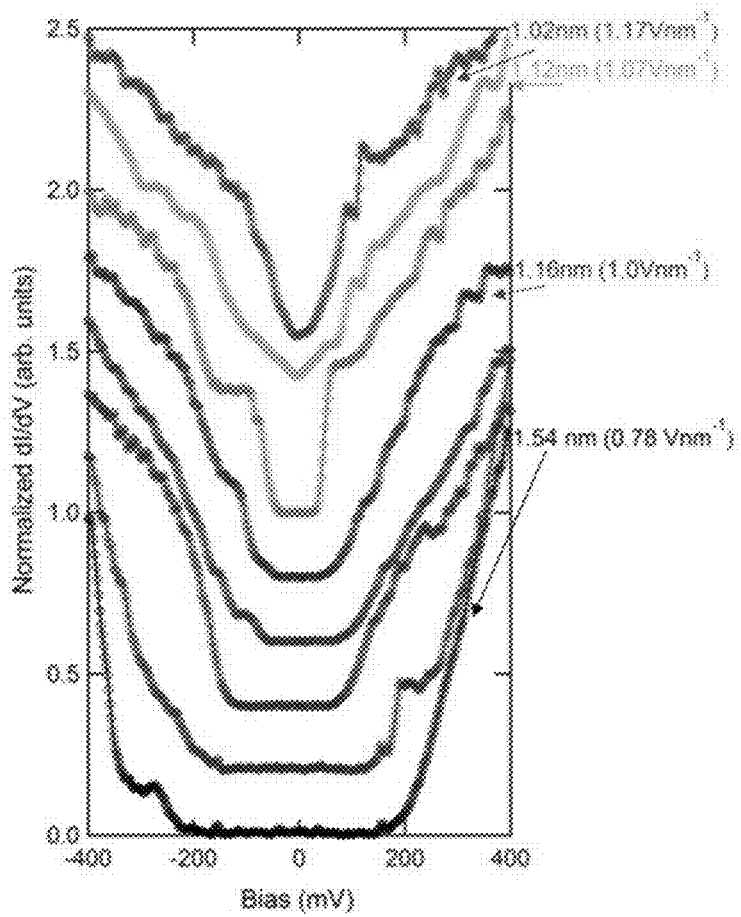
FIG. 26 Individual dI/dV spectra taken on ML $Na_3Bi$ at different tip-sample separations (electric field). The spectra have been normalized and offset for clarity.

Using the calculated potential difference and tip-sample separation from above allows us to calculate electric fields for dI/dV spectra on ML and BL $Na_3Bi$ as shown in FIG. 22(b) for BL and FIG. 26 for ML, with the full data set of bandgap as a function of electric field shown in FIG. 22(c).

FIG. 22(b) shows normalized dI/dV spectra taken on BL $Na_3Bi$ that are offset for clarity at various tip-sample separations (electric fields). A large modulation occurs upon increasing the electric field strength, with the bandgap reducing from 300 meV to completely closed (and exhibiting the characteristic V-shape of a Dirac-semimetal) at ~1.1 V/nm and then reopening above this to yield a bandgap of ~90 meV at ~1.2 V/nm. Inset of FIG. 22(b) shows the dI/dV spectra without any offset, highlighting the clear non-zero density of states at the minimum in conductance (i.e. Dirac point) when the bandgap is closed. FIG. 22(c) plots the bandgap as a function of electric field for ML and BL $Na_3Bi$, with both exhibiting a similar critical field where the bandgap is closed and then reopened into the trivial/conventional regime with increasing electric field. DFT calculations also predict such a transition, arising from a Stark effect-induced rearrangement of s- and p-like bands near the gap.

The projected edge state band structures above and below the critical field are shown as insets to FIG. 22(c). Note that due to the difficulty of estimating tip-sample distance, the electric field magnitude may include a systematic error as large as 50%, however the trend of gap size with electric field is correct.

By combining ARPES and STS, it has been demonstrated that monolayer and bilayer $Na_3Bi$ are quantum spin Hall insulators with bulk bandgaps above 300 meV, offering the potential to support dissipationless transport of charge at room temperature. An electric-field tunes the phase from topological to conventional insulator with bandgap of ~90 meV due to a Stark effect-driven transition. This bandgap modulation of more than 400 meV is larger than has been achieved in atomically thin semiconductors such as bilayer graphene and similar to phosphorene, and may be useful in optoelectronic applications in the mid-infrared. The large bandgaps in both the conventional and quantum spin Hall phases, much greater than the thermal energy kT=25 meV at room temperature, indicated that ultrathin $Na_3Bi$ is suitable for room temperature topological transistor operation.

It will be understood that the embodiments disclosed and defined in this specification extends to all alternative combinations of two or more of the individual features mentioned or evident from the text or drawings. All of these different combinations constitute various alternative embodiments described herein.

What is claimed is:

1. A method of altering a charge carrier density in a topological Dirac semimetal, the method comprising:
    providing a structure including:
        a conductor,
        an insulating layer,
        a topological Dirac semimetal layer separated from the conductor by at least the insulating layer,
        at least one electrode contacting the topological Dirac semimetal layer; and
    applying a voltage to the conductor relative to the at least one electrode to subject at least a portion of the topological Dirac semimetal layer to an electric field to alter the charge carrier density of the topological Dirac semimetal layer;
    wherein topological Dirac semimetals are Dirac semimetal materials that exhibit linear electronic dispersions in three dimensions.

2. The method of claim 1, wherein the method includes switching the voltage between a first voltage and a second voltage to increase or decrease the charge carrier density in the topological Dirac semimetal layer.

3. The method of claim 1, wherein the topological Dirac semimetal layer is formed from a material of the form $A_3Bi$, where A is an alkali metal.

4. The method of claim 3, wherein a thickness of the topological Dirac semimetal layer is at least 15 nm.

5. The method of claim 3, wherein the alkali metal is Na.

6. The method of claim 1, wherein:
    the at least one electrode is a first electrode, and
    wherein the method further includes:
        providing a second electrode in contact with the topological Dirac semimetal layer, the first and second electrodes being spaced apart from each other and between which current may flow from a current or voltage source through the topological Dirac semimetal layer;
        wherein when current is passing between the first and second electrodes, the step of subjecting the topological Dirac semimetal to an electric field alters a magnitude and/or a direction of the current passing between the at least two electrodes.

7. The method of claim 1, wherein the method further includes providing a layer for donating or accepting charge carriers from the topological Dirac semimetal layer.

8. The method of claim 1, wherein the method further include providing a capping layer for preventing oxidation of the topological Dirac semimetal layer.

9. A method of altering a band gap of a topological Dirac semimetal, the method comprising:
    providing a structure including:
        a conductor,
        an insulating layer,
        a topological Dirac semimetal layer separated from the conductor by at least the insulating layer,
        at least one electrode contacting the topological Dirac semimetal layer; and
    applying a voltage to the conductor relative to the at least one electrode to subject at least a portion of the topological Dirac semimetal layer to an electric field to alter the band gap of the topological Dirac semimetal layer;
    wherein topological Dirac semimetals are Dirac semimetal materials that exhibit linear electronic dispersions in three dimensions.

10. The method of claim 9, wherein the method further includes varying a strength of the electric field to vary the band gap.

11. The method of claim 9, wherein the topological Dirac semimetal layer is formed from a material of the form $A_3Bi$, where A is an alkali metal.

12. The method of claim 9, wherein the topological Dirac semimetal layer is an ultrathin film and has a thickness of 2 unit cells or less.

13. A structure for altering a charge carrier density in a topological Dirac semimetal, the structure comprising:
    a conductor,
    an insulating layer;
    a topological Dirac semimetal layer separated from the conductor by at least the insulating layer, and
    at least one electrode contacting the topological Dirac semimetal layer,
    wherein the conductor and the at least one electrode are configured to apply an electric field to at least a portion of the topological Dirac semimetal layer to alter the charge carrier density of the topological Dirac semimetal layer;
    wherein topological Dirac semimetals are Dirac semimetal materials that exhibit linear electronic dispersions in three dimensions.

14. The structure of claim 13, wherein the topological Dirac semimetal layer is formed from a material of the form $A_3Bi$, where A is an alkali metal.

15. The structure of claim 14, wherein a thickness of the topological Dirac semimetal layer is at least 15 nm.

16. A structure for altering a band gap of a topological Dirac semimetal, the structure comprising:
- a conductor,
- an insulating layer;
- a topological Dirac semimetal layer separated from the conductor by at least the insulating layer, and
- wherein the conductor is configured to apply an electric field to at least a portion of the topological Dirac semimetal layer to alter the band gap of the topological Dirac semimetal layer;
- wherein topological Dirac semimetals are Dirac semimetal materials that exhibit linear electronic dispersions in three dimensions.

17. The structure of claim 16, wherein the topological Dirac semimetal layer is formed from a material of the form $A_3Bi$, where A is an alkali metal.

18. The structure of claim 17, wherein the alkali metal is Na.

19. The structure of claim 17, wherein a thickness of the topological Dirac semimetal layer is at least 15 nm.

20. The structure of claim 16, wherein the topological Dirac semimetal layer is an ultrathin film and has a thickness of 2 unit cells or less.

21. The structure of claim 16, the structure further comprising:
- a conductive electrode in contact with the topological Dirac semimetal layer, the conductive electrode and the conductor spaced apart from each other and between which current may flow from a current or voltage source through the topological Dirac semimetal layer; and
- wherein at least one of the conductor or the conductive electrode is configured to be connected to the current or voltage source.

22. The structure of claim 16, the structure further comprising:
- a layer for donating or accepting charge carriers from the topological Dirac semimetal layer.

23. The structure of claim 22, wherein the layer for donating or accepting charge carriers from the topological Dirac semimetal layer is an electron accepting layer.

24. The structure of claim 16, wherein the structure further comprises a capping layer for preventing oxidation of the topological Dirac semimetal layer.

\* \* \* \* \*